US011501965B2

(12) United States Patent
Jia et al.

(10) Patent No.: US 11,501,965 B2
(45) Date of Patent: Nov. 15, 2022

(54) PLASMA ENHANCED DEPOSITION PROCESSES FOR CONTROLLED FORMATION OF METAL OXIDE THIN FILMS

(71) Applicant: ASM IP Holding B.V., Almere (NL)

(72) Inventors: Lingyun Jia, Helsinki (FI); Viljami J. Pore, Helsinki (FI); Marko Tuominen, Helsinki (FI); Sun Ja Kim, Helsinki (FI); Oreste Madia, Leuven (BE); Eva Tois, Helsinki (FI); Suvi Haukka, Helsinki (FI); Toshiya Suzuki, Tokyo (JP)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 15/971,601

(22) Filed: May 4, 2018

(65) Prior Publication Data
US 2018/0350587 A1 Dec. 6, 2018

Related U.S. Application Data

(60) Provisional application No. 62/507,078, filed on May 16, 2017, provisional application No. 62/502,118, filed on May 5, 2017.

(51) Int. Cl.
H01L 21/02 (2006.01)
H01L 21/32 (2006.01)
H01L 21/311 (2006.01)
H01L 21/321 (2006.01)

(52) U.S. Cl.
CPC ...... H01L 21/0228 (2013.01); H01L 21/0234 (2013.01); H01L 21/02126 (2013.01); H01L 21/02142 (2013.01); H01L 21/02153 (2013.01); H01L 21/02186 (2013.01); H01L 21/02205 (2013.01); H01L 21/02216 (2013.01); H01L 21/02219 (2013.01); H01L 21/02274 (2013.01); H01L 21/31111 (2013.01); H01L 21/31116 (2013.01); H01L 21/31138 (2013.01); H01L 21/321 (2013.01); H01L 21/0215 (2013.01); H01L 21/02145 (2013.01); H01L 21/02148 (2013.01); H01L 21/02156 (2013.01); H01L 21/02159 (2013.01); H01L 21/32 (2013.01)

(58) Field of Classification Search
CPC ....... C23C 16/04; C23C 16/047; C23C 16/40; C23C 16/401; C23C 16/403–409; C23C 16/45531; C23C 16/45536–45542; H01L 21/0228; H01L 21/02126; H01L 21/02142; H01L 21/02153; H01L 21/02168; H01L 21/02205; H01L 21/02216; H01L 21/02219; H01L 21/02274; H01L 21/0234; H01L 21/31111; H01L 21/31116; H01L 21/31138; H01L 21/321; H01L 21/02145; H01L 21/02148; H01L 21/0215; H01L 21/02156; H01L 21/02159; H01L 21/32
USPC ................... 427/576, 578; 438/438, 785–786
See application file for complete search history.

(56) References Cited

U.S. PATENT DOCUMENTS

| | | | |
|---|---|---|---|
| 4,804,640 A | 2/1989 | Kaganowicz |
| 4,863,879 A | 9/1989 | Kwok |
| 4,948,755 A | 8/1990 | Mo |
| 5,288,697 A | 2/1994 | Schrepp et al. |
| 5,447,887 A | 9/1995 | Filipiak et al. |
| 5,604,153 A | 2/1997 | Tsubouchi et al. |
| 5,633,036 A | 5/1997 | Seebauer et al. |
| 5,869,135 A | 2/1999 | Vaeth et al. |
| 5,925,494 A | 7/1999 | Horn |
| 6,046,108 A | 4/2000 | Liu et al. |
| 6,416,577 B1 | 7/2002 | Suntoloa et al. |
| 6,426,015 B1 | 7/2002 | Xia et al. |
| 6,455,414 B1 | 9/2002 | Hillman et al. |
| 6,482,740 B2 | 11/2002 | Soininen et al. |

(Continued)

FOREIGN PATENT DOCUMENTS

| | | |
|---|---|---|
| EP | 0469456 A1 | 2/1992 |
| EP | 0880168 A2 | 11/1998 |

(Continued)

OTHER PUBLICATIONS

International Search Report and Written Opinion dated Jul. 24, 2018, Application No. PCT/US2018/030979.

(Continued)

Primary Examiner — Jose I Hernandez-Kenney
(74) Attorney, Agent, or Firm — Knobbe, Martens, Olson & Bear LLP

(57) ABSTRACT

Methods for depositing oxide thin films, such as metal oxide, metal silicates, silicon oxycarbide (SiOC) and silicon oxycarbonitride (SiOCN) thin films, on a substrate in a reaction space are provided. The methods can include at least one plasma enhanced atomic layer deposition (PEALD) cycle including alternately and sequentially contacting the substrate with a first reactant that comprises oxygen and a component of the oxide, and a second reactant comprising reactive species that does not include oxygen species. In some embodiments the plasma power used to generate the reactive species can be selected from a range to achieve a desired step coverage or wet etch rate ratio (WERR) for films deposited on three dimensional features. In some embodiments oxide thin films are selectively deposited on a first surface of a substrate relative to a second surface, such as on a dielectric surface relative to a metal or metallic surface.

15 Claims, 11 Drawing Sheets

(56) References Cited

U.S. PATENT DOCUMENTS

| | | |
|---|---|---|
| 6,586,330 B1 | 7/2003 | Ludviksson et al. |
| 6,679,951 B2 | 1/2004 | Soininen et al. |
| 6,759,325 B2 | 7/2004 | Raaijmakers et al. |
| 6,811,448 B1 | 11/2004 | Paton |
| 6,844,258 B1 | 1/2005 | Fair et al. |
| 6,852,635 B2 | 2/2005 | Satta et al. |
| 6,858,533 B2 | 2/2005 | Chu et al. |
| 6,878,628 B2 | 4/2005 | Sophie et al. |
| 6,887,795 B2 | 5/2005 | Soininen et al. |
| 6,921,712 B2 | 7/2005 | Soininen et al. |
| 6,958,174 B1 | 10/2005 | Klaus et al. |
| 7,041,609 B2 | 5/2006 | Vaartstra |
| 7,067,407 B2 | 6/2006 | Kostamo et al. |
| 7,084,060 B1 | 8/2006 | Furukawa et al. |
| 7,118,779 B2 | 10/2006 | Verghese et al. |
| 7,220,669 B2 | 5/2007 | Hujanen et al. |
| 7,241,677 B2 | 7/2007 | Soininen et al. |
| 7,323,411 B1 | 1/2008 | Blosse |
| 7,405,143 B2 | 7/2008 | Leinikka et al. |
| 7,425,350 B2 | 9/2008 | Todd |
| 7,476,618 B2 | 1/2009 | Kilpela et al. |
| 7,494,927 B2 | 2/2009 | Kostamo et al. |
| 7,595,271 B2 | 9/2009 | White |
| 7,611,751 B2 | 11/2009 | Elers |
| 7,695,567 B2 | 4/2010 | Fu |
| 7,754,621 B2 | 7/2010 | Putkonen |
| 7,790,631 B2 | 9/2010 | Sharma et al. |
| 7,799,135 B2 | 9/2010 | Verghese et al. |
| 7,910,177 B2 | 3/2011 | Li |
| 7,914,847 B2 | 3/2011 | Verghese et al. |
| 7,927,942 B2 | 4/2011 | Makers |
| 7,951,637 B2 | 5/2011 | Weidman et al. |
| 7,955,979 B2 | 6/2011 | Kostamo et al. |
| 7,964,505 B2 | 6/2011 | Khandelwal et al. |
| 8,030,212 B2 * | 10/2011 | Yang ................ H01L 21/02178 |
| | | 257/E21.586 |
| 8,173,554 B2 | 5/2012 | Lee et al. |
| 8,293,597 B2 | 10/2012 | Makers |
| 8,293,658 B2 | 10/2012 | Shero et al. |
| 8,425,739 B1 | 4/2013 | Wieting |
| 8,466,052 B2 | 6/2013 | Baek et al. |
| 8,536,058 B2 | 9/2013 | Kostamo et al. |
| 8,623,468 B2 | 1/2014 | Lin et al. |
| 8,778,815 B2 | 7/2014 | Yamaguchi et al. |
| 8,890,264 B2 | 11/2014 | Dewey et al. |
| 8,921,228 B2 | 12/2014 | Swerts et al. |
| 8,956,971 B2 | 2/2015 | Haukka et al. |
| 8,962,482 B2 | 2/2015 | Albertson et al. |
| 8,980,418 B2 | 3/2015 | Darling et al. |
| 8,993,404 B2 | 3/2015 | Korbrinsky et al. |
| 9,067,958 B2 | 6/2015 | Romero |
| 9,112,003 B2 | 8/2015 | Haukka et al. |
| 9,129,897 B2 | 9/2015 | Pore et al. |
| 9,136,110 B2 | 9/2015 | Rathsack |
| 9,159,558 B2 | 10/2015 | Cheng et al. |
| 9,236,292 B2 | 1/2016 | Romero et al. |
| 9,257,303 B2 | 2/2016 | Haukka et al. |
| 9,312,131 B2 | 4/2016 | Bauer et al. |
| 9,343,297 B1 | 5/2016 | Fukazawa et al. |
| 9,349,687 B1 | 5/2016 | Gates et al. |
| 9,353,139 B2 | 5/2016 | Sundermeyer et al. |
| 9,455,138 B1 | 9/2016 | Fukazawa et al. |
| 9,490,145 B2 | 11/2016 | Niskanen et al. |
| 9,502,289 B2 | 11/2016 | Haukka et al. |
| 9,552,979 B2 | 1/2017 | Knaepen et al. |
| 9,564,309 B2 | 2/2017 | Niskanen et al. |
| 9,679,808 B2 | 6/2017 | Haukka et al. |
| 9,786,491 B2 | 10/2017 | Suzuki et al. |
| 9,786,492 B2 | 10/2017 | Suzuki et al. |
| 9,803,277 B1 | 10/2017 | Longrie et al. |
| 9,805,974 B1 | 10/2017 | Chen et al. |
| 9,816,180 B2 * | 11/2017 | Haukka .................. C23C 16/04 |
| 9,895,715 B2 | 2/2018 | Haukka et al. |
| 9,911,595 B1 | 3/2018 | Smith et al. |
| 10,014,212 B2 | 7/2018 | Chen et al. |
| 10,041,166 B2 | 8/2018 | Longrie et al. |
| 10,047,435 B2 | 8/2018 | Haukka et al. |
| 10,049,924 B2 | 8/2018 | Haukka et al. |
| 10,093,687 B2 | 10/2018 | Sundermeyer et al. |
| 10,115,603 B2 | 10/2018 | Niskanen et al. |
| 10,121,699 B2 | 11/2018 | Wang et al. |
| 10,157,786 B2 | 12/2018 | Haukka et al. |
| 10,186,420 B2 * | 1/2019 | Fukazawa ......... H01L 21/02126 |
| 10,204,782 B2 | 2/2019 | Maes et al. |
| 10,343,186 B2 | 7/2019 | Pore et al. |
| 10,373,820 B2 | 8/2019 | Tois et al. |
| 10,421,766 B2 | 9/2019 | Spence et al. |
| 10,424,477 B2 | 9/2019 | Niskanen et al. |
| 10,428,421 B2 | 10/2019 | Haukka et al. |
| 10,443,123 B2 | 10/2019 | Haukka et al. |
| 10,453,701 B2 | 10/2019 | Tois et al. |
| 10,480,064 B2 | 11/2019 | Longrie et al. |
| 10,504,901 B2 | 12/2019 | Yoo et al. |
| 10,510,529 B2 | 12/2019 | Suzuki et al. |
| 10,546,741 B2 | 1/2020 | Muramaki et al. |
| 10,553,482 B2 | 2/2020 | Wang et al. |
| 10,566,185 B2 | 2/2020 | Wang et al. |
| 10,600,637 B2 | 3/2020 | Suzuki et al. |
| 10,695,794 B2 | 6/2020 | Pore et al. |
| 10,714,385 B2 | 7/2020 | Kovalgin et al. |
| 10,741,411 B2 | 8/2020 | Niskanen et al. |
| 10,793,946 B1 | 10/2020 | Longrie et al. |
| 10,847,361 B2 | 11/2020 | Wang et al. |
| 10,847,363 B2 * | 11/2020 | Tapily ................ C23C 16/4584 |
| 10,847,529 B2 | 11/2020 | Yoo et al. |
| 10,872,765 B2 | 12/2020 | Tois et al. |
| 10,899,500 B2 | 1/2021 | Xiao et al. |
| 10,900,120 B2 | 1/2021 | Sharma et al. |
| 10,903,113 B2 | 1/2021 | Wang et al. |
| 10,991,573 B2 | 4/2021 | Jia et al. |
| 11,158,500 B2 | 10/2021 | Jia et al. |
| 11,170,993 B2 | 11/2021 | Tois et al. |
| 2001/0019803 A1 | 9/2001 | Mirkanimi |
| 2001/0021414 A1 | 9/2001 | Morishima et al. |
| 2001/0025205 A1 | 9/2001 | Chern et al. |
| 2002/0027261 A1 | 3/2002 | Blesser et al. |
| 2002/0047144 A1 | 4/2002 | Nguyen et al. |
| 2002/0068458 A1 | 6/2002 | Chiang et al. |
| 2002/0090777 A1 | 7/2002 | Forbes et al. |
| 2002/0107316 A1 | 8/2002 | Bice et al. |
| 2003/0027431 A1 * | 2/2003 | Sneh ...................... C23C 16/02 |
| | | 438/758 |
| 2003/0066487 A1 | 4/2003 | Suzuki |
| 2003/0143839 A1 | 7/2003 | Raaijmakers et al. |
| 2003/0176559 A1 | 9/2003 | Bice et al. |
| 2003/0181035 A1 | 9/2003 | Yoon et al. |
| 2003/0185997 A1 | 10/2003 | Hsieh |
| 2003/0192090 P1 | 10/2003 | Meilland |
| 2003/0193090 A1 | 10/2003 | Otani et al. |
| 2004/0092073 A1 | 5/2004 | Cabral |
| 2004/0129558 A1 | 7/2004 | Liu et al. |
| 2004/0219746 A1 | 11/2004 | Vaartstra et al. |
| 2005/0012975 A1 | 1/2005 | George et al. |
| 2005/0037153 A1 | 2/2005 | Schmitt et al. |
| 2005/0136604 A1 | 6/2005 | Al-Bayati et al. |
| 2005/0160575 A1 | 7/2005 | Gambino et al. |
| 2005/0223989 A1 | 10/2005 | Lee et al. |
| 2006/0019493 A1 | 1/2006 | Li |
| 2006/0047132 A1 | 3/2006 | Shenai-Khatkhate et al. |
| 2006/0121271 A1 | 6/2006 | Frey et al. |
| 2006/0121677 A1 | 6/2006 | Parekh et al. |
| 2006/0121733 A1 | 6/2006 | Kilpela et al. |
| 2006/0128150 A1 | 6/2006 | Gandikota et al. |
| 2006/0141155 A1 | 6/2006 | Gordon et al. |
| 2006/0156979 A1 | 7/2006 | Thakur et al. |
| 2006/0176559 A1 | 8/2006 | Takatoshi et al. |
| 2006/0199399 A1 | 9/2006 | Muscat |
| 2006/0226409 A1 | 10/2006 | Burr et al. |
| 2006/0292845 A1 | 12/2006 | Chiang et al. |
| 2007/0014919 A1 | 1/2007 | Hamalainen et al. |
| 2007/0026654 A1 | 2/2007 | Huotari et al. |
| 2007/0036892 A1 | 2/2007 | Haukka et al. |
| 2007/0063317 A1 | 3/2007 | Kim et al. |
| 2007/0098894 A1 | 5/2007 | Verghese et al. |

(56) References Cited

U.S. PATENT DOCUMENTS

| | | |
|---|---|---|
| 2007/0099422 A1 | 5/2007 | Wijekoon et al. |
| 2007/0232082 A1 | 10/2007 | Balseanu et al. |
| 2007/0241390 A1 | 10/2007 | Tanaka et al. |
| 2007/0251444 A1 | 11/2007 | Gros-Jean et al. |
| 2007/0292604 A1 | 12/2007 | Dordi et al. |
| 2008/0066680 A1 | 3/2008 | Sherman |
| 2008/0072819 A1 | 3/2008 | Rahtu |
| 2008/0124932 A1 | 5/2008 | Tateishi et al. |
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |
| 2009/0203222 A1 | 8/2009 | Dussarrat et al. |
| 2009/0269507 A1 | 10/2009 | Yu et al. |
| 2009/0274887 A1 | 11/2009 | Millward et al. |
| 2009/0275163 A1 | 11/2009 | Lacey et al. |
| 2009/0311879 A1 | 12/2009 | Blasco et al. |
| 2010/0015756 A1 | 1/2010 | Weidman et al. |
| 2010/0102417 A1 | 4/2010 | Ganguli et al. |
| 2010/0147396 A1 | 6/2010 | Yamagishi et al. |
| 2010/0178468 A1 | 7/2010 | Jiang et al. |
| 2010/0248473 A1 | 9/2010 | Ishizaka et al. |
| 2010/0270626 A1 | 10/2010 | Raisanen |
| 2010/0297474 A1 | 11/2010 | Dameron |
| 2010/0314765 A1 | 12/2010 | Liang et al. |
| 2011/0039420 A1 | 2/2011 | Nakao |
| 2011/0053800 A1 | 3/2011 | Jung et al. |
| 2011/0120542 A1 | 5/2011 | Levy |
| 2011/0124192 A1 | 5/2011 | Ganguli et al. |
| 2011/0146568 A1 | 6/2011 | Haukka et al. |
| 2011/0146703 A1 | 6/2011 | Chen et al. |
| 2011/0198756 A1* | 8/2011 | Thenappan .............. C07F 17/02 257/751 |
| 2011/0221061 A1 | 9/2011 | Prakash |
| 2011/0244680 A1 | 10/2011 | Tohnoe et al. |
| 2011/0311726 A1 | 12/2011 | Liu et al. |
| 2012/0032311 A1 | 2/2012 | Gates |
| 2012/0046421 A1 | 2/2012 | Darling et al. |
| 2012/0052681 A1 | 3/2012 | Marsh |
| 2012/0088369 A1 | 4/2012 | Weidman et al. |
| 2012/0091541 A1 | 4/2012 | Suchomel et al. |
| 2012/0189868 A1 | 7/2012 | Borovik et al. |
| 2012/0219824 A1 | 8/2012 | Prolier et al. |
| 2012/0241411 A1 | 9/2012 | Darling et al. |
| 2012/0264291 A1 | 10/2012 | Ganguli et al. |
| 2012/0269970 A1 | 10/2012 | Ido et al. |
| 2013/0005133 A1 | 1/2013 | Lee et al. |
| 2013/0078793 A1 | 3/2013 | Sun et al. |
| 2013/0084700 A1 | 4/2013 | Swerts et al. |
| 2013/0089983 A1 | 4/2013 | Sugita et al. |
| 2013/0095664 A1 | 4/2013 | Matero et al. |
| 2013/0115763 A1 | 5/2013 | Takamure et al. |
| 2013/0115768 A1 | 5/2013 | Pore et al. |
| 2013/0126815 A1 | 5/2013 | Kim et al. |
| 2013/0143401 A1 | 6/2013 | Yu et al. |
| 2013/0146881 A1 | 6/2013 | Yamazaki et al. |
| 2013/0157409 A1 | 6/2013 | Vaidya et al. |
| 2013/0189790 A1 | 7/2013 | Li et al. |
| 2013/0189837 A1 | 7/2013 | Haukka et al. |
| 2013/0196502 A1 | 8/2013 | Haukka et al. |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0309457 A1 | 11/2013 | Rathsack et al. |
| 2013/0316080 A1 | 11/2013 | Yamaguchi et al. |
| 2013/0319290 A1 | 12/2013 | Xiao et al. |
| 2013/0323930 A1 | 12/2013 | Chattopadhyay et al. |
| 2013/0330936 A1 | 12/2013 | Lachaud et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120737 A1 | 5/2014 | Swaminathan et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0252487 A1* | 9/2014 | Stephens .............. H01L 27/092 257/368 |
| 2014/0272194 A1* | 9/2014 | Xiao .................. C07F 7/025 427/577 |
| 2014/0273290 A1 | 9/2014 | Somervell |
| 2014/0273477 A1 | 9/2014 | Niskanen et al. |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2015/0004317 A1* | 1/2015 | Dussarrat .......... H01L 21/02216 427/255.6 |
| 2015/0004319 A1 | 1/2015 | Mizue |
| 2015/0004806 A1 | 1/2015 | Ndiege et al. |
| 2015/0011032 A1 | 1/2015 | Kunimatsu et al. |
| 2015/0011093 A1 | 1/2015 | Singh et al. |
| 2015/0037972 A1 | 2/2015 | Danek et al. |
| 2015/0064931 A1 | 3/2015 | Kumagi et al. |
| 2015/0083415 A1 | 3/2015 | Monroe et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1 | 6/2015 | Thompson et al. |
| 2015/0170961 A1 | 6/2015 | Romero et al. |
| 2015/0179798 A1 | 6/2015 | Clendenning et al. |
| 2015/0217330 A1* | 8/2015 | Haukka .................. B05D 3/107 427/343 |
| 2015/0240121 A1 | 8/2015 | Sugita et al. |
| 2015/0275355 A1 | 10/2015 | Mallikarjunan et al. |
| 2015/0299848 A1 | 10/2015 | Haukka et al. |
| 2015/0371866 A1 | 12/2015 | Chen et al. |
| 2015/0372205 A1 | 12/2015 | Kimura et al. |
| 2015/0376211 A1 | 12/2015 | Girard et al. |
| 2016/0075884 A1 | 3/2016 | Chen |
| 2016/0079524 A1 | 3/2016 | Do et al. |
| 2016/0086850 A1 | 3/2016 | Romero et al. |
| 2016/0152640 A1* | 6/2016 | Kuchenbeiser ........ C23C 16/345 427/255.28 |
| 2016/0172189 A1* | 6/2016 | Tapily .............. H01L 21/02178 438/778 |
| 2016/0186004 A1 | 6/2016 | Hustad et al. |
| 2016/0190060 A1 | 6/2016 | Bristol et al. |
| 2016/0222504 A1 | 8/2016 | Haukka et al. |
| 2016/0247695 A1 | 8/2016 | Niskanen et al. |
| 2016/0276208 A1 | 9/2016 | Haukka et al. |
| 2016/0284568 A1 | 9/2016 | Morris et al. |
| 2016/0293384 A1 | 10/2016 | Yan et al. |
| 2016/0293398 A1 | 10/2016 | Danek et al. |
| 2016/0315191 A1 | 10/2016 | Tsai et al. |
| 2016/0346838 A1 | 12/2016 | Fujita et al. |
| 2016/0365280 A1 | 12/2016 | Brink et al. |
| 2017/0037513 A1 | 2/2017 | Haukka et al. |
| 2017/0040164 A1 | 2/2017 | Wang et al. |
| 2017/0051405 A1 | 2/2017 | Fukazawa et al. |
| 2017/0058401 A1 | 3/2017 | Blackwell et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0107413 A1 | 4/2017 | Wang et al. |
| 2017/0154806 A1 | 6/2017 | Wang et al. |
| 2017/0298503 A1 | 10/2017 | Maes et al. |
| 2017/0301542 A1 | 10/2017 | Maes et al. |
| 2017/0323776 A1 | 11/2017 | Farm et al. |
| 2017/0323782 A1 | 11/2017 | Suzuki et al. |
| 2017/0332179 A1 | 11/2017 | Bright et al. |
| 2017/0352533 A1 | 12/2017 | Tois et al. |
| 2017/0352550 A1 | 12/2017 | Tois et al. |
| 2017/0358482 A1 | 12/2017 | Chen et al. |
| 2018/0010247 A1 | 1/2018 | Niskanen et al. |
| 2018/0040708 A1* | 2/2018 | Narayanan ............ H01L 29/517 |
| 2018/0073136 A1 | 3/2018 | Haukka et al. |
| 2018/0080121 A1 | 3/2018 | Longrie et al. |
| 2018/0096888 A1 | 4/2018 | Naik et al. |

(56) References Cited

U.S. PATENT DOCUMENTS

| | | | |
|---|---|---|---|
| 2018/0142348 A1 | 5/2018 | Yu et al. | |
| 2018/0151345 A1 | 5/2018 | Haukka et al. | |
| 2018/0151355 A1 | 5/2018 | Fukazawa | |
| 2018/0182618 A1 | 6/2018 | Blanquart et al. | |
| 2018/0222933 A1 | 8/2018 | Romero | |
| 2018/0233350 A1 | 8/2018 | Tois et al. | |
| 2018/0243787 A1 | 8/2018 | Haukka et al. | |
| 2019/0017170 A1 | 1/2019 | Sharma et al. | |
| 2019/0057858 A1 | 2/2019 | Hausmann et al. | |
| 2019/0074441 A1 | 3/2019 | Kikuchi et al. | |
| 2019/0100837 A1 | 4/2019 | Haukka et al. | |
| 2019/0155159 A1 | 5/2019 | Knaepen et al. | |
| 2019/0164749 A1* | 5/2019 | Tapily | H01L 21/02304 |
| 2019/0181004 A1 | 6/2019 | Tang et al. | |
| 2019/0283077 A1 | 9/2019 | Pore et al. | |
| 2019/0333761 A1 | 10/2019 | Tois et al. | |
| 2019/0341245 A1* | 11/2019 | Tois | H01L 21/02211 |
| 2020/0010953 A1 | 1/2020 | Haukka et al. | |
| 2020/0051829 A1 | 2/2020 | Tois et al. | |
| 2020/0066512 A1 | 2/2020 | Tois et al. | |
| 2020/0105515 A1 | 4/2020 | Maes et al. | |
| 2020/0181766 A1 | 6/2020 | Haukka et al. | |
| 2020/0365416 A1 | 11/2020 | Niskanen et al. | |

FOREIGN PATENT DOCUMENTS

| | | | |
|---|---|---|---|
| EP | 1340269 | | 2/2009 |
| EP | 3026055 | | 6/2016 |
| JP | 2001127068 | | 5/2001 |
| JP | 2004-281479 | | 10/2004 |
| JP | 2008311603 | | 12/2008 |
| JP | 4333900 | | 9/2009 |
| JP | 2010-232316 | | 10/2010 |
| JP | 2011018742 | | 1/2011 |
| JP | 2011-187583 | | 9/2011 |
| JP | 2014-93331 | | 5/2014 |
| KR | 102001001072 | | 2/2001 |
| KR | 1020020010821 | | 2/2002 |
| KR | 20030027392 | | 4/2003 |
| KR | 1020040056026 | | 6/2004 |
| KR | 1020050103811 | | 11/2005 |
| KR | 10-0869326 | | 11/2008 |
| KR | 10-0920033 | | 10/2009 |
| KR | 100920033 B1 * | | 10/2009 |
| KR | 10-2010-0093859 | | 8/2010 |
| KR | 10-2012-0120902 | | 11/2012 |
| TW | 175767 | | 8/2003 |
| TW | 2005-39321 | | 12/2005 |
| TW | 2010-05827 | | 2/2010 |
| TW | 2010-27766 | | 7/2010 |
| TW | 2014-39365 | | 10/2014 |
| WO | WO 2002/045167 | | 6/2002 |
| WO | WO 2011/156705 | | 12/2011 |
| WO | WO 2013/161772 | | 10/2013 |
| WO | WO 2014/156782 | | 10/2014 |
| WO | WO 2014209390 A1 | | 12/2014 |
| WO | WO 2015/047345 | | 4/2015 |
| WO | WO 2015094305 A1 | | 6/2015 |
| WO | WO 2015147843 A1 | | 10/2015 |
| WO | WO 2015147858 A1 | | 10/2015 |
| WO | WO 2016/178978 | | 11/2016 |
| WO | WO 2017/184357 | | 10/2017 |
| WO | WO 2017/184358 | | 10/2017 |
| WO | WO 2018/204709 | | 11/2018 |
| WO | WO 2018/213018 | | 11/2018 |

OTHER PUBLICATIONS

International Search Report and Written Opinion dated Aug. 8, 2018 in Application No. PCT/US2018/030974, filed May 3, 2018.
Aaltonen et al., "Atomic Layer Deposition of Iridium Thin Films", Journal of The Electrochemical Society, 151 (8) G489-G492 (2004).
Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.
Benzotriazole, Wikipedia via ://en.wikipedia.org/wiki/Benzotriazole; pp. 1-5, no date available.
Bernal-Ramos, et al., "Atomic Layer Deposition of Cobalt Silicide Thin Films Studied by in Situ Infrared Spectroscopy", Chem. Mater. 2015, 27, pp. 4943-4949.
Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.
Burton, B.B. et al., "Atomic Layer Deposition of MgO Using Bis(ethylcyclopentadienyl)magnesium and H20". J. Phys. Chem. C, 2009, 113, 1939-1946.
Burton, B.B., et al., "Si02 Atomic Layer Deposition Using Tris(dimethylamino)silane and Hydrogen Peroxide Studied by in Situ Transmission FTIR Spectroscopy". J. Phys. Chem. C, 2009, 113, 8249-8257.
Carlsson, J., "Precursor Design for Chemical Vapour Deposition", Acta Chemica Scandinavica, vol. 45, 1991, pp. 864-869.
Chang et al., "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.
Chen et al., Highly Stable Monolayer Resists for Atomic Layer Deposition on Germanium and Silicon, Chem. Matter, vol. 18, No. 16, pp. 3733-3741, 2006.
Coclite, et al.; 25th Anniversary Article: CVD Polymers: A New Paradigm for Surface Modification and Device Fabrication; Advanced Materials; Oct. 2013; 25; pp. 5392-5423.
Elam et al., "Kinetics of the WF6 and Si2H6 surface reactions during tungsten atomic layer deposition", Surface Science, vol. 479, 2001, pp. 121-135.
Elam et al., "Nucleation and growth during tungsten atomic layer deposition on SiO2 surfaces", Thin Solid Films, vol. 386, 2001 pp. 41-52.
Ellinger et al., "Selective Area Spatial Atomic Layer Deposition of ZnO, Al2O3, and Aluminum-Doped ZnO Using Poly(vinyl pyrrolidone)", Chem. Mater. 2014, 26, pp. 1514-1522.
Fabreguette et al., Quartz crystal microbalance study of tungsten atomic layer deposition using WF6 and Si2H6, Thin Solid Films, vol. 488, 2005, pp. 103-110.
Farm et al. Selective-Area Atomic Layer Deposition Using Poly( methyl methacrylate) Films as Mask Layers, J. Phys. Chem. C, 2008, 112, pp. 15791-15795. (Year: 2008).
Farm et al., "Self-Assembled Octadecyltrimethoxysilane Monolayers Enabling Selective-Area Atomic Layer Deposition of Iridium", Chem. Vap. Deposition, 2006, 12, pp. 415-417.
Farr, Isaac Vincent; Synthesis and Characterization of Novel Polyimide Gas Separation Membrane Material Systems, Chapter 2; Virginia Tech Chemistry PhD Dissertation; URN# etd-080999-123034; Jul. 26, 1999.
Formic Acid, Wikipedia via ://en.wikipedia.org/wiki/Formic_acid; pp. 1-5, no date available.
George, Steven M., "Atomic Layer Deposition: An Overview", Chem. Rev. 2010, 110, pp. 111-113.
Ghosal et al., Controlling Atomic Layer Deposition of Ti02 in Aerogels through Surface Functionalization, Chem. Matter, vol. 21, pp. 1989-1992, 2009.
Grubbs et al., "Nucleation and growth during the atomic layer deposition of W on Al2O3 and Al2O3 on W", Thin Solid Films, vol. 467, 2004, pp. 16-27.
Hashemi et al., "A New Resist for Area Selective Atomic and Molecular Layer Deposition on Metal-Dielectric Patterns", J. Phys. Chem. C 2014, 118, pp. 10957-10962.
Hashemi et al., "Selective Deposition of Dieletrics: Limits and Advantages of Alkanethiol Blocking Agents on Metal-Dielectric Patterns", ACS Appl. Mater. Interfaces 2016, 8, pp. 33264-33272.
Hymes et al., "Surface cleaning of copper by thermal and plasma treatment in reducing and inert ambients", J. Vac. Sci. Technol. B, vol. 16, No. 3, May/Jun. 1998, pp. 1107-1109.

(56) References Cited

OTHER PUBLICATIONS

Klaus et al., "Atomic layer deposition of tungsten using sequential surface chemistry with a sacrificial stripping reaction", Thin Solid Films, vol. 360, 2000, pp. 145-153.

Klaus et al., "Atomically controlled growth of tungsten and tungsten nitride using sequential surface reactions", Applied Surface Science 162-163, 2000, pp. 479-491.

King, "Dielectric Barrier, Etch Stop, and Metal Capping Materials for State of the Art and beyond Metal Interconnects", ECS Journal of Solid State Science and Technology, vol. 4, Issue 1, pp. N3029-N3047, 2015.

Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.

Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, pp. 031605-1-031605-8.

Lee et al., Area-Selective Atomic Layor Deposition Using Self-Assembled Monolayer and Scanning Probe Lithography, Journal of The Electrochemical Society, vol. 156, Issue 9, pp. G125-G128, 2009.

Lei et al., "Real-time observation and opitimization of tungsten atomic layer deposition process cycle", J. Vac. Sci. Technol. B, vol. 24, No. 2, Mar./Apr. 2006, pp. 780-789.

Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.

Lemonds, A.M., "Atomic layer deposition of TaSix thin films on SiO2 using TaF5 and Si2H6", Thin Solid Films 488, 2005 pp. 9-14.

Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.

Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.

Lohokare et al., "Reactions of Disilane on Cu(111): Direct Observation of Competitive Dissociation, Disproportionation, and Thin Film Growth Processes", Langmuir 1995, vol. 11, pp. 3902-3912.

Low et al., Selective deposition of CVD iron on silicon dioxide and tungsten, Microelectronic Engineering 83, pp. 2229-2233, 2006.

Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.

Mackus et al., Local deposition of high-purity Pt nanostructures by combining electron beam induced deposition and atomic layer deposition, Journal of Applied Physics, vol. 107, pp. 116102-1-116102-3, 2010.

Mackus et al., "The use of atomic layer deposition in advanced nanopatterning", Nanoscale, 2014, 6, pp. 10941-10960.

Maluf et al., "Selective tungsten filling of sub-0.25μm trenches for the fabrication of scaled contacts and x-ray masks", J. Vac. Sci. Technol. B, vol. 8, No. 3, May/Jun. 1990, pp. 568-569.

Norrman, et al.; 6 Studies of Spin-Coated Polymer Films; Annu. Rep. Prag. Chem.; Sect. C; 2005; 101; pp. 174-201.

Overhage et al., Selective Atomic Layer Deposition (SALD) of Titanium Dioxide on Silicon and Copper Patterned Substrates, Journal of Undergraduate Research 4, Mar. 29, 2011 in 4 pages.

Parulekar et al., Atomic Layer Deposition of Zirconium Oxide on Copper Patterned Silicon Substrate, Journal of Undergraduate Research, vol. 7, pp. 15-17, 2014.

Parulekar et al., Selective atomic layer deposition of zirconium oxide on copper patterned silicon substrate, pp. 1-6, 2013.

Prasittichai et al., "Area Selective Molecular Layer Deposition of Polyurea Film", Applied Materials & Interfaces, 2013, vol. 5, pp. 13391-13396.

Proslier et al., "Atomic Layer Deposition and Superconducting Properties of NbSi Films", The Journal of Physical Chemistry C, 2011, vol. 115, No. 50, pp. 1-26.

Putkonen, et al.; Atomic Layer Deposition of Polyimide Thin Films; Journal of Materials Chemistry; 2007, 17, pp. 664-669.

Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.

Roberts et al., "Selective Mn deposition on Cu lines", poster presentation, 12th International Conference on Atomic Layer Deposition, Jun. 19, 2012, Dresden, Germany.

Sapp, et al.; Thermo-Mechanical and Electrical Characterization of Through-Silicon Vias with a Vapor Deposited Polyimide Dielectric Liner; IEEE; 2012, 978-1-4673-1137-3/12.

Schmeißer, Decomposition of formic acid, Chemnitz University of Technology, pp. 1-13, Aug. 31, 2011.

Schmeißer, Reduction of Copper Oxide by Formic Acid an ab-initio study, Chemnitz University of Technology, pp. 1-42, Sep. 2011.

Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.

Senesky et al., "Aluminum nitride as a masking material for the plasma etching of silicon carbide structures," 2010, IEEE, pp. 352-355.

Schuiskly et al., "Atomic Layer Deposition of Thin Films Using O2 as Oxygen Source", Langmuir, vol. 17, No. 18, 2001, pp. 5508-5512.

Sundberg, et al.; Organic And Inorganic-Organic Thin Film Structures by Molecular Layer Deposition: A Review; Beilstein J. Nanotechnol; 2014, 5, pp. 1104-1136.

Suntola, Tuomo, "Thin Films and Epitaxy Part B: Grown mechanism and Dynamics", Handbook of Crystal Growth vol. 3, Elsevier, 1994, 33 pages, Chapter 14, p. 605-663; editor DIJ Hurle.

Ting, et al., "Selective Electroless Metal Deposition for Integrated Circuit Fabrication", J. Electrochem. Soc., vol. 136, No. 2, Feb. 1989, pp. 456-462.

Toirov, et al.; Thermal Cyclodehydration of Polyamic Acid Initiated by UV-Irradiation; Iranian Polymer Journal; vol. 5, No. 1; pp. 16-22; 1996; Iran.

"Tungsten and Tungsten Silicide Chemical Vapor Deposition", TimeDomain CVD, Inc., retrieved from link: //www.timedomaincvd.com/CVD_Fundamentals/films/W_WSi.html, Last modified Jul. 11, 2008.

Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.

Vallat et al., Selective deposition of Ta2O5 by adding plasma etching super-cycles in plasma enhanced atomic layer deposition steps, Journal of Vacuum Science & Technology A, vol. 35, No. 1, pp. 01B104-1-01B104-7, Jan. 2017.

Vervuurt et al., "Area-selective atomic layer deposition of platinum using photosensitive polyimide", Nanotechnology 27, 2016, in 6 pages.

Zhou, et al.; Fabrication of Organic Interfacial Layers By Molecular Layer Deposition: Present Status and Future Opportunities; Journal of Vacuum Science & Technology; A 31 (4), 040801-1 to 040801-18; 2013.

Cho et al., "Atomic layer deposition of $Al_2O_3$ thin films using dimethylaluminum isopropoxide and water", Journal of Vacuum Science & Technology A 21, (2003), doi: 10.1116/1.1562184, pp. 1366-1370.

File History of U.S. Appl. No. 16/588,600, filed Sep. 30, 2019.
File History of U.S. Appl. No. 16/836,151, filed Mar. 31, 2020.
File History of U.S. Appl. No. 16/987,990, filed Aug. 7, 2020.
File History of U.S. Appl. No. 17/135,001, filed Dec. 28, 2020.
File History of U.S. Appl. No. 17/113,383, filed Dec. 7, 2020.
File History of U.S. Appl. No. 17/064,865, filed Oct. 7, 2020.

Hu et al. "Coating strategies for atomic layer deposition", Nanotechnol. Rev. 2017; 6(6): pp. 527-547.

Lin et al., "Selective Deposition of Multiple Sensing Materials on Si Nanobelt Devices through Plasma-Enhanced Chemical Vapor

(56) References Cited

OTHER PUBLICATIONS

Deposition and Device-Localized Joule Heating", ACS Appl. Mater. Interfaces 2017, 9, 39935-39939, DOI: 10.1021/acsami.7b13896.

Wang et al., "Low-temperature plasma-enhanced atomic layer deposition of tin oxide electron selective layers for highly efficient planar perovskite solar cells", Journal of Materials Chemistry A, 2016, 4, pp. 12080-12087.

Teo et al., "Pre-treatments applied to oxidized aluminum surfaces to modify the interfacial bonding with bis-1, 2-(triethoxysilyl) ethane (BTSE)—Part I. High-purity Al with native oxide", Applied Surface Science 252(5), 2005, pp. 1293-1304.

Teo et al., "Pre-treatments applied to oxidized aluminum surfaces to modify the interfacial bonding with bis-1,2-(triethoxysilyl) ethane (BTSE)—Part II. Anodized 7075-T6 Al alloy", Applied Surface Science 252(5), 2005, pp. 1305-1312.

Vallat et al., "Area selective deposition of TiO2 by intercalation of plasma etching cycles in PEALD process: A bottom up approach for the simplification of 3D integration scheme", J. Vac. Sci. Technol. A 37(2), Mar./Apr. 2019, 020918, pp. 1-12.

\* cited by examiner

101 ⇘

121
Contact substrate with vapor phase precursor that comprises oxygen

131
Remove excess silicon precursor and reaction byproducts, if any, from the substrate surface

141
Select plasma power to achieve desired step coverage and/or WERR

151
Contact substrate with second reactant comprising reactive species generated by plasma

161
Remove excess second reactant and reaction byproducts, if any, from the substrate surface

PLASMA ENHANCED DEPOSITION PROCESSES FOR CONTROLLED FORMATION OF METAL OXIDE THIN FILMS

REFERENCE TO RELATED APPLICATION

This application claims priority to U.S. Provisional application No. 62/502,118, filed May 5, 2017 and to U.S. Provisional application No. 62/507,078, filed May 16, 2017, each of which is incorporated by reference herein.

BACKGROUND

Field

The present disclosure relates generally to the field of semiconductor device manufacturing and, more particularly, to processes for the controlled formation of thin films having desirable properties.

Description of the Related Art

There is increasing need for dielectric materials with relatively low dielectric constant (k) values and relatively low acid-based wet etch rates. Silicon oxycarbide or silicon oxycarbonitride (SiOCN) may satisfy certain of these requirements. Typically, deposition processes for SiOC or SiOCN require oxygen plasma. Further, the ability to deposit or form a film on one surface of a substrate, such as a semiconductor workpiece, relative to another different surface, such as a surface comprising a different material or different orientation is desirable. For example, selective deposition may reduce the number of steps involved in semiconductor device fabrication.

SUMMARY OF THE INVENTION

The present application relates to the deposition of metal oxides on a substrate by plasma enhanced atomic layer deposition (PEALD). In some embodiments the PEALD process does not utilize oxygen plasma or other reactive oxygen species. In some embodiments the metal oxide may comprise two or more different metals. In some embodiments the metal oxide may comprise metal and silicon.

In one aspect, an oxide comprising one or more metals is deposited on a substrate by PEALD processes comprising a deposition cycle in which the substrate is contacted with a first vapor phase precursor comprising metal and oxygen. In some embodiments the oxide may comprise two or more metals. In some embodiments the oxide comprises metal and silicon. In some embodiments the oxide comprises two or more different metal oxides. In some embodiments the oxide comprises metal oxide and silicon oxide. In some embodiments the oxide comprises a metal silicate. Metal-containing species of the first vapor phase precursor may adsorb on the substrate surface. The substrate is subsequently contacted with a second plasma reactant. The second plasma reactant may react with adsorbed first reactant species on the substrate surface to form metal oxide. In some embodiments the second plasma reactant does not contain oxygen species. In some embodiments one or more additional metal and/or silicon reactants may be utilized to produce a more complex material, such as an oxide comprising metal and silicon. In some embodiments additional deposition cycles may be utilized, in which different first precursors are provided in order to deposit more complex materials.

In some embodiments the metal of the oxide film comprises one or more of Al, Nb, Ta, Ti, Zr, Hf and W. In some embodiments the metal oxide comprises titanium oxide. first vapor phase precursor comprises one of aluminum(III) ethoxide, niobium(V)ethoxide, tantalum(V)ethoxide, titanium (IV) ethoxide, titanium (IV) methoxide, pentamethylcyclopentadienyltitanium trimethoxide, or W(thd)$_4$.

In some embodiments the first vapor phase precursor comprises titanium. For example, the first vapor phase precursor may be titanium isopropoxide (IV).

In some embodiments the second reactant comprises a hydrogen plasma. In some embodiments hydrogen plasma is formed by generating a plasma in a gas comprising H$_2$. In some embodiments the plasma may be generated in a gas comprising H$_2$ and Ar.

In another aspect, an oxide comprising metal is selectively deposited on a first surface of a substrate relative to a second surface having a different composition. In some embodiments the oxide may comprise two or more different metals. In some embodiments the oxide may comprise metal and silicon. In some embodiments the oxide may comprise a metal oxide and a silicon oxide. In some embodiments the oxide may comprise a metal silicate.

In some embodiments, metal oxide is selectively deposited on a dielectric surface of a substrate relative to a second surface, such as a metal or metallic surface. In some embodiments, a substrate comprising a first dielectric surface and a second, different surface, such as a metal surface is provided. At least one deposition cycle is carried out comprising alternately and sequentially contacting the substrate with a first precursor comprising a metal and oxygen and a second reactant. The second reactant may comprise reactive species from a plasma that is generated in a gas that does not comprise oxygen. Species of the first reactant adsorb on the dielectric surface of the substrate and the second reactant reacts with the adsorbed species of the first precursor to selectively form a metal oxide on the first dielectric surface relative to the second metal surface. In some embodiments the second reactant also reacts with the metal surface to reduce metal oxide on the metal surface. The second reactant may also remove OH groups on the metal surface. The deposition cycle may be repeated two or more times to form a metal oxide of the desired thickness on the dielectric surface.

In some embodiments the dielectric surface comprises SiO$_2$. In some embodiments the dielectric surface comprises a low-k material. The metal surface may comprise, for example, Cu or W.

In some embodiments the metal oxide that is selectively deposited comprises one or more of Al, Nb, Ta, Ti, Zr, Hf, or W. In some embodiments the metal oxide is titanium oxide.

In some embodiments the first precursor is a metal precursor and the second reactant comprises hydrogen plasma.

In some embodiments the metal surface comprises a passivation layer, such as an organic material. An organic passivation layer may be selectively deposited on the metal surface relative to the dielectric surface prior to beginning the selective oxide deposition. In some embodiments a passivation layer on the metal surface is etched by the second reactant in the metal oxide deposition cycle.

In some embodiments, methods of selectively depositing a metal oxide film on a dielectric surface of a substrate relative to a metal surface are provided. The methods may be PEALD methods, comprising a deposition cycle in which the substrate is alternately and sequentially contacted with a first reactant comprising metal and oxygen and a second plasma reactant that does not comprise oxygen species. Species of the first reactant comprising metal and oxygen adsorb on the dielectric surface and react with the second plasma reactant to form metal oxide. In some embodiments the second plasma reactant comprises hydrogen plasma.

In some embodiments a PEALD process for forming an oxide thin film comprises at least one first deposition cycle in which a substrate is contacted with a first vapor phase precursor comprising a component of the oxide film and a second reactant comprising reactive species. The reactive species may be from a plasma generated in a gas that does not comprise oxygen. The process comprises at least one second deposition cycle comprising contacting the substrate with a third vapor phase precursor comprising a second, different component of the oxide and a fourth reactant comprising reactive species. In some embodiments the second reactant and the fourth reactant are the same. In some embodiments the second precursor comprises the second component of the film as well as oxygen. The first deposition cycle and second deposition cycle can be carried out at a selected ratio in order to form a metal oxide with the desired composition.

In some embodiments the oxide thin film comprises metal and silicon and the first precursor comprises metal and the second precursor comprises oxygen. In some embodiments the oxide comprises two different metals and the first precursor and the second precursor comprise different metals. In some embodiments the oxide is selectively deposited on a first surface of a substrate relative to a second surface, such as on a dielectric surface relative to a metal surface. In some embodiments a oxide comprising metal and silicon is selectively deposited on a first surface of a substrate relative to a second surface, such as on a dielectric surface relative to a metal surface.

In some embodiments a PEALD process for selectively depositing an oxide thin film on a dielectric surface of a substrate relative to a metal surface of the substrate comprises at least one deposition cycle in which the substrate is alternately and sequentially contacted with a first precursor comprising a first component of the oxide and oxygen, a second precursor comprising a second component of the oxide, and a third reactant comprising reactive species from a plasma generated in a gas that does not comprise oxygen. In some embodiments the second precursor additionally comprises oxygen. In some embodiments the first component of the oxide is a metal and the second component is silicon. In some embodiments the first and second components of the oxide are two different metals. In some embodiments an oxide film comprising silicon and metal is selectively deposited on the metal surface of the substrate relative to the dielectric surface. The dielectric surface may, for example, comprise SiO2. The metal surface may, for example, comprise one or more of Al, Nb, Ta, Ti, Zr, Hf or W.

BRIEF DESCRIPTION OF THE DRAWINGS

FIG. 1B is a process flow diagram for the controlled formation of an oxide thin film by a PEALD process according to some embodiments.

DETAILED DESCRIPTION

Figure 1A:
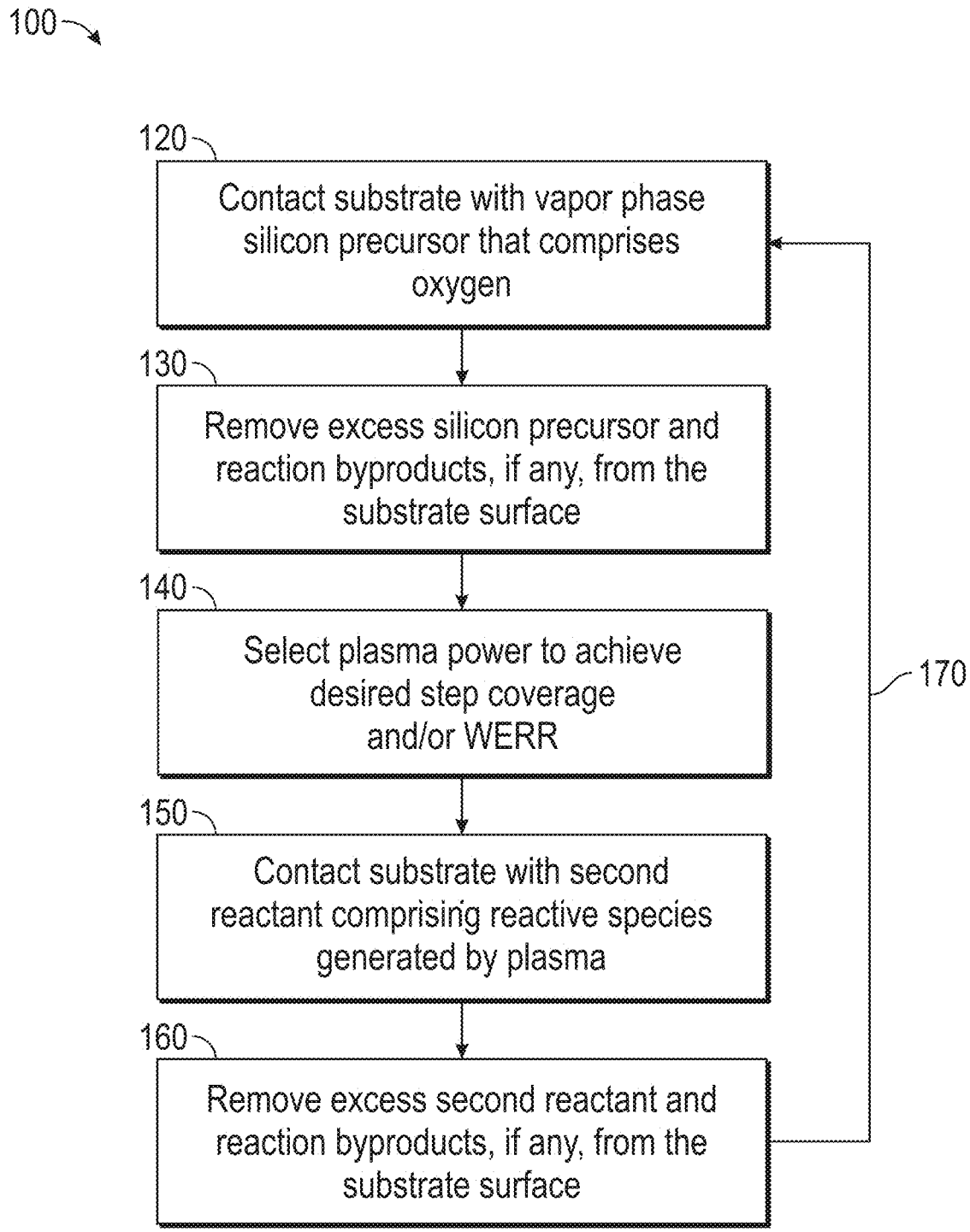
FIG. 1A is a process flow diagram for the controlled formation of a silicon oxycarbide (SiOC) thin film by a plasma enhanced atomic layer deposition (PEALD) process according to some embodiments.

In some embodiments thin films comprising oxygen, such as SiOC, SiOCN, and oxides comprising metal, for example metal oxides such as $TiO_2$, or $Al_2O_3$, can be deposited by plasma enhanced atomic layer deposition (PEALD) processes that use a first reactant that comprises oxygen and a second plasma reactant. In some embodiments the second reactant comprises oxygen-free plasma.

Oxide films, such as metal oxide films, have a wide variety of applications, as will be apparent to the skilled artisan, for example in integrated circuit fabrication. More specifically, oxide films that display a low etch rate have a wide variety of application, both in the semiconductor industry and outside of the semiconductor industry. Such films may be useful as, for example, etch stop layers, sacrificial layers, low-k spacers, anti-reflection layers (ARL), and passivation layers.

According to some embodiments of the present disclosure, various oxide films, precursors, and methods for depositing said films are provided. In some embodiments oxide films comprising silicon are deposited, such as SiOC or SiOCN. In some embodiments oxide films comprising metal are deposited, such as $TiO_2$, or $Al_2O_3$. In some embodiments oxide films comprising metal and silicon are deposited. In some embodiments metal silicates are deposited. In some embodiments oxides comprising one or more metal oxides and one or more oxides comprising silicon are deposited. In some embodiments the oxide films have a relatively low wet etch rate, for example in acid-based etching solutions, such as dHF.

In some embodiments oxide thin films are deposited on a substrate by plasma-enhanced atomic layer deposition (PEALD) processes that include a first precursor comprising at least one alkoxy group and a second reactant comprising reactive species from a plasma generated in a gas that does not comprise oxygen (an oxygen-free plasma). In some embodiments oxide thin films are not deposited by liquid phase methods. In some embodiments an oxide thin film is deposited over a three dimensional structure, such as a fin in the formation of a finFET device.

In some embodiments oxide thin films are deposited on a substrate comprising a three dimensional structure or feature and one or more of the properties of the film, such as the thickness of the film deposited on vertical surfaces of the three dimensional structure, the thickness of the film deposited on the horizontal surfaces of the three dimensional structure, the wet etch rate (WER) of the film deposited on vertical surfaces of the three dimensional structure, and/or the WER of the film deposited on horizontal surfaces of the three dimensional structure may be controlled by selecting an appropriate plasma power during a plasma enhanced ALD (PEALD) process as described herein. In some embodiments the plasma power is controlled to achieve differential effects on different surfaces, such as vertical and horizontal surfaces of a three dimensional structure. In some embodiments the aspect ratio of a three dimensional feature over which an oxide film is deposited may influence the plasma power that can be selected to achieve a desired results, such as a desired thickness, wet etch rate for a portion of a deposited oxide film, and/or ratio of thicknesses and/or etch rates for portions of the film deposited on different surfaces.

In some embodiments the step coverage of the oxide film deposited on a three dimensional feature may be controlled by selecting an appropriate plasma power during a PEALD process for three dimensional features having an aspect ratio of from about 1 to about 10. In some embodiments the plasma power can be selected to achieve a desired step coverage of from about 25% to about 1000% or more.

In some embodiments the ratio of the etch rate, such as the WER, of the oxide film deposited a vertical surface, such as a sidewall of a three dimensional feature, to the etch rate of the oxide film deposited on a horizontal surface, such as a top surface of a three dimensional feature may be controlled by selecting an appropriate plasma power as described herein. In some embodiments the etch rate is controlled by depositing a film that has different etch rates on different surfaces of a three dimensional feature, for example by depositing a film that has different etch rates on vertical and horizontal surfaces of a three dimensional feature. In some embodiments the plasma power may be selected to achieve a give desired WER ratio (WERR) of from about 0.2 to about 15.

In some embodiments a deposited oxide film, for example a SiOC or metal oxide film deposited to achieve a desired step coverage on a three dimensional structure or a desired WERR may be subjected to a post deposition treatment, such as a plasma treatment and/or an etch.

In some embodiments the post deposition treatment comprises a plasma treatment in which the oxide film is contacted with a plasma reactant for a desired period of time. In some embodiments the oxide film is exposed to one or more of a hydrogen, oxygen or nitrogen plasma.

In some embodiments the post deposition plasma treatment may differentially change the thickness of an oxide film, such as a oxide film, on a first surface and a second, different surface. For example, the post deposition plasma treatment may reduce the thickness of an oxide film on a vertical surface of the substrate and a horizontal surface of the substrate such that the thickness of the oxide film deposited on the horizontal surface is reduced substantially more than the thickness of the oxide film deposited on the first surface.

In some embodiments a post deposition plasma treatment may decrease the thickness on one surface while increasing the thickness of the film on a different surface. For example, post deposition plasma treatment of an oxide film deposited on a trench may decrease the thickness of the oxide film on the top of the trench while increasing the thickness of the film on the sidewall and/or at the bottom of the trench.

In some embodiments a post deposition plasma treatment may improve conformality of an oxide film on a three dimensional structure. In some embodiments, a post deposition plasma treatment may increase the step coverage of an oxide film on a three-dimensional structure, such as a trench. In some embodiments the step coverage may be increased from less than 1 to greater than 1 and even up to 2. For example, the step coverage of an oxide film, such as a oxide film on a trench, may be increased by exposure to a plasma reactant.

In some embodiments the post deposition treatment comprises a plasma treatment that reduces the WER of an oxide film on a first surface of a feature on the substrate, such as a vertical or sidewall surface of a trench. In some embodiments the WER of an oxide, such as SiOC or a metal oxide, on the sidewall of a trench may be reduced by 30%, 40% or even 50% relative to the WER of the sidewall in the absence of the post deposition plasma treatment. Wet etch rate maybe measured in dHF acid as is known in the art.

In some embodiments the WER of an oxide film deposited on a first surface is reduced more than the WER of a second surface when both surfaces are contacted with a plasma reactant in a post deposition plasma treatment. For example, in some embodiments the WER of an oxide film on both a first vertical surface and a second horizontal surface of a three dimensional feature are reduced by a post deposition plasma treatment, but the WER of the oxide film on the first surface is reduced substantially more than the WER of the oxide film on the second surface.

In some embodiments the post deposition plasma treatment may comprise exposing the deposited oxide film, such as a SiOC film or a metal oxide film, on a three-dimensional structure, to a plasma generated in a gas comprising $H_2$, $O_2$, $N_2N_2O$, NO, $NO_2$, $NH_3$, $CO_2$, or CO. For example, the deposited oxide film may be exposed to a plasma generated in a combination of $O_2$ and Ar or a combination of $N_2$ and Ar. In some embodiments the plasma may be generated using a plasma power of about 10 W to about 5000 W, from about 100 W to about 1000 W, about 200 W to about 800 W, about 300 to 800 W, or about 300 W to about 500 W. In some embodiments the plasma power is about 300 W. In some embodiments the post-deposition plasma treatment may be conducted for about 0.5 to 60 minutes, about 1 to 30 minutes, about 3 to 15 minutes, or about 5 to 10 minutes.

In some embodiments an oxide film deposited on a three-dimensional structure is exposed to a hydrogen plasma, such as a plasma generated in a mixture of Ar and $H_2$ gas. In some embodiments the plasma is generated with a plasma power of about 10 W to about 5000 W, about 100 W to 1000 W, about 300 to 900 W, about 300 W to about 500 W, or about 330 to 850 W. In some embodiments the oxide film is exposed for a period of about 1 to 1000 s, 2 to 500 s, 5 to 200 s, or 10 to 100 s.

In some embodiments, the plasma may be provided cyclically during the post deposition plasma treatment process, with the reaction chamber being purged between pulses of the plasma. In some embodiments, 1, 2, 5, 10, 20, 30, 40, 50, 100, 200, 500 or 1000 or more cycles of plasma post deposition treatment are carried out on a deposited oxide film.

In some embodiments where the post deposition treatment comprises an etch, such as a wet etch, the post deposition treatment may remove substantially all of the deposited oxide from a first surface, such as a vertical surface of the substrate and may not remove substantially all of the deposited oxide from a second surface, such as a horizontal surface of the substrate.

In some embodiments where the post deposition treatment comprises an etch, such as an etch comprising reactive species, the post deposition treatment may remove substantially all of the deposited oxide from a first surface, such as a horizontal surface of the substrate and may not remove substantially all of the deposited oxide from a second surface, such as a vertical surface of the substrate.

The formula of silicon oxycarbide films deposited according to the methods provided herein is generally referred to herein as SiOC for convenience and simplicity. As used herein, SiOC is not intended to limit, restrict, or define the bonding or chemical state, for example the oxidation state of any of Si, O, C, and/or any other element in the film. Further, in some embodiments SiOC thin films may comprise one or more elements in addition to Si, O, and/or C, such as S and/or N. That is, in some embodiments an SiOC film may comprise, for example silicon oxycarbonitride (SiOCN) or silicon oxycarbosulfide (SiOCS). In some embodiments the SiOC films may comprise Si—C bonds and/or Si—O bonds. In some embodiments the SiOC films may comprise Si—C bonds and Si—O bonds and may not comprise Si—N bonds. However, in some embodiments the SiOC films may comprise Si—C bonds, Si—O bonds, and/or Si—N bonds. In some embodiments the SiOC films may comprise Si—S bonds in addition to Si—C and/or Si—O bonds. In some embodiments the SiOC films may comprise more Si—O bonds than Si—C bonds, for example a ratio of Si—O bonds to Si—C bonds may be from about 1:1 to about 10:1. In some embodiments the SiOC may comprise from about 0% to about 40% carbon on an atomic basis. In some embodiments the SiOC may comprise from about 0.1% to about 40%, from about 0.5% to about 30%, from about 1% to about 30%, or from about 5% to about 20% carbon on an atomic basis. In some embodiments the SiOC films may comprise from about 0% to about 70% oxygen on an atomic basis. In some embodiments the SiOC may comprise from about 10% to about 70%, from about 15% to about 50%, or from about 20% to about 40% oxygen on an atomic basis. In some embodiments the SiOC films may comprise about 0% to about 50% silicon on an atomic basis. In some embodiments the SiOC may comprise from about 10% to about 50%, from about 15% to about 40%, or from about 20% to about 35% silicon on an atomic basis. In some embodiments the SiOC may comprise from about 0.1% to about 40%, from about 0.5% to about 30%, from about 1% to about 30%, or from about 5% to about 20% sulfur on an atomic basis. In some embodiments the SiOC films may not comprise nitrogen. In some other embodiments the SiOC films may comprise from about 0% to about 10% nitrogen on an atomic basis (at %).

ALD-type processes are based on controlled, generally self-limiting surface reactions. Gas phase reactions are typically avoided by contacting the substrate alternately and sequentially with the reactants. Vapor phase reactants are separated from each other in the reaction chamber, for example, by removing excess reactants and/or reactant byproducts between reactant pulses. The reactants may be removed from proximity with the substrate surface with the aid of a purge gas and/or vacuum. In some embodiments excess reactants and/or reactant byproducts are removed from the reaction space by purging, for example with an inert gas.

In some embodiments a suitable substrate may comprise a wafer, such as a semiconductor wafer, for example a silicon wafer. In some embodiments the substrate may comprise a wafer having a diameter of equal to or greater than about 150 mm, equal to or greater than 200 mm, equal to or greater than 300 mm, or equal to or greater than 450 mm.

In some embodiments, plasma enhanced ALD (PEALD) processes are used to deposit oxygen containing films, such as oxide films, metal oxide films, oxide films comprising metal and silicon, and/or SiOC films. In some embodiments PEALD processes as described herein do not use oxygen plasma. In some embodiments PEALD processes as described herein use oxygen-free plasma. In some embodiments PEALD processes as described herein do not include a reactant comprising oxygen plasma. In some embodiments PEALD processes as described herein may use hydrogen plasma. In some embodiments PEALD processes as described herein may include a reactant comprising hydrogen plasma.

Briefly, a substrate or workpiece is placed in a reaction chamber and subjected to alternately repeated surface reactions. In some embodiments, thin oxide films are formed by repetition of a self-limiting ALD cycle. In some embodiments, for forming oxide films, each ALD cycle comprises at least two distinct phases. The contacting and removal of a reactant or precursor from the substrate may be considered a phase. In a first phase, a vapor phase first reactant or precursor contacts the substrate and forms no more than about one monolayer on the substrate surface. In some embodiments the first reactant comprises silicon and this reactant can also be referred to herein as "the silicon precursor," "silicon-containing precursor," or "silicon reactant" and may be, for example, a silicon alkoxide compounds, such as bis(triethoxysilyl)ethane (BTESE) or 3-methoxypropyltrimethoxysilane (MPTMS). In some embodiments the first reactant may comprise metal and this reactant can also be referred to as "the metal precursor", "metal-containing precursor" or "metal reactant". Exemplary metal reactants are described below.

In some embodiments excess first vapor phase reactant and any reaction byproducts are removed from the proximity of the substrate surface. The first vapor phase reactant and any reaction byproducts may be removed from proximity with the substrate surface with the aid of a purge gas and/or vacuum. In some embodiments excess reactant and/or reactant byproducts are removed from the reaction space by purging, for example with an inert gas. In some embodiments the substrate may be moved in order to facilitate removal of the reactant and/or reactant byproducts, for example by moving the substrate to a different reaction chamber.

In a second phase, a second reactant comprising a reactive species contacts the substrate and may convert adsorbed species of the first reactant to a corresponding oxide, such as to SiOC or to a metal oxide. In some embodiments the second reactant comprises a hydrogen precursor. In some embodiments, the reactive species comprises an excited species. In some embodiments the second reactant comprises a species from an oxygen-free plasma. In some embodiments the second reactant comprises a species from a hydrogen containing plasma. In some embodiments, the second reactant comprises hydrogen radicals, hydrogen atoms and/or hydrogen plasma. The second reactant may comprise other species that are not hydrogen precursors. In some embodiments the second reactant may comprise nitrogen species. In some embodiments, the second reactant may comprise a species from a noble gas, such as one or more of He, Ne, Ar, Kr, or Xe, for example as radicals, in plasma form, or in elemental form. These reactive species from noble gases do not necessarily contribute material to the deposited film, but can in some circumstances contribute to film growth as well as help in the formation and ignition of plasma. In some embodiments the reactive species generated from noble gases may affect the amount or extent of any damage to the underlying substrate. A skilled artisan will be able to select a noble gas or gases suitable for a particular application.

In some embodiments a gas that is used to form a plasma may flow constantly throughout the deposition process but only be activated intermittently. In some embodiments a gas that is used to form a plasma does not comprise oxygen. In some embodiments the adsorbed silicon or metal precursor is not contacted with a reactive species generated by a plasma from oxygen. In some embodiments a second reactant comprising reactive species is generated in a gas that does not comprise oxygen. For example in some embodiments a second reactant may comprise a plasma generated in a gas that does not comprise oxygen. In some embodiments the second reactant may be generated in a gas comprising less than about 50 atomic % (at %) oxygen, less than about 30 at % oxygen, less than about 10 at % oxygen, less than about 5 at % oxygen, less than about 1 at % oxygen, less than about 0.1 at % oxygen, less than about 0.01 at % oxygen, or less than about 0.001 at % oxygen.

In some embodiments a gas that is used to form a plasma does not comprise nitrogen. In some embodiments the adsorbed silicon precursor is not contacted with a reactive species generated by a plasma from nitrogen. In some embodiments a second reactant comprising reactive species is generated in a gas that does not comprise nitrogen. For example in some embodiments a second reactant may comprise a plasma generated in a gas that does not comprise nitrogen. However, in some embodiments a gas that is used to form a plasma may comprise nitrogen. In some other embodiments the second reactant may comprise nitrogen radicals, nitrogen atoms and/or nitrogen plasma. In some embodiments the second reactant may be generated in a gas comprising less than about 25 atomic % (at %) nitrogen, less than about 20 at % nitrogen, less than about 15 at % nitrogen, less than about 10 at % nitrogen, less than about 5 at % nitrogen, less than about 1 at % nitrogen, less than about 0.1 at % nitrogen, less than about 0.01 at % nitrogen, or less than about 0.001 at % nitrogen. In some embodiments the second reactant may be generated in a gas comprising hydrogen and nitrogen, for example the second reactant may comprise $H_2$ and $N_2$. In some embodiments the second reactant may be generated in a gas having a ratio of $N_2$ to $H_2$ ($N_2/H_2$) of less than about 20%, less than about 10%, or less than about 5%.

In some embodiments a gas that is used to form a plasma does not comprise nitrogen or oxygen. In some embodiments the adsorbed silicon or metal precursor is not contacted with a reactive species generated by a plasma from nitrogen or oxygen. In some embodiments a second reactant comprising reactive species is generated in a gas that does not comprise nitrogen or oxygen. For example in some embodiments a second reactant may comprise a plasma generated in a gas that does not comprise nitrogen or oxygen.

In some embodiments excess second reactant and any reaction byproducts are removed from the proximity of the substrate surface. The second reactant and any reaction byproducts may be removed from proximity with the substrate surface with the aid of a purge gas and/or vacuum. In some embodiments excess reactant and/or reactant byproducts are removed from the reaction space by purging, for example with an inert gas. In some embodiments the substrate may be moved in order to facilitate removal of the reactant and/or reactant byproducts, for example by moving the substrate to a different reaction chamber Additional phases may be added and phases may be removed as desired to adjust the composition of the final film. For example, in some embodiments a silicon precursor is provided in one phase, a metal precursor is provided in a second phase and a third reactant comprising reactive species is provided in a third phase to form an oxide comprising silicon and metal.

One or more of the reactants may be provided with the aid of a carrier gas, such as Ar or He. In some embodiments the silicon or metal precursor and the second reactant are provided with the aid of a carrier gas.

In some embodiments, two of the phases may overlap, or be combined. For example, the silicon or metal precursor and the second reactant may contact the substrate simultaneously in phases that partially or completely overlap. In addition, although referred to as the first and second phases, and the first and second reactants, the order of the phases may be varied, and an ALD cycle may begin with any one of the phases. That is, unless specified otherwise, the reactants can contact the substrate in any order, and the process may begin with any of the reactants.

As discussed in more detail below, in some embodiments for depositing an oxide film, one or more deposition cycles begin by contacting the substrate with a silicon or metal precursor, followed by the second precursor. In other embodiments deposition may begin by contacting the substrate with the second precursor, followed by the silicon or metal precursor.

In some embodiments a PEALD process for forming an oxide thin film comprises at least one first deposition cycle in which a substrate is contacted with a first vapor phase precursor comprising a component of the oxide film and oxygen, and a second reactant comprising reactive species, and at least one second deposition cycle comprising contacting the substrate with a third vapor phase precursor comprising a second, different component of the oxide and a fourth reactant comprising reactive species. The reactive species may be from a plasma formed in a gas that does not comprise oxygen, as described herein. In some embodiments excess reactant and/or reaction byproducts, if any, are removed from the reaction space between contacting steps, such as by purging. In some embodiments the second reactant and the fourth reactant are the same. In some embodiments the second precursor comprises the second component of the film as well as oxygen. The first deposition cycle and second deposition cycle can be carried out at a selected ratio in order to form a metal oxide with the desired composition.

In some embodiments the oxide thin film comprises metal and silicon. Thus, in some embodiments the first precursor comprises metal and the third precursor comprises silicon. In some embodiments the oxide comprises two different metals and the first precursor and the third precursor comprise different metals. In some embodiments the oxide is selectively deposited on a first surface of a substrate relative to a second surface, such as on a dielectric surface relative to a metal surface. In some embodiments an oxide comprising metal and silicon is selectively deposited on a first surface of a substrate relative to a second surface, such as on a dielectric surface relative to a metal surface.

In some embodiments the substrate on which deposition is desired, such as a semiconductor workpiece, is loaded into a reaction space or reactor. The reactor may be part of a cluster tool in which a variety of different processes in the formation of an integrated circuit are carried out. In some embodiments a flow-type reactor is utilized. In some embodiments a shower head type of reactor is utilized. In some embodiments, a space divided reactor is utilized. In some embodiments a high-volume manufacturing-capable single wafer ALD reactor is used. In other embodiments a batch reactor comprising multiple substrates is used. For embodiments in which batch ALD reactors are used, the number of substrates is in the range of 10 to 200, in the range of 50 to 150, or in the range of 100 to 130.

Examples of suitable reactors that may be used include commercially available equipment such as the F-120® reactor, F-450® reactor, Pulsar® reactors—such as the Pulsar® 2000 and the Pulsar® 3000—EmerALD® reactor and Advance® 400 Series reactors, available from ASM America, Inc of Phoenix, Ariz. and ASM Europe B.V., Almere, Netherlands. Other commercially available reactors include those from ASM Japan K.K (Tokyo, Japan) under the tradename Eagle® XP and XP8.

In some embodiments, if necessary, the exposed surfaces of the workpiece can be pretreated to provide reactive sites to react with the first phase of the ALD process. In some embodiments a separate pretreatment step is not required. In some embodiments the substrate is pretreated to provide a desired surface termination. In some embodiments the substrate is pretreated with plasma. In some embodiments the deposition cycle begins with provision of the second reactant comprising reactive species, such that the reactive species serve to pretreat the substrate surface to react with the subsequent metal or silicon reactant.

Excess reactant and reaction byproducts, if any, are removed from the vicinity of the substrate, and in particular from the substrate surface, between reactant contacting phases. In some embodiments excess reactant and reaction byproducts, if any, are removed from the substrate surface by, for example, purging the reaction chamber between reactant contacting phases, such as by purging with an inert gas. The flow rate and contacting time of each reactant is tunable, as is the removal step, allowing for control of the quality and various properties of the films.

As mentioned above, in some embodiments a gas is provided to the reaction chamber continuously during each deposition cycle, or during the entire ALD process, and reactive species are provided by generating a plasma in the gas, either in the reaction chamber or upstream of the reaction chamber. In some embodiments the gas does not comprise nitrogen. In some embodiments the gas may comprise noble gas, such as helium or argon. In some embodiments the gas is helium. In some embodiments the gas is argon. The flowing gas may also serve as a purge gas for the first and/or second reactant (or reactive species). For example, flowing argon may serve as a purge gas for a first silicon precursor and also serve as a second reactant (as a source of reactive species). In some embodiments, argon or helium may serve as a purge gas for a first precursor and a source of excited species. The excited species may serve, for example, to convert a silicon precursor to a SiOC film or a metal precursor to a metal oxide film. In some embodiments the gas in which the plasma is generated does not comprise nitrogen and the adsorbed silicon precursor is not contacted with a reactive species generated by a plasma from nitrogen. In some embodiments the gas in which the plasma is generated does not comprise oxygen and the adsorbed silicon precursor is not contacted with a reactive species generated by a plasma from oxygen. In some embodiments the gas in which the plasma is generated does not comprise oxygen or nitrogen and the adsorbed silicon precursor is not contacted with a reactive species generated by a plasma from oxygen or nitrogen.

The cycle is repeated until an oxide film of the desired thickness and composition is obtained. In some embodiments the deposition parameters, such as the precursor flow rate, contacting time, removal time, and/or reactants themselves, may be varied in one or more deposition cycles during the ALD process in order to obtain a film with the desired characteristics.

In some embodiments the surface of the substrate is contacted with a reactant. In some embodiments a pulse of reactant is provided to a reaction space containing the substrate. The term "pulse" may be understood to comprise feeding reactant into the reaction chamber for a predetermined amount of time. The term "pulse" does not restrict the length or duration of the pulse and a pulse can be any length of time. In some embodiments the substrate is moved to a reaction space containing a reactant. In some embodiments the substrate is subsequently moved from a reaction space containing a first reactant to a second, different reaction space containing the second reactant.

In some embodiments, the substrate is contacted with the silicon or metal reactant first. After an initial surface termination, if necessary or desired, the substrate is contacted with a first silicon reactant. In some embodiments a first silicon reactant pulse is supplied to the workpiece. In accordance with some embodiments, the first reactant pulse comprises a carrier gas flow and a volatile silicon species, such as silicon alkoxide compounds, for example BTESE or MPTMS, that is reactive with the workpiece surfaces of interest. In some embodiments the first reactant pulse comprises a carrier gas flow and a volatile metal species. Accordingly, the silicon or metal reactant adsorbs upon these workpiece surfaces. The first reactant pulse self-saturates the workpiece surfaces with silicon or metal reactant species such that any excess constituents of the first reactant pulse do not further react with the molecular layer formed by this process.

The first reactant pulse can be supplied in gaseous form. The first precursor gas is considered "volatile" for purposes of the present description if the species exhibits sufficient vapor pressure under the process conditions to transport the species to the workpiece in sufficient concentration to saturate exposed surfaces.

In some embodiments the first reactant contacts the surface from about 0.05 seconds to about 5.0 seconds, about 0.1 seconds to about 3 seconds or about 0.2 seconds to about 1.0 seconds. The optimum contacting time can be readily determined by the skilled artisan based on the particular circumstances.

After sufficient time for about a molecular layer to adsorb on the substrate surface, excess first reactant, and reaction byproducts, if any, are removed from the substrate surface. In some embodiments removing excess reactant and reaction byproducts, if any, may comprise purging the reaction chamber. In some embodiments the reaction chamber may be purged by stopping the flow of the first reactant while continuing to flow a carrier gas or purge gas for a sufficient time to diffuse or purge excess reactants and reactant by-products, if any, from the reaction space. In some embodiments the excess first precursor is purged with the aid of inert gas, such as helium or argon, which is flowing throughout the ALD cycle. In some embodiments the substrate may be moved from the reaction space containing the first reactant to a second, different reaction space. In some embodiments, the first reactant is removed for about 0.1 seconds to about 10 seconds, about 0.3 seconds to about 5 seconds or about 0.3 seconds to about 1 second. Contacting and removal of the silicon reactant can be considered the first or silicon phase of the ALD cycle.

In the second phase, a second reactant comprising a reactive species, such as hydrogen plasma and/or an oxygen-free plasma is provided to the workpiece. Hydrogen plasma may be formed by generating a plasma in hydrogen in the reaction chamber or upstream of the reaction chamber, for example by flowing the hydrogen ($H_2$) through a remote plasma generator.

In some embodiments, plasma is generated in flowing $H_2$ gas. In some embodiments $H_2$ is provided to the reaction chamber before the plasma is ignited or hydrogen atoms or radicals are formed. In some embodiments the $H_2$ is provided to the reaction chamber continuously and hydrogen containing plasma, atoms or radicals is created or supplied when needed.

Typically, the second reactant, for example comprising hydrogen plasma, contacts the substrate for about 0.1 seconds to about 10 seconds. In some embodiments the second reactant, such as hydrogen containing plasma, contacts the substrate for about 0.1 seconds to about 10 seconds, 0.5 seconds to about 5 seconds or 0.5 seconds to about 2.0 seconds. However, depending on the reactor type, substrate type and its surface area, the second reactant contacting time may be even higher than about 10 seconds. In some embodiments, contacting times can be on the order of minutes. The optimum contacting time can be readily determined by the skilled artisan based on the particular circumstances.

In some embodiments the second reactant is provided in two or more distinct pulses, without introducing another reactant in between any of the two or more pulses. For example, in some embodiments a plasma, such as a hydrogen containing plasma, is provided in two or more sequential pulses, without introducing a silicon or metal precursor in between the sequential pulses. In some embodiments during provision of plasma two or more sequential plasma pulses are generated by providing a plasma discharge for a first period of time, extinguishing the plasma discharge for a second period of time, for example from about 0.1 seconds to about 10 seconds, from about 0.5 seconds to about 5 seconds or about 1.0 seconds to about 4.0 seconds, and exciting it again for a third period of time before introduction of another precursor or a removal step, such as before the silicon or metal precursor or before a purge step. Additional pulses of plasma can be introduced in the same way. In some embodiments a plasma is ignited for an equivalent period of time in each of the pulses.

In some embodiments plasma, for example hydrogen containing plasma may be generated by applying RF power of from about 5 W to about 5000 W, 10 W to about 2000 W, from about 50 W to about 1000 W, or from about 200 W to about 800 W in some embodiments. In some embodiments the RF power density may be from about 0.001 $W/cm^2$ to about 10 $W/cm^2$, from about 0.01 $W/cm^2$ to about 5 $W/cm^2$, from about 0.02 $W/cm^2$ to about 2.0 $W/cm^2$, or from about 0.05 $W/cm^2$ to about 1.5 $W/cm^2$. The RF power may be applied to second reactant that flows during the plasma contacting time, that flows continuously through the reaction chamber, and/or that flows through a remote plasma generator. Thus in some embodiments the plasma is generated in situ, while in other embodiments the plasma is generated remotely. In some embodiments a showerhead reactor is utilized and plasma is generated between a susceptor (on top of which the substrate is located) and a showerhead plate. In some embodiments the gap between the susceptor and showerhead plate is from about 0.05 cm to about 50 cm, from about 0.1 cm to about 20 cm, from about 0.5 cm to about 5 cm, or from about 0.8 cm to about 3.0 cm. As described herein, in some embodiments the plasma power may be selected, for example from a given range of plasma powers, in order to achieve a desired step coverage, etch rate, or WERR, for a deposited film.

After a time period sufficient to completely saturate and react the previously adsorbed molecular layer of silicon or metal species with the plasma pulse, any excess reactant and reaction byproducts are removed from the substrate surface. In some embodiments removing excess reactant and reaction byproducts, if any, may comprise purging the reaction chamber. In some embodiments the reaction chamber may be purged by stopping the flow of the second reactant while continuing to flow a carrier gas or purge gas for a sufficient time to diffuse or purge excess reactants and reactant by-products, if any, from the reaction space. In some embodiments the excess second precursor is purged with the aid of inert gas, such as helium or argon, which is flowing throughout the ALD cycle. In some embodiments the substrate may be moved from the reaction space containing the second reactant to a different reaction space. The removal may, in some embodiments, be from about 0.1 seconds to about 10 seconds, about 0.1 seconds to about 4 seconds or about 0.1 seconds to about 0.5 seconds. Together, the reactive species contacting and removal represent a second, reactive species phase in an oxide atomic layer deposition cycle.

The two phases together represent one ALD cycle, which is repeated to form oxide thin films of a desired thickness. In some embodiments each ALD cycle is the same. In some embodiments the ALD cycles may vary to provide an oxide of the desired composition. For example, a first ALD cycle utilizing a silicon precursor to form silicon oxide and a second ALD cycle utilizing a metal reactant to form metal oxide may be provided at a desired ratio to deposit an oxide comprising metal and silicon. In some embodiments an ALD cycle may comprise additional phases. For example an additional phase may comprise providing a third precursor to form a more complex oxide, such as an oxide comprising metal and silicon.

While the ALD cycle is generally referred to herein as beginning with the silicon phase, it is contemplated that in other embodiments the cycle may begin with the reactive species phase. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first ALD cycle, in subsequent cycles the reactive species phase will effectively follow the silicon phase. In some embodiments one or more different ALD cycles are provided in the deposition process.

According to some embodiments of the present disclosure, PEALD reactions may be performed at temperatures ranging from about 25° C. to about 700° C., from about 50° C. to about 600° C., from about 100° C. to about 450° C., or from about 200° C. to about 400° C. In some embodiments, the optimum reactor temperature may be limited by the maximum allowed thermal budget. Therefore, in some embodiments the reaction temperature is from about 100° C. to about 300° C. In some applications, the maximum temperature is about 200° C., and, therefore the PEALD process is run at that reaction temperature.

The substrate on which a thin film is deposited may comprise various types of materials. In some embodiments the substrate may comprise an integrated circuit workpiece. In some embodiments the substrate may comprise silicon. In some embodiments the substrate may comprise silicon oxide, for example, thermal oxide. In some embodiments the substrate may comprise a high-k dielectric material. In some embodiments the substrate may comprise carbon. For example the substrate may comprise an amorphous carbon layer, graphene, and/or carbon nanotubes.

In some embodiments the substrate may comprise a metal, including, but not limited to W, Cu, Ni, Co, and/or Al. In some embodiments the substrate may comprise a metal nitride, including, but not limited to TiN and/or TaN. In some embodiments the substrate may comprise a metal carbide, including, but not limited to TiC and/or TaC. In some embodiments the substrate may comprise a metal chalcogenide, including, but not limited to $MoS_2$, $Sb_2Te_3$, and/or GeTe. In some embodiments the substrate may comprise a material that would be oxidized by exposure to an oxygen plasma process, but not by a PEALD process as described herein.

In some embodiments, an oxide is selectively deposited on a first surface, such as a dielectric surface, relative to a second surface, such as metal or metallic surface. In some embodiments a metal oxide is selectively deposited on a first surface, such as a dielectric surface, relative to a second surface, such as metal or metallic surface. In some embodiments an oxide comprising metal and silicon is selectively deposited on a first surface, such as a dielectric surface, relative to a second surface, such as metal or metallic surface. The oxide film grows on the first surface, such as a dielectric surface. The growth is less or does not occur on a second surface, such as a metal or metallic surface.

In some embodiments a substrate used in the PEALD processes described herein may comprise an organic material. For example, the substrate may comprise an organic material such as a plastic, polymer, and/or photoresist. In some embodiments where the substrate comprises an organic material the reaction temperature of a PEALD process may be less than about 200° C. In some embodiments the reaction temperature may be less than about 150° C., less than about 100° C., less than about 75° C., or less than about 50° C.

As discussed in more detail below, in some embodiments the substrate comprises a passivation layer on a first surface, such as a metal or metallic surface and the oxide is selectively deposited on a second surface, such as a dielectric surface, relative to the first passivated surface. In some embodiments the passivation layer comprises an organic material. The organic material may be selectively deposited on the first surface relative to the second surface prior to carrying out the oxide deposition. In some embodiments the second plasma reactant in the oxide deposition cycle also etches the passivation layer on the first surface.

In some embodiments where a substrate comprises an organic material the maximum process temperature may be as low as 100° C. In some embodiments where the substrate comprises an organic material, the absence of a plasma generated from oxygen may allow for deposition of a SiOC thin film on an organic material that may not otherwise degrade in a deposition process including plasma generated from oxygen.

According to some embodiments of the present disclosure, the pressure of the reaction chamber during processing is maintained at from about 0.01 Torr to about 50 Torr, or from about 0.1 Torr to about 10 Torr. In some embodiments the pressure of the reaction chamber is greater than about 6 Torr, or about 20 Torr. In some embodiments, a SiOC deposition process can be performed at a pressure of about 20 Torr to about 500 Torr, about 20 Torr to about 50 Torr, or about 20 Torr to about 30 Torr.

In some embodiments an oxide deposition process can comprise a plurality of deposition cycles, wherein at least one deposition cycle is performed in an elevated pressure regime. For example, a deposition cycle of a PEALD process may comprise alternately and sequentially contacting the substrate with a first precursor and a second reactant under the elevated pressure. In some embodiments, one or more deposition cycles of the PEALD process can be performed at a process pressure of about 6 Torr to about 500 Torr, about 6 Torr to about 50 Torr, or about 6 Torr to about 100 Torr. In some embodiments, the one or more deposition cycles can be performed at a process pressure of greater than about 20 Torr, including about 20 Torr to about 500 Torr, about 30 Torr to about 500 Torr, about 40 Torr to about 500 Torr, or about 50 Torr to about 500 Torr. In some embodiments, the one or more deposition cycles can be performed at a process pressure of about 20 Torr to about 30 Torr, about 20 Torr to about 100 Torr, about 30 Torr to about 100 Torr, about 40 Torr to about 100 Torr or about 50 Torr to about 100 Torr.

Controlled Formation of SiOC Films

As mentioned above, and discussed in more detail below, in some embodiments SiOC thin films can be deposited on a substrate in a reaction space by a plasma enhanced atomic deposition layer (PEALD) process. In some embodiments the SiOC is selectively deposited on a first surface, such as a dielectric surface, relative to a second surface, such as metal or metallic surface. According to some embodiments, a SiOC thin film is deposited using a PEALD process on a substrate having three dimensional features, such as in a FinFET application. In some embodiments where a SiOC thin film is deposited on a three dimensional feature, properties such as the step coverage and/or WERR of the deposited film on different surfaces of the feature may be controlled by selecting an appropriate plasma power from a given range or plasma powers. In some embodiments the properties of the deposited film, such as the thickness or WER, may be controlled to be different on different surfaces, such as vertical and horizontal surfaces of the feature. In some embodiments a PEALD process as described herein may be used in a variety of applications. For example, a PEALD process as described herein may be used in the formation of hardmask layers, sacrificial layers, protective layers, or low-k spacers. A PEALD process as described herein may be used in, for example, memory device applications.

In some embodiments a SiOC thin film may be deposited by a PEALD process that does not include oxygen plasma, as described herein, on a substrate that is not able to withstand O plasma without damage, for example a substrate comprising an organic and/or photoresist material.

Referring to FIG. 1A and according to some embodiments the formation of a SiOC thin film on a substrate comprising a three dimensional feature in a reaction space is controlled by a PEALD deposition process 100 comprising at least one cycle comprising:

contacting the substrate with a vapor phase silicon-containing precursor that comprises oxygen at step 120 such that silicon species adsorb onto the surface of the substrate;

removing excess silicon-containing precursor and reaction byproducts, if any, from the substrate surface at step 130;

selecting a plasma power from a range of plasma powers to achieve a desired step coverage and/or WERR for the to be deposited SiOC film at step 140;

contacting the substrate with a second reactant comprising reactive species comprising hydrogen and not comprising oxygen generated by plasma generated at the selected plasma power at step 150, thereby converting the adsorbed silicon species into SiOC;

removing excess second reactant and reaction byproducts, if any, from the substrate surface at step 160; and optionally repeating the contacting and removing steps at step 170 to form a SiOC thin film of a desired thickness, composition, step coverage, and/or WERR on a three dimensional feature of the substrate.

In some embodiments step 140 may comprise selecting an appropriate plasma power to achieve a desired step coverage and/or WERR from a range of plasma powers, for example a range of from about 50 W to about 1000 W or about 10 W to about 300 W for a three dimensional feature having an aspect ratio of from about 1 to about 3. In some embodiments the plasma power required to achieve a desired property may be worked out prior to the deposition process. That is, in some embodiments the range of plasma powers corresponds to a known range of pre-established material properties for the to be deposited film. In some embodiments the aspect ratio of the three dimensional feature may influence the selected plasma power. For example, a higher plasma power may be selected to achieve a desired step coverage on a three dimensional feature having a high aspect ratio than on a three dimensional feature having a comparatively lower aspect ratio. In some embodiments a higher, or greater, plasma power may be selected to achieve a SiOC film having a higher desired step coverage on a given three-dimensional structure. In some embodiments a higher plasma power may be selected to achieve a SiOC film having a lower WERR than a substantially similar film deposited by a substantially similar deposition process using a lower plasma power. As used herein, the wet etch rate ratio (WERR) refers to the ratio of the wet etch rate of material deposited on a vertical surface, such as a sidewall to the wet etch rate of material deposited on a horizontal surface, such as a top surface of a three dimensional feature.

In some embodiments selecting an appropriate plasma power can achieve a desired step coverage below, at, or about 100% using the same combination of precursors and/or reactants. In some embodiments the plasma power can be selected such that the deposition process is selective on a first surface, such as a vertical surface of a three dimensional feature relative to a second surface, such as a horizontal surface of a three dimensional feature.

In some embodiments step 150 may comprise remotely generating or forming plasma or reactive species before contacting the substrate with the second reactant.

According to some embodiments the formation of a SiOC thin film on a substrate comprising a three dimensional feature in a reaction space is controlled by an ALD-type deposition process comprising multiple SiOC deposition cycles, each SiOC deposition cycle comprising:

contacting a substrate with a vapor phase silicon reactant that comprises oxygen such that a silicon compound adsorbs on the substrate surface;

exposing the substrate to a purge gas and/or vacuum;

selecting a plasma power from a range of plasma powers to achieve a desired step coverage and/or WERR for the to be deposited SiOC film;

contacting the substrate with reactive species generated by forming a plasma generated at the selected plasma power in a second reactant comprising hydrogen; and exposing the substrate to a purge gas and/or vacuum;

optionally repeating the contacting and exposing steps until a SiOC thin film of a desired thickness, composition, step coverage, and/or WERR is obtained.

In some embodiments the exposing the substrate to a purge gas and/or vacuum steps may comprise continuing the flow of an inert carrier gas while stopping the flow of a precursor or reactant. In some embodiments the exposing the substrate to a purge gas and/or vacuum steps may comprise stopping the flow of a precursor and a carrier gas into a reaction chamber and evacuating the reaction chamber, for example with a vacuum pump. In some embodiments the exposing the substrate to a purge gas and/or vacuum steps may comprise moving the substrate from a first reaction chamber to a second, different reaction chamber containing a purge gas. In some embodiments the exposing the substrate to a purge gas and/or vacuum steps may comprise moving the substrate from a first reaction chamber to a second, different reaction chamber under a vacuum. In some embodiments the reactive species may not comprise nitrogen.

In some embodiments selecting an appropriate plasma power to achieve a desired step coverage and/or WERR from a range of plasma powers may comprise, for example selecting a plasma power from a range of from about 50 W to about 1000 W or about 10 W to about 500 W for a three dimensional feature having an aspect ratio of from about 1 to about 3. In some embodiments the aspect ratio of the three dimensional feature may influence the selected plasma power. For example, a three dimensional feature having a high aspect ratio may require selecting a higher plasma power to achieve a desired step coverage than a three dimensional feature having a comparatively lower aspect ratio. In some embodiments a higher, or greater, plasma power may be selected to achieve a SiOC film having a higher desired step coverage. In some embodiments a higher plasma power may be selected to achieve a SiOC film having a lower WERR. In some embodiments the plasma power may be selected from a range of about 10 W to about 500 W, about 200 W to about 650 W, or from about 200 W to about 500 W. In some embodiments the plasma power may be selected from a range of about 650 W or less, 500 W or less, or 200 W or less, down to about 10 W.

In some embodiments the formation of a SiOC thin film on a substrate comprising a three dimensional feature in a reaction space is controlled by a PEALD deposition process comprising at least one cycle comprising:

contacting the substrate with a vapor phase silicon-containing precursor comprising MPTMS such that silicon species adsorb onto the surface of the substrate;

removing excess silicon-containing precursor and reaction byproducts, if any, from the substrate surface;

selecting a plasma power from a range of plasma powers to achieve a desired step coverage and/or WERR for the to be deposited SiOC film;

contacting the substrate with a second reactant comprising reactive species generated by plasma from a gas comprising $H_2$ and Ar, the plasma generated by the selected plasma power, thereby converting the adsorbed silicon species into SiOC;

removing excess second reactant and reaction byproducts, if any, from the substrate surface; and optionally repeating the contacting and removing steps to form a SiOC thin film of a desired thickness, composition, step coverage, and/or WERR on a three dimensional feature of the substrate.

In certain embodiments, a SiOC thin film is formed on a substrate by an ALD-type process comprising multiple SiOC deposition cycles, each SiOC deposition cycle comprising: alternately and sequentially contacting the substrate with a first vapor phase silicon precursor that comprises oxygen and a second reactant comprising reactive species generated from a plasma having a selected plasma power. In some embodiments the plasma power may be selected from a range of plasma powers in order to achieve a desired step coverage and/or WERR in the to be deposited SiOC film.

In some embodiments, the PEALD process is performed at a temperature between about 100° C. to about 650° C., about 100° C. to about 550° C., about 100° C. to about 450° C., about 200° C. to about 600° C., or at about 200° C. to about 400° C. In some embodiments the temperature is about 300° C. In some embodiments the temperature is about 200° C. In some embodiments, for example where a substrate comprises an organic material such as an organic photoresist, the PEALD process may be performed at a temperature less than about 100° C. In some embodiments the PEALD process is performed at a temperature less than about 75° C., or less than about 50° C. The temperature may, in some embodiments, be down to about 10° C.

In some embodiments the second reactant may comprise reactive species from a plasma, where the plasma may be generated by applying the selected plasma power, for example a selected RF power. The RF power may be applied to thereby generate reactive species. In some embodiments the RF power may be applied to a gas that flows continuously through the reaction chamber, and/or that flows through a remote plasma generator. Thus in some embodiments the plasma is generated in situ, while in other embodiments the plasma is generated remotely. In some embodiments the selected RF power applied to a gas is selected from a range of from about 5 W to about 5000 W, from about 10 W to about 2000 W, from about 50 W to about 1000 W, form abut 10 W to about 500 W, or from about 200 W to about 800 W. As discussed herein, in some embodiments the plasma is generated in a gas that does not comprise oxygen. In some embodiments the plasma is generated in a gas that comprises hydrogen, such as in $H_2$ gas. In some embodiments the plasma is generated in a gas comprising a noble gas, such as in Ar gas. In some embodiments the plasma is generated in a gas comprising $H_2$ and Ar.

Referring to FIG. 1B and according to some embodiments the formation of a an oxygen-containing thin film on a substrate comprising a three dimensional feature in a reaction space is controlled by a PEALD deposition process 101 comprising at least one cycle comprising:

contacting the substrate with a vapor phase first precursor that comprises oxygen at step 121 such that precursor species adsorb onto the surface of the substrate;

removing excess first precursor and reaction byproducts, if any, from the substrate surface at step 131;

selecting a plasma power from a range of plasma powers to achieve a desired step coverage and/or WERR for the to be deposited thin film at step 141;

contacting the substrate with a second reactant comprising reactive species generated by forming a plasma in a gas comprising hydrogen but not oxygen, where the plasma is generated at the selected plasma power at step 151, thereby converting the adsorbed silicon species into the oxygen-containing thin film;

removing excess second reactant and reaction byproducts, if any, from the substrate surface at step 161; and optionally repeating the contacting and removing steps at step 171 to form an oxygen-containing thin film of a desired thickness, composition, step coverage, and/or WERR on a three dimensional feature of the substrate.

In some embodiments step 141 may comprise selecting an appropriate plasma power to achieve a desired step coverage and/or WERR from a range of plasma powers, for example a range of from about 50 W to about 1000 W for a three dimensional feature having an aspect ratio of from about 1 to about 3. In some embodiments the plasma power required to achieve a desired property may be worked out prior to the deposition process. That is, in some embodiments the range of plasma powers corresponds to a known range of pre-established material properties for the to be deposited film. In some embodiments the aspect ratio of the three dimensional feature may influence the selected plasma power. For example, a higher plasma power may be selected to achieve a desired step coverage on a three dimensional feature having a high aspect ratio than on a three dimensional feature having a comparatively lower aspect ratio. In some embodiments a higher, or greater, plasma power may be selected to achieve a film having a higher desired step coverage on a given three-dimensional structure. In some embodiments a higher plasma power may be selected to achieve a film having a lower WERR than a substantially similar film deposited by a substantially similar deposition process using a lower plasma power. As used herein, the wet etch rate ratio (WERR) refers to the ratio of the wet etch rate of material deposited on a vertical surface, such as a sidewall to the wet etch rate of material deposited on a horizontal surface, such as a top surface of a three dimensional feature.

In some embodiments selecting an appropriate plasma power can achieve a desired step coverage below, at, or about 100% using the same combination of precursors and/or reactants. In some embodiments the plasma power can be selected such that the deposition process is selective on a first surface, such as a vertical surface of a three dimensional feature relative to a second surface, such as a horizontal surface of a three dimensional feature.

In some embodiments step 151 may comprise remotely generating or forming plasma or reactive species before contacting the substrate with the second reactant.

Figure 2:
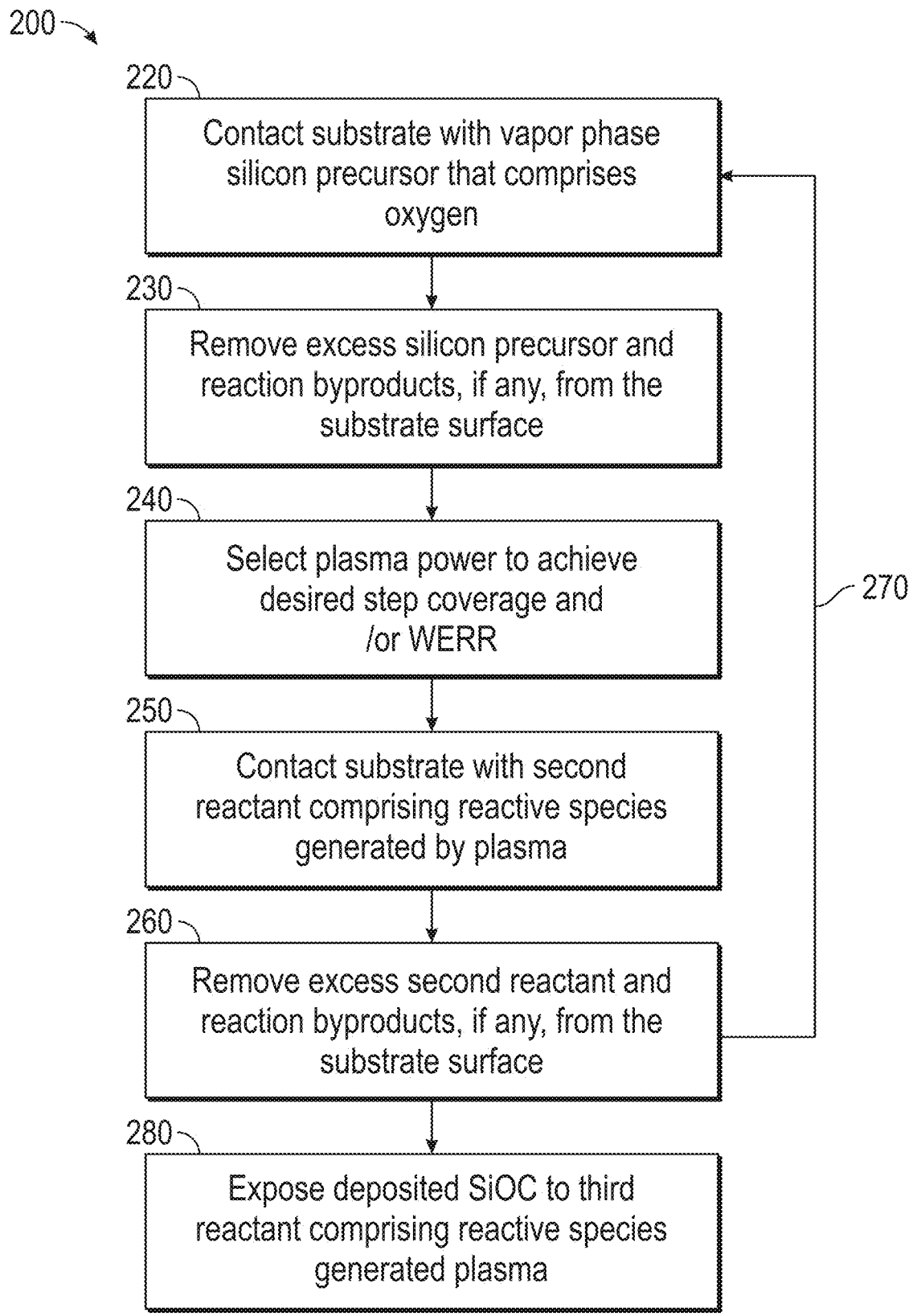
FIG. 2 is a process flow diagram for the controlled formation of a SiOC thin film by a PEALD process according to some embodiments.

Referring to FIG. 2 and according to some embodiments the formation of a SiOC thin film on a substrate comprising a three dimensional feature in a reaction space is controlled by a PEALD deposition process 200 comprising:

contacting the substrate with a vapor phase silicon-containing precursor that comprises oxygen at step 220 such that silicon species adsorb onto the surface of the substrate;

removing excess silicon-containing precursor and reaction byproducts, if any, from the substrate surface at step 230;

selecting a plasma power from a range of plasma powers to achieve a desired step coverage and/or WERR for the to be deposited SiOC film at step 240;

contacting the substrate with a second reactant comprising reactive species from a plasma generated in a gas comprising hydrogen and not comprising oxygen, where the plasma is generated by applying the selected plasma power at step 250, thereby converting the adsorbed silicon species into SiOC;

removing excess second reactant and reaction byproducts, if any, from the substrate surface at step 260;

optionally repeating the contacting and removing steps at step 270 to form a SiOC thin film of a desired thickness, composition, step coverage, and/or WERR on a three dimensional feature of the substrate; and exposing the deposited SiOC film to a third reactant comprising reactive species generate by plasma from a gas at step 280 to thereby reduce the thickness and/or WERR of the deposited SiOC film.

In some embodiments step 240 may comprise selecting an appropriate plasma power to achieve a desired step coverage and/or WERR from a range of plasma powers, for example a range of from about 50 W to about 1000 W for a three dimensional feature having an aspect ratio of from about 1 to about 3. In some embodiments the aspect ratio of the three dimensional feature may influence the selected plasma power. For example, a three dimensional feature having a high aspect ratio may require selecting a higher plasma power to achieve a desired step coverage than a three dimensional feature having a comparatively lower aspect ratio. In some embodiments a higher, or greater, plasma power may be selected to achieve a SiOC film having a higher desired step coverage. In some embodiments a higher plasma power may be selected to achieve a SiOC film having a lower WERR.

In some embodiments step 250 may comprise remotely generating or forming plasma or reactive species before contacting the substrate with the second reactant.

In some embodiments step 280 comprises a post deposition treatment and may comprise remotely generating or forming plasma or reactive species before contacting the substrate with the third reactant. In some embodiments the third reactant may comprise identical reactive species to the second reactant. In some embodiments the gas used to generate the reactive species of the third reactant may comprise hydrogen, nitrogen or oxygen. In some embodiments the gas used to generate the reactive species of the third reactant may comprise a noble gas or gases, such as argon. In some embodiments the gas used to generate the reactive species does not comprise oxygen. In some embodiments the third reactant may be substantially the same as the second reactant, but the plasma power used to generate the third reactant may be different than the plasma power used to generate the second reactant. For example, in some embodiments a higher plasma power may be used to generate the reactive species of the third reactant than is used to generate the reactive species of the second reactant. For example, in some embodiments a plasma power of about 400 W to about 600 W, from about 400 W to about 1000 W, or from about 600 W to about 1000 W may be used to generate the reactive species comprising the third reactant.

In some embodiments exposing the deposited SiOC film to a third reactant may reduce the thickness and/or WERR of the deposited SiOC film. In some embodiments step 280 may reduce the thickness and/or WER of a first portion of the SiOC film more than a second portion of the SiOC film. For example, in some embodiments step 280 may reduce the thickness of the SiOC film on a first surface, such as a vertical surface of the substrate, and a second surface, such as a horizontal surface of the substrate such that the thickness of the SiOC film deposited on the second surface is reduced substantially more than the thickness of the SiOC film deposited on the first surface. That is, in some embodiments the post deposition treatment of step 280 may increase the step coverage of the SiOC film. In some embodiments the post deposition treatment of step 280 may increase the step coverage of the SiOC film by about 10%, 25%, 50%, 75%, 100%, 200%. 500%, or 1000% or more.

In some embodiments step 280 may reduce the WER of the SiOC film on a first surface, such as a vertical surface of the substrate, and a second surface, such as a horizontal surface of the substrate such that the WER of the SiOC film on the first surface is reduced substantially more than the WER of the SiOC film on the second surface. That is, in some embodiments the post deposition treatment comprising step 280 may reduce the WERR of the SiOC film. For example, in some embodiments a post deposition treatment comprising step 280 may reduce the WERR of the SiOC film by about 5%, 10%, 25%, 50%, 75%, 90%, or even 100%.

Figure 3:
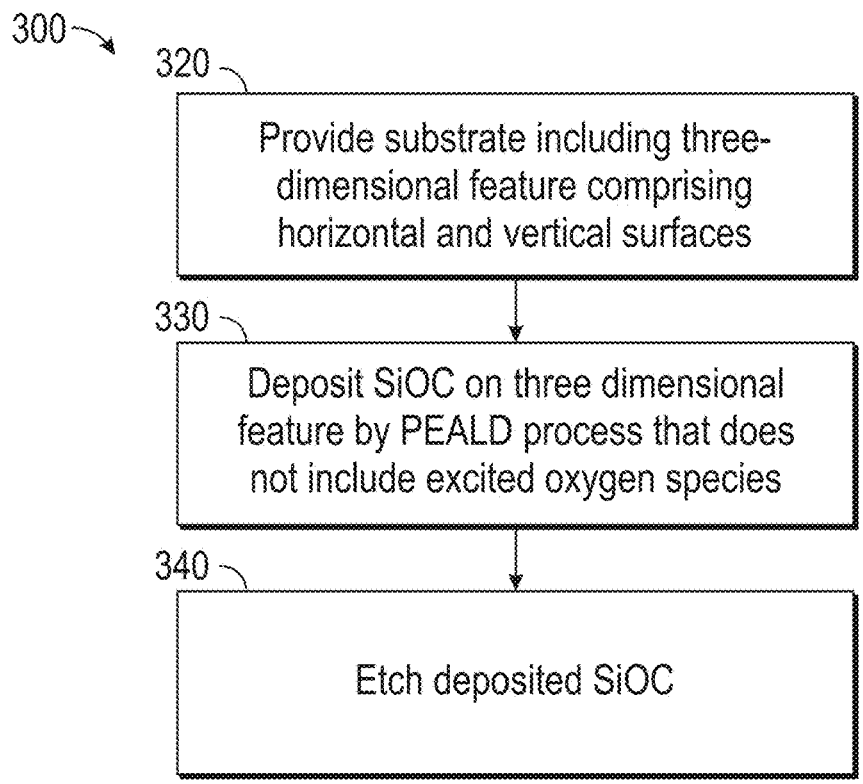
FIG. 3 is a process flow diagram for the selective formation of a SiOC thin film on horizontal surfaces of a three dimensional feature relative to vertical surfaces of the same three dimensional feature by a PEALD process.

Referring now to FIG. 3 and according to some embodiments the formation of a SiOC thin film on a three dimensional feature is controlled by a process 300 comprising:

providing a substrate comprising at least one three dimensional feature comprising a horizontal surface and a vertical surface at step 320;

depositing SiOC on the at least one three dimensional feature by a PEALD process that does not comprise excited oxygen species, as described herein at step 330; and etching the deposited SiOC at step 340.

In some embodiments depositing SiOC on the at least one three dimensional feature at step 330 may comprise depositing SiOC by the deposition processes provided herein, for example the controlled formation PEALD processes described above with respect to FIGS. 1 and 2.

In some embodiments etching the deposited SiOC at step 340 may comprise an etch process known in the art, for example a dry etch process such as a plasma etch process or a wet etch process such as a 0.5 wt % dilute HF etch process. In some embodiments etching the deposited SiOC at step 340 may remove at least a portion of the deposited SiOC.

In some embodiments the etch process may comprise exposing the substrate to hydrogen atoms, hydrogen radicals, hydrogen plasma, or combinations thereof. For example, in some embodiments the etch process may comprise exposing the substrate to a plasma generated from a gas comprising hydrogen, such as a gas comprising $H_2$, using a power from about 10 W to about 5000 W, from about 25 W to about 2500 W, from about 50 W to about 500 W, or from about 100 W to about 400 W. In some embodiments the etch process may comprise exposing the substrate to a plasma generated using a power from about 1 W to about 1000 W, from about 10 W to about 500 W, from about 20 W to about 250 W, or from about 25 W to about 100 W.

In some embodiments the etch process may comprise exposing the substrate to a plasma comprising reactive species such as oxygen atoms, oxygen radicals, oxygen plasma, or combinations thereof. In some embodiments the plasma may comprise reactive species such as hydrogen atoms, hydrogen radicals, hydrogen plasma, or combinations thereof. In some embodiments the plasma may also comprise noble gas species in addition to reactive species, for example Ar or He species. In some embodiments the plasma may comprise noble gas species without reactive species. In some instances, the plasma may comprise other species, for example nitrogen atoms, nitrogen radicals, nitrogen plasma, or combinations thereof. In some embodiments the substrate may be exposed to an etchant at a temperature of between about 30° C. and about 500° C., or between about 100° C. and about 400° C. In some embodiments the etchant may be supplied in one continuous pulse or may be supplied in multiple shorter pulses.

A skilled artisan can readily determine the optimal exposure time, temperature, and/or power for removing the desired amount of deposited SiOC from the three dimensional feature.

In some embodiments etching the deposited SiOC at step 340 may remove substantially all of the deposited SiOC from a first surface, such as a vertical surface of the three dimensional feature and may not remove substantially all of the deposited SiOC from a second different surface, such as a horizontal surface of the three dimensional feature. In this way, the selective formation of SiOC on a desired surface of the three dimensional feature can be controlled. For example, in some embodiments, due to the controlled formation of the SiOC film by the deposition process of step 330, the amount of SiOC deposited on a vertical surface of the three dimensional feature may be substantially less than the amount of SiOC deposited on a horizontal surface. Accordingly, in some embodiments the difference in deposited film thicknesses on two surfaces may allow for differential etching such that substantially all of the film may be removed from one surface while some film or material remains on a second, different surface.

In some embodiments due to the controlled formation of the SiOC film by the deposition process of step 330, the WER of SiOC deposited on a vertical surface of the three dimensional feature may be substantially higher than the WER of SiOC deposited on a horizontal surface. Therefore, an etch process may essentially completely remove deposited SiOC from a vertical surface of the three dimensional feature while deposited SiOC may remain on a horizontal surface of the three dimensional feature.

As discussed in more detail below, in some embodiments for depositing a SiOC film, one or more PEALD deposition cycles begin with provision of the silicon precursor, followed by the second reactant. In other embodiments deposition may begin with provision of the second reactant, followed by the silicon precursor. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first PEALD cycle, in subsequent PEALD cycles the reactive species phase will effectively follow the silicon phase. In some embodiments one or more different PEALD sub-cycles are provided in the process for forming a SiOC thin film.

Si Precursors

A number of different suitable Si precursors can be used in the presently disclosed PEALD processes. In some embodiments a suitable Si precursor may comprise a silane.

In some embodiments a suitable Si precursor may comprise two Si atoms connected by, or bonded to, at least one hydrocarbon group. In some embodiments a suitable Si precursor may comprise two Si atoms connected by, or bonded to, at least one alkyl group. In some embodiments a suitable Si precursor may comprise two Si atoms connected by, or bonded to, at least one alkoxy group. In some embodiments a suitable Si precursor may comprise two Si atoms connected by, or bonded to, at least one silyl group. In some embodiments a suitable Si precursor may comprise two Si atoms connected by, or bonded to, at least one silyl ether group. In some embodiments a suitable Si precursor may comprise at least one —SH group, wherein the —SH may be bonded to an alkyl chain or a silicon atom. In some embodiments a suitable Si precursor may comprise at least one mercapto group. In some embodiments a suitable Si precursor may comprise at least one —R—SH structure, wherein R may be a $C_1$-$C_5$ alkyl group. In some embodiments a suitable Si precursor may comprise at least one —SH group on an alkyl chain and one or more alkoxy groups bonded to a silicon atom.

In some embodiments a suitable Si precursor may comprise at least one Si atom attached or bonded to one or more alkoxy groups. In some embodiments a suitable Si precursor may comprise at least one Si atom attached or bonded to one or more alkyl groups. In some embodiments a suitable Si precursor may comprise at least one Si atom attached or bonded to at least an alkyl group and an alkoxy group.

In some embodiments, at least some Si precursors suitable for deposition of SiOC by PEALD processes may comprise bridged alkoxysilanes having the following general formula:

$$(R^{II}O)_3Si-R^I-Si(OR^{II})_3 \quad (1)$$

Wherein each of $R^I$ and $R^{II}$ may be independently selected alkyl groups. In some embodiments each of $R^I$ and $R^{II}$ are independently selected $C_1$-$C_5$ alkyl ligands, such as methyl, ethyl, n-propyl, isopropyl, tertbutyl, or pentyl.

According to some embodiments, some Si precursors may comprise bridged alkoxyalkylsilanes having the following general formula:

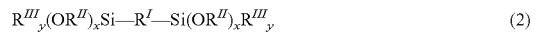

$$R^{III}_y(OR^{II})_xSi-R^I-Si(OR^{II})_xR^{III}_y \quad (2)$$

Wherein each of $R^I$, $R^{II}$, and $R^{III}$ may be independently selected alkyl groups, and x+y=3. In some embodiments each of $R^I$ and $R^{II}$ are independently selected $C_1$-$C_5$ alkyl ligands, such as methyl, ethyl, n-propyl, isopropyl, tertbutyl, or pentyl. In some embodiments $R^{III}$ may be an independently selected $C_1$-$C_8$ alkyl ligand.

According to some embodiments, some Si precursors may comprise cyclic alkoxysilanes having the following general formula:

$$(R^{II}O)_2Si-R^I_2-Si(OR^{II})_2 \quad (3)$$

Formula (3) may alternately be represented by the structural formula:

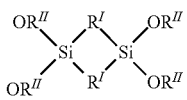

Wherein each of $R^I$ and $R^{II}$ may be independently selected alkyl groups. In some embodiments each of $R^I$ and $R^{II}$ are independently selected $C_1$-$C_5$ alkyl ligands, such as methyl, ethyl, n-propyl, isopropyl, tertbutyl, or pentyl.

According to some embodiments, some Si precursors may comprise cyclic alkoxyalkylsilanes having the following general formula:

$$R^{III}_y(OR^{II})_xSi-R^I_2-Si(OR^{II})_xR^{III}_y \quad (4)$$

Formula (4) may alternately be represented by the structural formula:

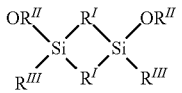

Wherein each of $R^I$, $R^{II}$, and $R^{III}$ may be independently selected alkyl groups, and x+y=2. In some embodiments each of $R^I$ and $R^{II}$ are independently selected $C_1$-$C_5$ alkyl ligands, such as methyl, ethyl, n-propyl, isopropyl, tertbutyl, or pentyl. In some embodiments $R^{III}$ may be an independently selected $C_1$-$C_8$ alkyl ligand.

According to some embodiments, some Si precursors may comprise linear alkoxysilanes having the following general formula:

$$(R^{II}O)_3Si-(O-Si-R^I_2)_n-O-Si(OR^{II})_3 \quad (5)$$

Wherein $R^I$ may be an independently selected alkyl group or hydrogen, $R^{II}$ may be an independently selected alkyl group, and n=1-4. In some embodiments each of $R^I$ and $R^{II}$ are independently selected $C_1$-$C_5$ alkyl ligands, such as methyl, ethyl, n-propyl, isopropyl, tertbutyl, or pentyl. In some embodiments $R^I$ may be hydrogen and $R^{II}$ may be an independently selected $C_1$-$C_5$ alkyl ligand.

According to some embodiments, some Si precursors may comprise linear alkoxysilanes having the following general formula:

$$R^{III}_y(OR^{II})_xSi-(-R^I-Si)_n-Si(OR^{II})_xR^{III}_y \quad (6)$$

Wherein each of $R^I$, $R^{II}$, and $R^{III}$ may be independently selected alkyl groups, x+y=2, and n can be greater than or equal to 1. In some embodiments $R^I$ and $R^{II}$ are independently selected $C_1$-$C_5$ alkyl ligands, such as methyl, ethyl, n-propyl, isopropyl, tertbutyl, or pentyl. In some embodiments $R^{III}$ may be an independently selected $C_1$-$C_8$ alkyl ligand.

According to some embodiments, some Si precursors may comprise alkoxysilanes having the following general formula:

$$Si(OR^I)_4 \quad (7)$$

Wherein $R^I$ may be an independently selected alkyl group. In some embodiments $R^I$ may be an independently selected $C_1$-$C_5$ alkyl ligand, such as methyl, ethyl, n-propyl, isopropyl, tertbutyl, or pentyl.

According to some embodiments, some Si precursors may comprise alkoxyalkylsilanes having the following general formula:

$$Si(OR^I)_{4-x}R^{II}_x \quad (8)$$

Wherein each of $R^I$ and $R^{II}$ may be independently selected alkyl groups, and x=1-3. In some embodiments $R^I$ may be an independently selected $C_1$-$C_5$ alkyl ligand, such as methyl, ethyl, n-propyl, isopropyl, tertbutyl, or pentyl. In some embodiments $R^{II}$ may be an independently selected $C_1$-$C_8$ alkyl ligand.

According to some embodiments, some Si precursors may comprise alkoxysilanes that do not comprise nitrogen and have the following general formula:

$$Si(OR^I)_{4-x}R^{II}_x \quad (9)$$

Wherein $R^I$ may be an independently selected alkyl group, $R^{II}$ may be any ligand comprising carbon, hydrogen, and/or oxygen that does not comprise nitrogen, and x=1-3. In some embodiments $R^I$ may be an independently selected $C_1$-$C_5$ alkyl ligand, such as methyl, ethyl, n-propyl, isopropyl, tertbutyl, or pentyl. In some embodiments $R^{II}$ may comprise, for example an alkenyl, alkynyl, phenyl, carbonyl, aldehyde, ester, ether, carboxyl, peroxy, hydroperoxy, thiol, acrylate, or methacrylate ligand.

According to some embodiments, some Si precursors may the following general formula:

$$Si(OR^I)_{4-x}R^{II}_x \quad (10)$$

Wherein x=0-3, $R^I$ may be an independently selected $C_1$-$C_7$ or $C_1$-$C_5$ alkyl ligand, and $R^{II}$ may be an independently selected ligand consisting of carbon, and/or hydrogen, and/or oxygen. For example, in some embodiments $R^{II}$ can be an alkoxyalkyl group. In some embodiments $R^{II}$ can be, for example, an alkenyl, alkynyl, phenyl, carbonyl, aldehyde, ester, ether, carboxyl, peroxy, or hydroperoxy group. In some embodiments, for example, $R^I$ is a methyl group, $R^{II}$ is a 3-methoxypropyl ligand, and x is 1.

According to some embodiments, some Si precursors may have the following general formula:

$$(R^IO)_{4-x}Si-(R^{II}-O-R^{III})_x \quad (11)$$

Wherein x=0-3, each of $R^I$ and $R^{II}$ may be an independently selected $C_1$-$C_7$ or $C_1$-$C_5$ alkyl ligand, and $R^{III}$ may be an independently selected ligand consisting of carbon, and/or hydrogen, and/or oxygen. For example, in some embodiments $R^{III}$ can be, for example, an alkenyl, alkynyl, phenyl, carbonyl, aldehyde, ester, ether, carboxyl, peroxy, or hydroperoxy group. In some embodiments, for example, $R^I$, $R^{II}$, and $R^{III}$ can each be a group independently selected from methyl, ethyl, i-propyl, n-propyl, n-butyl, i-butyl, and t-butyl.

According to some embodiments, some Si precursors may have the following general formula:

$$Si(R^I)_{4-x-y}R^{II}_xR^{III}_y \quad (12)$$

Wherein x+y=0-4, $R^I$ is an alkoxide ligand having from 1 to 5 carbon atoms, or a halide, $R^{II}$ is any ligand comprising sulfur, and $R^{III}$ consists of one of a sulfhydryl, sulfide, disulfide, sulfinyl, sulfonyl, sulfino, sulfo, thiocyanate, isothiocyanate, or carbonothioyl functionality. In some embodiments $R^I$, $R^{II}$, and $R^{III}$ may each be independently selected. In some embodiments $R^I$ may comprise a methoxy ligand, $R^{II}$ may comprise 3-mercaptopropyl, x=1, and y=0. That is, in some embodiments some an Si precursor may comprise $Si(OCH_3)_3C_3H_6SH$. In some embodiments a Si precursor may comprise mercaptomethylmethyldiethoxysilane, 3-mercaptopropylmethyldimethoxysilane and/or 3-mercaptopropyltriethoxysilane In some embodiments the silicon precursor does not comprise a halogen. In some embodiments the silicon precursor does not comprise nitrogen. In some embodiments the carbon chain may be unsaturated and contain double carbon-carbon bonds. In some other embodiments the carbon chain may contain other atoms than carbon and hydrogen. According to some embodiments suitable silicon precursors can include at least compounds having any of the general formulas (1) through (11). FIG. 2 illustrates exemplary molecular structures for suitable Si precursors according to formulas (1)-(11) described above. In some embodiments the silicon precursor can comprise bis(triethoxysilyl) ethane (BTESE). In some embodiments the silicon precursor can comprise 3-methoxypropyltrimethoxysilane (MPTMS or $Si(OCH_3)_3C_3H_6OCH_3$). In some embodiments the silicon precursor can comprise (3-mercaptopropyl)trimethoxysilane.

In some embodiments, at least some Si precursors suitable for deposition of SiOCN by PEALD processes have the following general formula:

$$Si(OR^I)_{4-x}(R^{II}NR^{III}R^{IV})_x \quad (13)$$

Wherein x=1-4, $R^I$ may be an independently selected alkyl group, $R^{II}$ may be an independently selected hydrocarbon group, and $R^{III}$ and $R^{IV}$ may be independently selected alkyl groups and/or hydrogens. In some embodiments $R^I$ and $R^{II}$ are $C_1$-$C_3$ alkyl ligands, such as methyl, ethyl, n-propyl, or isopropyl. In some embodiments $R^I$ may be a $C_1$-$C_4$ alkyl ligand, such as methyl, ethyl, n-propyl, isopropyl, or tertbutyl. In some embodiments $R^{II}$ is not a $C_3$ hydrocarbon. In some embodiments $R^{II}$ is a $C_1$-$C_2$ hydrocarbon or a $C_4$-$C_6$ hydrocarbon. In some embodiments $R^{II}$ may be an unsaturated hydrocarbon, such as a hydrocarbon containing one or more double bonds. In some embodiments $R^{II}$ may be an alkyl group where one of the hydrogens is removed. In some embodiments $R^{III}$ and $R^{IV}$ are hydrogen. In some embodiments $R^I$ is methyl, $R^{II}$ is n-propyl, $R^{III}$ is hydrogen, $R^{IV}$ is hydrogen, and x=1.

For example, an Si precursor may have the formula (written in a more detailed manner in order to show bonding): $(R^I\!-\!O\!-\!)_{4-x}Si(\!-\!R^{II}\!-\!NR^{III}R^{IV})_x$, wherein x=1-4, $R^I$ may be an independently selected alkyl group, $R^{II}$ may be an independently selected hydrocarbon, and $R^{III}$ and $R^{IV}$ may be independently selected alkyl groups and/or hydrogens.

According to some embodiments, some Si precursors may have the following general formula:

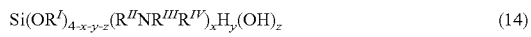

$$Si(OR^I)_{4-x-y-z}(R^{II}NR^{III}R^{IV})_xH_y(OH)_z \quad (14)$$

wherein x=1-4, y=0-3, and z=0-3, $R^I$ and $R^{II}$ may be an independently selected alkyl group, $R^{II}$ may be an independently selected hydrocarbon, and $R^{III}$ and $R^{IV}$ may be independently selected alkyl groups and/or hydrogens. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$L_nSi(OR^I)_{4-x-n}(R^{II}NR^{III}R^{IV})_x \quad (15)$$

wherein n=1-3, x=0-3, $R^I$ may be an independently selected alkyl group, $R^{II}$ may be an independently selected hydrocarbon, and $R^{III}$ and $R^{IV}$ may be independently selected alkyl groups and/or hydrogens, and L is an independently selected alkyl group or halogen. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

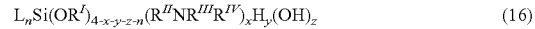

$$L_nSi(OR^I)_{4-x-y-z-n}(R^{II}NR^{III}R^{IV})_xH_y(OH)_z \quad (16)$$

wherein n=0-3 x=1-4, y=0-3, z=0-3, $R^I$ may be an independently selected alkyl group, $R^{II}$ may be an independently selected hydrocarbon, and $R^{III}$ and $R^{IV}$ may be independently selected alkyl groups and/or hydrogens, and L is an independently selected alkyl group or halogen. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$(R^IO)_{4-x}Si(R^{II}\!-\!NH_2)_x \quad (17)$$

wherein x=1-4, $R^I$ may be an independently selected alkyl group, and $R^{II}$ may be an independently selected hydrocarbon. In some embodiments $R^I$ and $R^{II}$ are $C_1$-$C_3$ alkyl ligands, such as methyl, ethyl, n-propyl, or isopropyl. In some embodiments $R^I$ is methyl, $R^{II}$ is n-propyl and x=1. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$(R^IO)_3Si\!-\!R^{II}\!-\!NH_2 \quad (18)$$

Wherein, $R^I$ may be an independently selected alkyl group, and $R^{II}$ may be an independently selected hydrocarbon. In some embodiments $R^I$ and $R^{II}$ are $C_1$-$C_3$ alkyl ligands, such as methyl, ethyl, n-propyl, or isopropyl. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$(R^IO)_{4-x}Si(\!-\![CH_2]_n\!-\!NH_2)_x \quad (19)$$

wherein x=1-4, n=1-5, and $R^I$ may be an independently selected alkyl group. In some embodiments $R^I$ is a $C_1$-$C_4$ alkyl ligand, such as methyl, ethyl, n-propyl, or isopropyl. In some embodiments $R^I$ is methyl, and x=1.

In some embodiments the silicon precursor does not comprise a halogen. In some embodiments the silicon precursor may comprise at least one aminoalkyl ligand. According to some embodiments a suitable silicon precursor may comprise at least one ligand which is bonded through carbon to silicon and contains at least one $NH_2$-group attached to a carbon chain, for example an aminoalkyl ligand. According to some embodiments a suitable silicon precursor may comprise at least one ligand which is bonded through carbon to silicon and contains an $NH_2$-group attached to a carbon chain, for example an aminoalkyl ligand, and may also comprise at least one ligand which is bonded to silicon through an oxygen atom and in which an alkyl group is bonded to oxygen, for example an alkoxide ligand. According to some embodiments a suitable silicon precursor may comprise at least one ligand which is bonded through carbon to silicon and contains at least one $NR^{III}R^{II}$-group, wherein $R^{III}$ and $R^{IV}$ may be independently selected alkyl groups and/or hydrogens, attached to a carbon chain, for example an aminoalkyl ligand. According to some embodiments a suitable silicon precursor may comprise at least one ligand which is bonded through carbon to silicon and in which ligand at least one nitrogen is bonded to carbon. Further the one ligand which is bonded through carbon to silicon and in which ligand at least one nitrogen is bonded to carbon may comprise hydrogen bonded to nitrogen. According to some embodiments, in addition to a ligand which is bonded to silicon through carbon, a suitable silicon precursor may comprise also an alkoxy ligand, such as methoxy, ethoxy, n-propoxy, i-propoxy or tertbutoxy ligand. According to some embodiments, including some of the formulas of the above, a suitable silicon precursor comprises a carbon chain which is bonded to silicon through carbon, and in which there is an amino group, such as alkylamino or —$NH_2$ group, attached to the carbon chain and the carbon chain is a C1-C6 hydrocarbon, C2-C6 hydrocarbon or C2-C4 hydrocarbon, linear, branched or cyclic, containing only carbon and hydrogen. In some embodiments the carbon chain may be unsaturated and contain double carbon-carbon bonds. In some other embodiments the carbon chain may contain other atoms than carbon and hydrogen.

According to some embodiments suitable silicon precursors can include at least compounds having any of the general formulas (13) through (19). In some embodiments halides/halogens can include F, Cl, Br, and I. In some embodiments the silicon precursor can comprise (3-aminopropyl)trimethoxysilane (APTMS).

In some embodiments more than one silicon precursor may contact the substrate surface at the same time during an ALD phase. In some embodiments the silicon precursor may comprise more than one of the silicon precursors described herein. In some embodiments a first silicon precursor is used in a first ALD cycle and a second, different ALD precursor is used in a later ALD cycle. In some embodiments multiple silicon precursors may be used during a single ALD phase, for example in order to optimize certain properties of the deposited SiOCN film. In some embodiments only one silicon precursor may contact the substrate during the deposition. In some embodiments there may only be one silicon precursor and one second reactant or composition of second reactants in the deposition process. In some embodiments there is no metal precursor in the deposition process. In some embodiments the silicon precursor is not used as a silylating agent. In some embodiments the deposition temperature and/or the duration of the silicon precursor contacting step are selected such that the silicon precursor does not decompose. In some embodiments the silicon precursor may decompose during the silicon precursor contacting step. In some embodiments the silicon precursor does not comprise a halogen, such as chlorine or fluorine.

In some embodiments more than one silicon precursor may contact the substrate surface at the same time during an ALD phase. In some embodiments the silicon precursor may comprise more than one of the silicon precursors described herein. In some embodiments a first silicon precursor is used in a first ALD cycle and a second, different ALD precursor is used in a later ALD cycle. In some embodiments multiple silicon precursors may be used during a single ALD phase, for example in order to optimize certain properties of the deposited SiOC film. In some embodiments only one silicon precursor may contact the substrate during the deposition. In some embodiments there may only be one silicon precursor and one second reactant or composition of second reactants in the deposition process. In some embodiments there is no metal precursor in the deposition process. In some embodiments the silicon precursor is not used as a silylating agent. In some embodiments the deposition temperature and/or the duration of the silicon precursor contacting step are selected such that the silicon precursor does not decompose. In some embodiments the silicon precursor may decompose during the silicon precursor contacting step. In some embodiments the silicon precursor does not comprise a halogen, such as chlorine or fluorine.

Second Reactants

As discussed above, the metal or silicon reactant reacts with a reactant comprising reactive species, referred to for convenience here as the second reactant. The second reactant may comprise reactive species from a plasma generated in a gas that does not comprise oxygen. In some embodiments the second reactant does not comprise reactive species of oxygen. For example, the second reactant may comprise reactive species from a plasma generated in a gas comprising hydrogen and not oxygen. In some embodiments the second reactant may comprise reactive species of hydrogen. In some embodiments a reactive species includes, but is not limited to, radicals and/or excited atoms or species. Such reactive species may be generated by, for example, by plasma discharge, hot-wire, or other suitable methods. In some embodiments the reactive species may be generated remotely from the reaction chamber, for example up-stream from the reaction chamber ("remote plasma"). In some embodiments the reactive species may be generated in the reaction chamber, in the direct vicinity of the substrate, or directly above the substrate ("direct plasma").

Suitable second reactants in a PEALD process may include hydrogen reactive species, that is, plasma, radicals of hydrogen, or atomic hydrogen in one form or another. In some embodiments a second reactant may comprise a reactive species formed at least in part from $H_2$. For example, the second reactant may comprise reactive species from a plasma generated in a gas comprising $H_2$, but not oxygen. In some embodiments, a plasma may also contain noble gases, such as He, Ne, Ar, Kr and Xe, or Ar or He, in plasma form, as radicals, or in atomic form.

In some embodiments the second reactant may comprise reactive species formed from $H_2$. In some embodiments the second reactant may be generated from a gas containing more than about 25 atomic % (at %) hydrogen, more than about 50 at % hydrogen, more than about 75 at % hydrogen, more than about 85 at % hydrogen, more than about 90 at % hydrogen, more than about 95 at % hydrogen, more than about 96 at %, 97 at %, 98 at %, or more than about 99 at % hydrogen.

In some embodiments the gas used to generate reactive species, such as plasma, may consist essentially of hydrogen. In some embodiments the gas does not include any oxygen. Thus, in some embodiments the second reactant may consist essentially of hydrogen plasma, radicals of hydrogen, or atomic hydrogen. In some embodiments the second reactant may comprise more than about 25 at % hydrogen, more than about 50 at % hydrogen, 75 at %, more than about 85 at %, more than about 90 at %, more than about 95 at %, more than about 96 at %, 97 at %, 98 at %, or more than about 99 at % hydrogen plasma, radicals of hydrogen, or atomic hydrogen. In some embodiments the second reactant may be formed, at least in part, from $H_2$ and one or more other gases, where the $H_2$ and other gas or gases are provided at a flow ratio ($H_2$/other gas or gases), from about 1:1000 to about 1000:1 or greater. In some embodiments the flow ratio ($H_2$/other gas or gases) may be greater than about 1:1000, greater than about 1:100, greater than about 1:50, greater than about 1:20, greater than about 1:10, greater than about 1:6, greater than about 1:3, greater than about 1:1, greater than about 3:1, greater than about 6:1, greater than about 10:1, greater than about 20:1, 50:1, 100:1, or 1000:1 or greater.

In some embodiments, the second reactant does not comprise any species generated from oxygen. Thus, in some embodiments reactive species are not generated from a gas containing oxygen. In some embodiments a second reactant comprising reactive species is generated from a gas that does not contain oxygen. For example in some embodiments a second reactant may comprise a plasma generated from a gas that does not contain oxygen. In some other embodiments the second reactant may be generated from a gas containing less than about 50 atomic % (at %) oxygen, less than about 30 at % oxygen, less than about 10 at % oxygen, less than about 5 at % oxygen, less than about 1 at % oxygen, less than about 0.1 at % oxygen, less than about 0.01 at % oxygen, or less than about 0.001 at % oxygen. In some embodiments a second reactant does not comprise $O_2$, $H_2O$ or $O_3$.

In some embodiments, the second reactant may be a hydrogen plasma that is free or substantially free of oxygen-containing species (e.g., oxygen ions, radicals, atomic oxygen). For example, oxygen-containing gas is not used to generate the hydrogen plasma. In some embodiments, oxygen-containing gas (e.g., $O_2$ gas) is not flowed into the reaction chamber during the hydrogen plasma step.

In some embodiments, the second reactant does not comprise any species generated from nitrogen. Thus, in some embodiments reactive species are not generated from a gas containing nitrogen. In some embodiments a second reactant comprising reactive species is generated from a gas that does not contain nitrogen. For example in some embodiments a second reactant may comprise a plasma generated from a gas that does not contain nitrogen. In some embodiments the second reactant may be generated from a gas containing less than about 25 atomic % (at %) nitrogen, less than about 20 at % nitrogen, less than about 15 at % nitrogen, less than about 10 at % nitrogen, less than about 5 at % nitrogen, less than about 1 at % nitrogen, less than about 0.1 at % nitrogen, less than about 0.01 at % nitrogen, or less than about 0.001 at % nitrogen. In some embodiments a second reactant does not comprise $N_2$, $NH_3$ or $N_2H_4$.

In some embodiments, a hydrogen plasma may be free or substantially free of nitrogen-containing species (e.g., nitrogen ions, radicals, atomic nitrogen). For example, nitrogen-containing gas is not used to generate the hydrogen plasma. In some embodiments, nitrogen-containing gas (e.g., $N_2$ gas) is not flowed into the reaction chamber during the hydrogen plasma step.

However, in some other embodiments, nitrogen reactive species in the form of plasma, radicals of nitrogen, or atomic nitrogen in one form or another are also provided. Thus, in some embodiments the second reactant may comprise reactive species formed from compounds having both N and H, such as $NH_3$ and $N_2H_4$, a mixture of $N_2/H_2$ or other precursors having an N—H bond. In some embodiments the second reactant may be formed, at least in part, from $N_2$. In some embodiments the second reactant may be formed, at least in part, from $H_2$ and $N_2$, where the $H_2$ and $N_2$ are provided at a flow ratio ($H_2/N_2$), from about 100:1 to about 1:100, from about 20:1 to about 1:20, from about 10:1 to about 1:10, from about 5:1 to about 1:5 and/or from about 2:1 to about 4:1, and in some cases 1:1. For example, a hydrogen-containing plasma for depositing SiOC can be generated using both $N_2$ and $H_2$ at one or more ratios described herein.

In some embodiments the gas used to generated reactive species, such as plasma, may consist essentially of argon or another noble gas. In some embodiments, a plasma power used for generating a hydrogen-containing plasma can be about 5 Watts (W) to about 5000 W, 10 W to about 2,000 W, about 50 W to about 1000 W, about 100 W to about 1000 W or about 100 W to about 500 W. In some embodiments, a plasma power used for generating a hydrogen-containing plasma can be about 100 W to about 300 W. In some embodiments, hydrogen containing plasma may also comprise argon or another noble gas.

SiOC Film Characteristics

SiOC thin films deposited according to some of the embodiments discussed herein may achieve impurity levels or concentrations below about 3 at %, below about 1 at %, below about 0.5 at %, or below about 0.1 at %. In some thin films, the total impurity level excluding hydrogen may be below about 5 at %, below about 2 at %, below about 1 at %, or below about 0.2 at %. And in some thin films, hydrogen levels may be below about 30 at %, below about 20 at %, below about 15 at %, or below about 10 at %. As used herein, an impurity may be considered any element other than Si, 0, and/or C. In some embodiments the thin films do not comprise argon.

In some embodiments, the deposited SiOC films do not comprise an appreciable amount of hydrogen. However, in some embodiments a SiOC film comprising hydrogen is deposited. In some embodiments, the deposited SiOC films comprises less than about 30 at %, less than about 20 at %, less than about 15 at %, less than about 10 at % or less than about 5 at % of hydrogen. In some embodiments the thin films do not comprise argon.

As used herein, the term step coverage refers to the average thickness of a film deposited on a vertical surface of a three dimensional feature divided by the average thickness of the film deposited on a horizontal surface of a three dimensional feature. As described herein above, the step coverage of a formed or deposited SiOC film may be controlled by selecting an appropriate plasma power to generate the second reactant in a PEALD process according to some embodiments. In some embodiments the plasma power may be selected from a given range, for example form 50 W to 1000 W to achieve a SiOC film with a desired step coverage. In some embodiments a higher plasma power may result in a SiOC film having a high step coverage for three dimensional features having an aspect ratio of from about 1 to about 3

As used herein the term wet etch rate ratio (WERR) refers to the ratio of the wet etch rate of a film deposited on a vertical surface of a three dimensional feature to the wet etch rate of the film deposited on a horizontal surface of the feature. As described herein above, the WERR of a formed or deposited SiOC film may be controlled by selecting an appropriate plasma power to generate the second reactant in a PEALD process according to some embodiments. In some embodiments the plasma power may be selected from a given range, for example form 50 W to 1000 W to achieve a SiOC film with a desired WERR. In some embodiments a higher plasma power may result in a SiOC film having a lower WERR for a three dimensional features having an aspect ratio of from about 1 to about 3.

In addition, as discussed above the WER and WERR can be modified with a post deposition plasma treatment. In some embodiments a SiOC film deposited on a three-dimensional structure is treated with a nitrogen or oxygen plasma to improve the WER on the sidewall.

In some embodiments where the deposited SiOC film is subjected to an etch, such as a wet etch, the SiOC thin film may be present on vertical surfaces of the substrate and substantially no SiOC may be present on horizontal surfaces of the substrate. In some other embodiments where the deposited SiOC film is subjected to an etch, such as a wet etch, the SiOC thin film may be present on horizontal surfaces of the substrate and substantially no SiOC may be present on vertical surfaces of the substrate.

According to some embodiments, the SiOC thin films may exhibit step coverage and pattern loading effects of greater than about 50%, greater than about 80%, greater than about 90%, or greater than about 95%. In some cases step coverage and pattern loading effects can be greater than about 98% and in some case about 100% (within the accuracy of the measurement tool or method). In some embodiments step coverage and pattern loading effects can be greater than about 100%, greater than about 110%, greater than about 120%, greater than about 130%, or greater than about 140%. In some embodiments step coverage and pattern loading effects can be greater than about 200%, 300%, 500%, 700%, 1000% or greater.

As discussed above, in some embodiments the step coverage can be increased by a post deposition plasma treatment in which a SiOC film on a three-dimensional structure is contacted with a hydrogen plasma. The post deposition plasma treatment may, for example, increase the step coverage from less than 100% to greater than 100% and even greater than 150% in some instances.

As used herein, "pattern loading effect" is used in accordance with its ordinary meaning in this field. While pattern loading effects may be seen with respect to impurity content, density, electrical properties and etch rate, unless indicated otherwise the term pattern loading effect when used herein refers to the variation in film thickness in an area of the substrate where structures are present. Thus, the pattern loading effect can be given as the film thickness in the sidewall or bottom of a feature inside a three dimensional structure relative to the film thickness on the sidewall or bottom of the three dimensional structure/feature facing the open field. As used herein, a 100% pattern loading effect (or a ratio of 1) would represent about a completely uniform film property throughout the substrate regardless of features i.e. in other words there is no pattern loading effect (variance in a particular film property, such as thickness, in features vs. open field).

In some embodiments the growth rate of the film on a vertical and/or horizontal surface of a substrate is from about 0.01 Å/cycle to about 5 Å/cycle, from about 0.05 Å/cycle to about 2 Å/cycle. In some embodiments the growth rate of the film is more than about 0.05 Å/cycle, more than about 0.1 Å/cycle, more than about 0.15 Å/cycle, more than about 0.3 Å/cycle, more than about 0.3 Å/cycle, more than about 0.4 Å/cycle. In some embodiments the growth rate of the film on one surface, such as a vertical surface of a three dimensional feature may be different than the growth rate of the film on a different surface, such as a horizontal surface.

In some embodiments, SiOC films are deposited on a vertical and/or horizontal surface to a thickness of from about 3 nm to about 50 nm, from about 5 nm to about 30 nm, from about 5 nm to about 20 nm. In some embodiments the thicknesses of portions of the deposited SiOC film may be controlled by selecting an appropriate plasma power as described herein above, and/or by post deposition plasma treatment of the SiOC film. For example, in some embodiments the thickness of the SiOC film deposited on a horizontal surface of a substrate may be controlled to achieve a desired value while the thickness of the SiOC film deposited on a vertical surface of the substrate may be controlled to achieve a second, different desired value. These thicknesses can be achieved in feature sizes (width) below about 100 nm, about 50 nm, below about 30 nm, below about 20 nm, and in some cases below about 15 nm. According to some embodiments, a SiOC film is deposited on a three dimensional structure and the thickness at a sidewall may be slightly even more than 10 nm. In some embodiments SiOC films of greater than 50 nm can be deposited. In some embodiments SiOC films of greater than 100 nm can be deposited. In some embodiments, SiOC films are deposited to a thickness of more than about 1 nm, more than about 2 nm, more than about 3 nm, more than about 5 nm, more than about 10 nm.

In some embodiments a post deposition treatment of a SiOC film with hydrogen plasma as described herein can reduce the thickness on the top surface of a trench while increasing the thickness at the sidewalls and bottom of the trench.

According to some embodiments SiOC films with various wet etch rates (WER) may be deposited on horizontal and/or vertical surfaces of a substrate by a controlled deposition process as described herein. In some embodiments the WER of different portions of the deposited SiOC film may be controlled to be different by selecting an appropriate plasma power as described herein above. For example, in some embodiments the WER of the SiOC film deposited on a horizontal surface of a substrate may be controlled to achieve a desired value while the WER of the SiOC film deposited on a vertical surface of the substrate may be controlled to achieve a second, different desired value. When using a blanket etch in 0.5 wt % dHF (nm/min), a portion of an SiOC film may have WER values of less than about 5, less than about 4, less than about 2, or less than about 1. In some embodiments SiOC films may have WER values significantly less than 1. In some embodiments SiOC films may have WER values less than about 0.3, less than about 0.2, or less than about 0.1. In some embodiments SiOC films may have WER values less than about 0.05, less than about 0.025, or less than about 0.02. In some embodiments the deposited film may have a WER of from about 0.1 to about 15 on a vertical surface of a three dimensional feature and a WER that is about 10%, 25%, 50%, 100%, 250%, 500%, or 1000% greater on a horizontal surface of a three dimensional feature. In some embodiments the deposited film may have a WER of from about 0.1 to about 15 on a vertical surface of a three dimensional feature and a WER that is about 10%, 25%, 50%, or 100% smaller on a horizontal surface of a three dimensional feature.

The blanket WER in 0.5 wt % dHF (nm/min) relative to the WER of thermal oxide may be less than about 3, less than about 2, less than about 1, or less than about 0.5 for. In some embodiments the blanket WER in 0.5 wt % dHF relative to the WER of TOX may be less than about 0.4, 0.3, 0.2, or 0.1.

In some embodiments wherein a PEALD process is carried out at temperatures less than about 100° C., the blanket WER in 0.5 wt % dHF (nm/min) relative to the WER of thermal oxide may be less than about 10, less than about 5, less than about 3, and less than about 2, or less than about 1.

In some embodiments the etch rate of portions of the film can be controlled, as described herein above, by selecting an appropriate plasma power based on the aspect ratio of a three dimensional feature on which an SiOC film is to be deposited. Therefore, in some embodiments, the ratio (WERR) of the etch rate, such as a WER, of a SiOC film deposited on a vertical surface, such as a sidewall of a three dimensional feature, to the etch rate of a SiOC film deposited on a horizontal surface, such as a top surface of a three dimensional feature may be controlled by selecting an appropriate plasma power as described herein. In some embodiments the plasma power may be selected to achieve a ratio of the etch rate of the SiOC film deposited on a vertical surface of the substrate to the etch rate of the SiOC film deposited on a horizontal surface of the substrate in 0.5 wt % dHF of from about 0.1 to about 20, from about 0.2 to about 15, from about 0.5 to about 10, from about 1 to about 2, from about 2 to about 5, from about 5 to about 10, from about 10 to about 20, or in some cases greater than or equal to about 20.

And in some embodiments, a ratio (WERR) of a sidewall etch rate, for example a WER of a SiOC film deposited on a substantially vertical three dimensional feature, such as a fin or trench relative to the etch rate of the SiOC film deposited on a substantially horizontal surface, such as the top surface of a three dimensional feature, such as fin or trench, in 0.5 wt % dHF may be from about 1 to about 2, from about 2 to about 5, from about 5 to about 10, from about 10 to about 20, or in some cases greater than or equal to about 20. In some embodiments a ratio (WERR) of the WER of a SiOC film deposited on a vertical surface of a three dimensional feature to the WER of a SiOC film deposited on the top surface of a three dimensional feature may be equal to or greater than about 2, equal to or greater than about 5, equal to or greater than about 10, equal to or greater than about 15, or equal to or greater than about 20.

In some embodiments a ratio (WERR) of the WER of a SiOC film deposited on or in a substantially vertical surface of a three dimensional feature, for example a sidewall surface, to the WER of a SiOC film deposited on or in a substantially horizontal surface of a three dimensional feature, for example a top surface, may be from about 1 to about 0.5, from about 0.5 to about 0.2, from about 0.2 to about 0.1, from about 0.1 to about 0.05, or in some cases less than about 0.05. In some embodiments a ratio (WERR) of the WER of a SiOC film deposited on a substantially vertical surface of a three dimensional feature to the WER of a SiOC film deposited on a substantially horizontal surface of a three dimensional feature may be equal to or less than about 0.5, equal to or less than about 0.2, equal to or less than about 0.1, or equal to or less than about 0.05.

In some embodiments a ratio of the WER of a SiOC film deposited on or in a substantially vertical surface of a three dimensional feature, for example a sidewall surface, to a WER of TOX may be between about 5 to about 10, between about 2 to about 5, between about 1 to about 2, between about 0.5 to about 1, or between about 0.1 to about 0.5. In some embodiments a ratio of the WER of a SiOC film deposited on or in a substantially vertical surface of a three dimensional feature, for example a sidewall surface to a WER of TOX may be greater than or equal to about 0.1, greater than or equal to about 0.5, greater than or equal to about 1, greater than or equal to about 2, greater than or equal to about 5, or greater than or equal to about 10.

In some embodiments, SiOC formed according to one or more processes described herein can advantageously demonstrate a ratio (WERR) of a WER of a substantially vertical region to a WER of a substantially horizontal region of about 1, for example in 0.5 wt % dHF. For example, a ratio (WERR) of a wet etch rate of a SiOC thin film formed over substantially vertical surfaces (e.g., sidewall surfaces) to a wet etch rate of the SiOC thin film formed over substantially horizontal surfaces (e.g., top surfaces) of three dimensional structures on a substrate surface can be the same or substantially the same. In some embodiments, the ratio can be about 4 to about 0.5, about 2 to about 0.75, about 1.25 to about 0.8, or about 1.1 to about 0.9. These ratios can be achieved in features with aspect ratios of about 1.2 or more, about 1.5 or more, about 1.8 or more, about 2 or more, about 3 or more, about 5 or more or even about 8 or more.

In some embodiments, for example where a three dimensional feature, or a portion thereof, is disposed near or adjacent to a substantially flat or open portion of the substrate, the aspect ratio may be considered as the ratio of the vertical, or side portion of the three dimensional feature or portion to the horizontal, or top portion of the three dimensional feature or portion and may not take into account the dimensions of the open portion of the substrate. That is, in some embodiments the aspect ratio of a three dimensional feature, or a portion of a three dimensional feature may be considered the ratio of the height or depth of the feature or portion to the width of the feature or portion without taking into account the dimensions of any adjacent open portions of the substrate.

In some embodiments, SiOC formed according to one or more processes described herein can advantageously demonstrate a horizontal region to vertical region WERR of about 1, for example in 0.5 wt % dHF. For example, a ratio of a wet etch rate of SiOC thin film formed over horizontal surfaces (e.g., top surfaces) to a wet etch rate of the SiOC thin film formed over vertical surfaces (e.g., sidewall surfaces) of three dimensional structures on a substrate surface can be the same or substantially the same. In some embodiments, the ratio can be about 0.25 to about 2, about 0.5 to about 1.5, about 0.75 to about 1.25, or about 0.9 to about 1.1. These ratios can be achieved in features with aspect ratios of about 1.2 or more, about 1.5 or more, about 1.8 or more, about 2 or more, about 3 or more, about 5 or more or even about 8 or more.

In some embodiments, the amount of etching of SiOC films according to the present disclosure may be about 1, 2, 5, 10 or more times less than an amount of etching observed for thermal $SiO_2$ (TOX) in a 0.5 wt % HF-dip process (for example in a process in which about 2 to about 3 nm TOX is removed, 1, 2, 5, 10 or more times less SiOC is removed when deposited according to the methods disclosed herein).

In some embodiments less than about 2 nm of SiOC film may be removed in a 0.5 wt % HF-dip process with an etching time of 5 minutes. In some embodiments less than about 2 nm of SiOC film may be removed in a 0.5 wt % HF-dip process with an etching time of 60 minutes.

In some embodiments, the amount of etching of SiOC films according to the present disclosure may be about 1, 2, 5, 10 or more times less than an amount of etching observed for thermal $SiO_2$ (TOX) in a 0.5 wt % HF-dip process (for example in a process in which about 2 to about 3 nm TOX is removed, 1, 2, 5, 10 or more times less SiOC is removed when deposited according to the methods disclosed herein).

In some embodiments less than about 2 nm of SiOC film may be removed in a 0.5 wt % HF-dip process with an etching time of 5 minutes. In some embodiments less than about 2 nm of SiOC film may be removed in a 0.5 wt % HF-dip process with an etching time of 60 minutes.

All atomic percentage (i.e., at %) values provided herein exclude hydrogen for simplicity and because hydrogen is difficult to accurately analyze quantitatively, unless otherwise indicated. However, in some embodiments, if it is possible to analyze the hydrogen with reasonable accuracy, the hydrogen content of the films is less than about 20 at %, less than about 10 at % or less than about 5 at %. In some embodiments the deposited SiOC thin film may contain up to about 70% oxygen on an atomic basis (at %). In some embodiments a SiOC film may comprise oxygen from about 10% to about 70%, from about 15% to about 50%, or from about 20% to about 40% on an atomic basis. In some embodiments a SiOC film may comprise at least about 20%, about 40% or about 50% oxygen on an atomic basis.

In some embodiments the deposited SiOC thin film may contain up to about 40% carbon on an atomic basis (at %). In some embodiments a SiOC film may comprise carbon from about 0.1% to about 40%, from about 0.5% to about 40%, from about 1% to about 30%, or from about 5% to about 20% on an atomic basis. In some embodiments a SiOC film may comprise at least about 1%, about 10% or about 20% carbon on an atomic basis.

In some embodiments the deposited SiOC thin film may contain up to about 50% silicon on an atomic basis (at %). In some embodiments a SiOC film may comprise silicon from about 10% to about 50%, from about 15% to about 40%, or from about 20% to about 35% on an atomic basis. In some embodiments a SiOC film may comprise at least about 15%, about 20%, about 25% or about 30% silicon on an atomic basis.

In some embodiments the deposited SiOC thin film may contain up to about 40% sulfur on an atomic basis (at %). In some embodiments a SiOC film may comprise sulfur from about 0.01% to about 40%, from about 0.1% to about 40%, from about 0.5% to about 30%, or from about 1% to about 20% on an atomic basis. In some embodiments a SiOC film may comprise at least about 1%, about 10% or about 20% sulfur on an atomic basis. In some embodiments, the deposited SiOC films do not comprise an appreciable amount of nitrogen. However, in some embodiments a SiOC film comprising nitrogen is deposited. In some embodiments, the deposited SiOC films comprises less than about 30 at %, less than about 20 at %, less than about 15 at %, less than about 10 at %, less than about 5 at % of nitrogen, less than about 1 at % nitrogen, or less than about 0.1 at % nitrogen. In some embodiments the SiOC thin films do not comprise nitrogen.

As discussed above, in some embodiments a SiOC film may comprise Si—C bonds and/or Si—O bonds. In some embodiments a SiOC film may additionally comprise Si—N bonds. In some embodiments a SiOC film may additionally comprise Si—S bonds. In some embodiments a SiOC film may comprise Si—C bonds and Si—O bonds and may not comprise Si—N bonds. In some embodiments a SiOC film may comprise Si—N bonds and Si—O bonds and may not comprise Si—C bonds. In some embodiments a SiOC film may comprise Si—N bonds and Si—C bonds and may not comprise Si—O bonds. In some embodiments a SiOC film may comprise Si—S bonds, Si—C bonds, and Si—O bonds and may not comprise Si—N bonds. In some embodiments a SiOC film may comprise Si—S bonds and Si—C bonds, and may not comprise Si—O bonds. In some embodiments a SiOC film may comprise Si—S bonds, and Si—O bonds and may not comprise Si—C bonds. In some embodiments the SiOC films may comprise more Si—O bonds than Si—C bonds, for example a ratio of Si—O bonds to Si—C bonds may be from about 1:1 to about 10:1. In some embodiments a deposited SiOC film may comprise one or more of SiN, SiO, SiC, SiCN, SiON, SiOSC, SiSC, SiOS, and/or SiOC.

In some embodiments a SiOC film is not a low-k film, for example a SiOC film is not a porous film. In some embodiments a SiOC is a continuous film. In some embodiments a SiOC film has a k-value that is less than about 10. In some embodiments a SiOC film has a k-value that is less than about 7. In some embodiments a SiOC film has a k-values from about 2 to about 10. In some embodiments a SiOC film has a k-value that is less than about 5.0, less than about 4.5, less than about 4.3, less than about 4.1. In some embodiments a SiOC film has a k-value that from about 3.0 to about 7, from about 3.0 to about 5.5, from about 3.0 to about 5.0, from about 3.5 to about 4.8, from about 3.5 to about 4.7. In some embodiments a SiOC film has a k-value that is more than the k-value of any low-k film. In some embodiments a SiOC film has a k-value that is more than pure $SiO_2$.

In some embodiments SiOC films deposited according to the present disclosure do not comprise a laminate or nanolaminate structure.

In some embodiments a SiOC film deposited according to the present disclosure is not a self-assembled monolayer (SAM). In some embodiments a SiOC film deposited according to the present disclosure does not consist of separate, individual molecules which are not bonded to each other. In some embodiments a SiOC film deposited according to the present disclosure comprises a material which is substantially bonded or linked together. In some embodiments a SiOC film deposited according to the present disclosure is not a functional layer, is not amino-functionalized, and/or is not used as a functional surface. In some embodiments a SiOC film deposited according to the present disclosure is not terminated with —$NH_2$ groups. In some embodiments a SiOC film deposited according to the present disclosure does not contain a substantial amount of —$NH_2$ groups.

Deposition of Metal Oxides

In some embodiments thin films comprising material other than SiOC may be deposited by the processes described herein. In some embodiments a metal oxide is deposited. In some embodiments a metal oxide is selectively deposited on a dielectric surface relative to a metal or metallic surface. In some embodiments the formation of metal oxide films may be controlled as described herein by PEALD processes that do not include oxygen plasma or excited oxygen species. In these embodiments a different metal precursor is used in place of the silicon precursor in the processes as described herein. In some embodiments the metal oxide films may be deposited by PEALD processes that do not include oxygen plasma or excited oxygen species, essentially as described for SiOC and SiOCN above but using different first precursors. In some embodiments the formation of titanium oxide, niobium oxide, tantalum oxide, tungsten oxide, TiO(CN) and/or aluminum oxide thin films may be controlled by PEALD processes as described herein. In some embodiments titanium oxide, TiO(CN), niobium oxide, tantalum oxide, tungsten oxide, and/or aluminum oxide thin films may be deposited by PEALD processes as described herein.

In some embodiments a metal oxide film may comprise more than one metal. The different metals may be provided by the same precursor, or by two or more different metal precursors that are be provided in one or more deposition cycles. In some embodiments two or more metal precursors comprising different metals are provided alternately and sequentially in a deposition cycle along with a third reactant comprising reactive species.

In some embodiments a metal oxide film may comprise two different metal oxides. For example, in some embodiments a first deposition cycle for forming a first metal oxide and a second deposition cycle for forming a second metal oxide may be conducted at a selected ratio in order to produce a mixed metal oxide film of the desired composition and thickness.

In some embodiments oxide films comprising both silicon and metal may be deposited as described herein by PEALD processes that do not include oxygen plasma or excited oxygen species. In some embodiments an oxide is deposited that comprises both metal and silicon. In some embodiments an oxide film may comprise a metal silicate. In some embodiments a PEALD deposition cycle may utilize a metal reactant, a silicon reactant and a third reactant comprising excited species to form an oxide comprising silicon and metal.

In some embodiments a deposition process may comprise a single deposition cycle comprising alternately and sequentially contacting a substrate with a first metal precursor, a second silicon precursor and a third plasma reactant. The metal and silicon precursors and the third reactant can be as described herein for deposition of metal oxides and silicon oxides. The deposition cycle may begin with provision of the metal reactant, provision of the silicon reactant or provision of the third reactant. As described herein, provision of each of the reactants may be separated by a purge step in which excess reactants and reaction byproducts are removed from the reaction space. In some embodiments the ratio of the metal precursor and the silicon precursor is selected and/or adjusted to provide a mixed metal oxide film with the desired composition.

In some embodiments an oxide film may comprise a mixture of a metal oxide and silicon oxide. For example, a film may comprise silicon oxide and one or more of a transition metal oxide, such as $ZrO_2$, $HfO_2$, or $TiO_2$, $Al_2O_3$, lanthanide (+Sc+Y) oxides, $Ta_2O_5$, or $Nb_2O_5$. In some embodiments a metal precursor is used, along with a silicon precursor in the processes as described herein. In some embodiments a deposition cycle for depositing a metal oxide and a deposition cycle for depositing a silicon oxide may be provided at a selected ratio in a deposition process in order to deposit a film having a desired composition.

In some embodiments the metal precursors used to deposit oxide films comprising metal by the processes described herein may comprise volatile compounds comprising the desired metal and oxygen. A list of metal precursors to be used to deposit metal oxide films by PEALD processes that do not include oxygen plasma or excited species of oxygen as described herein, and that may be used for selective metal oxide deposition, is provided in Table 1.

TABLE 1

PRECURSORS FOR THE DEPOSITION OF METAL OXIDE THIN FILMS

| Precursor compound | Film material |
| --- | --- |
| Aluminum(III)ethoxide | $Al_2O_3$ |
| Niobium(V)ethoxide | $Nb_2O_5$ |
| Tantalum(V)ethoxide | $Ta_2O_5$ |
| Titanium (IV) ethoxide | $TiO_2$ |
| Titanium (IV) methoxide | $TiO_2$ |

TABLE 1-continued

PRECURSORS FOR THE DEPOSITION OF METAL OXIDE THIN FILMS

| Precursor compound | Film material |
| --- | --- |
| Titanium (IV) isopropoxide (TTIP) | TiO(CN) |
| Pentamethylcyclopentadienyltitanium trimethoxide | $TiO_2$ |
| W(thd)4 | $WO_x$ |

In some embodiments the metal precursor used to deposit metal oxide films by the processes described herein may comprise volatile compounds of formula:

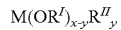
$M(OR^I)_{x-y}R^{II}_y$

Wherein $R^I$ may be an independently selected hydrocarbon group and wherein M is a metal or Ge, for example a transition metal or Ge, Al, Ga, In, Sn, Pb, Bi, Sb, wherein x+y is equal to the oxidation state, or number of bonds of the metal atom, for example 3, 4, 5, or 6. In some embodiments where there is double or triple bonding of the metal atom, each double or triple bond may be counted two or three times when determining the value of x+y. In some embodiments $R^{II}$ may be any ligand comprising carbon, hydrogen, nitrogen, halogen and/or oxygen. In some embodiments M is a transition metal selected from the group: Ti, V, Cr, Mn, Nb, Mo, Ru, Rh, Pd, Ag, Au, Hf, Ta, W, Re, Os, Ir and Pt. In some embodiments M is a transition metal selected from the group: Cu, Fe, Co, Ni. In some embodiments M is a transition metal selected from the group: Au, Pt, Ir, Pd, Os, Ag, Re, Rh, and Ru. In some embodiments $R^I$ may be an independently selected $C_1$-$C_5$ alkyl ligand, such as a methyl, ethyl, n-propyl, isopropyl, tertbutyl, or pentyl ligand. In some embodiments $R^I$ can comprise oxygen or nitrogen or another heteroatom. In some embodiments $R^{II}$ may comprise, for example an alkenyl, alkynyl, cyclic hydrocarbons, amine, alkylamine, phenyl, carbonyl, aldehyde, ester, ether, carboxyl, peroxy, hydroperoxy, thiol, acrylate, or methacrylate ligand. In some embodiments at least one of the ligands of the above formula above comprises oxygen. In some embodiments M can be also be a group 1 or 2 metal element.

In some embodiments a metal precursor used to deposit metal oxide films by the processes described herein may comprise volatile compounds of formula:

$M(OR^I)_x$,

Wherein $R^I$ may be an independently selected alkyl group and wherein M is metal or Ge, for example transition metal or Ge, Al, Ga, In, Sn, Pb, Bi, Sb and wherein x is equal to the oxidation state, or number of bonds of the metal atom, for example 3, 4, 5, or 6. In some embodiments where there is double or triple bonding of the metal atom, each double or triple bond may be counted two or three times when determining the value of x. In some embodiments $R^I$ may be an independently selected C1-C5 alkyl ligand, such as methyl, ethyl, n-propyl, isopropyl, tertbutyl, or pentyl ligand.

In some embodiments M is a transition metal selected from the group: Ti, V, Cr, Mn, Zr, Nb, Mo, Ru, Rh, Pd, Ag, Au, Hf, Ta, W, Re, Os, Ir and Pt.

In some embodiments M is a transition metal selected from the group: Cu, Fe, Co, Ni. In some embodiments M is a transition metal selected from the group: Au, Pt, Ir, Pd, Os, Ag, Re, Rh, and Ru.

In some embodiments M may be a rare earth element, for example Sc, Y, La, Ce, or Nd.

In some embodiments the metal precursor used to deposit oxide films by the processes described herein may comprise at least one multidentate ligand, such as a bidentate ligand, for example a betadiketonate ligand (acac, thd) or another multidentate/bidentate ligand which is bonded to the metal atom through at least one oxygen. In some embodiments the metal precursor used to deposit metal oxide films by the processes described herein may comprise a cyclic ligand, such as cyclopentadienyl ligand.

In some embodiments the metal precursor used to deposit oxide films by the processes described herein may comprise an alkoxide precursor or alkoxide ligand. In some embodiments the metal precursor used to deposit metal oxide films by the processes described herein comprises at least one metal-oxygen bond. In some embodiments the metal precursor used to deposit metal oxide films by the processes described herein does not comprise a metal-oxygen bond, but comprises oxygen in the ligand. In some embodiments the metal precursor comprises metal or Ge, for example transition metal or Ge, Al, Ga, In, Sn, Pb, Bi, Sb. In some embodiments the metal precursor comprises group 1 or 2 metal element. In some embodiments M may be a rare earth element, for example Sc, Y, La, Ce, or Nd.

In some embodiments an oxide film comprising metal may be deposited on a substrate comprising a photoresist or other organic material according to the processes described herein. In some embodiments a metal oxide film may be deposited on a substrate that may otherwise be destroyed by a PEALD process which includes oxygen plasma.

In some embodiments an oxide film comprising metal is selectively deposited on a first surface relative to a second surface comprising a passivation layer, such as an organic passivation layer. In some embodiments an oxide film comprising metal and silicon is selectively deposited on a first surface relative to a second surface comprising a passivation layer, such as an organic passivation layer. In some embodiments the oxide deposition may also serve to remove some or all of the passivation layer. For example, a metal oxide film may be selectively deposited on a first dielectric surface relative to a metal or metallic surface, where the metal or metallic surface may comprise a passivation layer, such as an organic passivation layer.

In some embodiments the oxide films comprising metal are deposited according to the PEALD processes as described herein may have wet etch resistances that are higher than the wet etch resistance of similar metal oxide films deposited by PEALD processes that include oxygen plasma or excited oxygen species. As described herein, in some embodiments the formation of metal oxide films may be controlled by selecting a plasma power from a range, for example a range as described herein with respect to the deposition of SiOC, in a PEALD process in order to achieve a desired step coverage and/or WERR. That is, in some embodiments the process conditions used to control the formation of SiOC films as described herein can be used to control the formation of metal oxide films.

In some embodiments the second reactants used in the PEALD processes for depositing oxide thin films comprising metal are the same as the second reactants described herein with respect to the deposition of SiOC. In some embodiments the second reactant comprises plasma generated in a gas comprising nitrogen. In some embodiments the second reactant comprises a plasma generated in a gas comprising hydrogen. In some embodiments the second reactant comprises a plasma generated in a gas comprising a noble gas, such as Ar. As mentioned above, in some embodiments the second reactant is a plasma generated in a gas that does not comprise oxygen. In some embodiments the second reactant comprises plasma generated in Ar, plasma generated in Ar and $N_2$ or plasma generated in Ar and $H_2$. In some embodiments the second reactant can be selected to control the amount of particular components of the metal oxide film, such as carbon and/or nitrogen. In addition, the plasma power may be controlled to adjust the composition of the film.

In some embodiments an oxide comprising titanium is deposited by a PEALD process that does not use an oxygen plasma or other oxygen reactant. For example, a titanium oxide film may be deposited by a PEALD process using titanium isopropoxide (IV) (TTIP) in combination with a non-oxygen plasma. In some embodiments TTIP is utilized in a PEALD process in combination with a plasma generated in Ar, a plasma generated in a gas comprising Ar and nitrogen, or a plasma generated in a gas comprising Ar and hydrogen. In some embodiments, a titanium oxide film comprising carbon is deposited by a PEALD process in which a titanium reactant such as TTIP is utilized in combination with a plasma generated in a noble gas, such as in pure Ar gas. The amount of carbon may be tuned by varying the plasma power. In some embodiments a titanium oxide film comprising carbon and nitrogen (TiO(CN)) is deposited by a PEALD process using a titanium reactant such as TTIP in combination with a plasma generated in a gas comprising nitrogen, such as in a gas comprising Ar and $N_2$.

In some embodiments oxide thin films, for example dielectric films such as $SiO_2$, SiOC or other SiO-based dielectric films, or metal-containing oxide films, are selectively deposited on a substrate by plasma-enhanced atomic layer deposition (PEALD) processes. In some embodiments an oxide film is selectively deposited on a first dielectric surface of a substrate relative to a second, different metal or metallic surface of the substrate by a PEALD process. For example, $SiO_2$ may be selectively deposited by PEALD on a $SiO_2$ surface relative to a metal surface.

Selective Deposition

According to some embodiments an oxide film is selectively deposited using a PEALD process. In some embodiments the oxide is a metal oxide. In some embodiments the oxide comprises metal and silicon. The process may comprise contacting the substrate with a first precursor and a second plasma reactant, such as a plasma generated in a gas comprising hydrogen, such as a gas comprising Ar and $H_2$ (referred to herein as Ar/$H_2$ plasma). The first precursor may contain both oxygen and one or more elements to be included in the oxide, such as a metal or silicon, as described above.

In some embodiments the substrate is contacted with a second precursor containing a second, different element to be included in the film. For example, one precursor may comprise a metal, while a second precursor may comprise silicon. The oxide film grows on a first surface, such as a dielectric surface, while less growth or no growth takes place on a second surface, such as a metal or metallic surface.

In some embodiments a PEALD process for selectively depositing an oxide thin film on a dielectric surface of a substrate relative to a metal surface of the substrate comprises at least one deposition cycle in which the substrate is alternately and sequentially contacted with a first precursor comprising a first component of the oxide and oxygen, a second precursor comprising a second component of the oxide, and a third reactant comprising reactive species from a plasma generated in a gas that does not comprise oxygen. In some embodiments the first component of the oxide is a metal and the second component is silicon and a metal oxide comprising silicon and metal is selectively deposited. In some embodiments the first and second components of the oxide are two different metals.

The reactive species in the PEALD process (such as from a plasma) may serve two functions. First, it may serve as a reactant in the deposition process where it reacts with a previously adsorbed precursor on the dielectric surface to form the desired oxide on that surface. Second, the reactive species may act on the metal surface to reduce or inhibit formation of oxide on that surface. Growth on the second metal surface may be inhibited, for example by reducing metal oxide on the metal surface, if any, and/or by removing oxygen from the metal surface, such as by removing OH groups and/or metal-oxygen bridges from the metal surface. The reactive species do not remove oxygen (such as OH groups and/or metal-oxygen bridges) as easily from the first dielectric surface, such as a silicon oxide dielectric surface. The first precursor thus reacts and chemisorbs to the dielectric surface containing a greater concentration of OH-groups preferentially, relative to the reduced metal surface, having fewer OH-groups. As a result, the oxide is selectively deposited on the first dielectric surface relative to the second metal or metallic surface.

Selective oxide deposition may be carried out essentially as described above. In some embodiments a substrate comprising a first surface on which deposition of an oxide is desired, such as a dielectric surface, and second surface on which deposition is not desired, such as a metal surface, is alternately and sequentially contacted with a first precursor comprising oxygen and one or more elements to be included in the deposited material, such as a metal, and a second plasma reactant. In some embodiments the second plasma reactant does not comprise oxygen species. In some embodiments no reactants comprising oxygen species are used other than the first reactant. The plasma and precursor may be provided in pulses separated by a purge in which excess reactant and reaction byproducts, if any, are removed from the reaction space.

In some embodiments the deposition process begins with a plasma pulse, and the reaction sequence, or deposition cycle, may be repeated a desired number of times (A):

$A\times(RF/purge/precursor/purge)$

In some embodiments the deposition cycle begins with a first precursor pulse, which is followed by a second plasma pulse. The first precursor may comprise, for example, a metal and oxygen.

In some embodiments a reducing plasma step may be provided before starting the deposition cycle. The reducing plasma step may be longer than the exposure to the plasma reactant in the deposition cycle. In some embodiments the reducing plasma step is included in the deposition process at one or more intervals. In some embodiments the reducing plasma step is included before two or more deposition cycles. In some embodiments the reducing plasma step is included before each deposition cycle.

The plasma in the longer reducing step may be the same as the plasma used in the deposition cycle, or may differ. This reducing plasma step may reduce substantially all metal oxide from the metal surface and ensure that substantially all OH groups are removed from the metal surface:

(long pulse/high power RF)+$A\times$(RF/purge/precursor/ purge)

By optimizing the plasma and other process conditions, the reducing power can be tuned to such that the desired level of selectivity is obtained. In some embodiments, the process conditions, such as plasma power, can be tuned such that growth does not proceed appreciably on the metal surface, or even at all. In some embodiments plasma power can also be used to tune the k value and wet etch resistance of the oxide film that is deposited.

In some embodiments the plasma that is used in the selective deposition cycle and/or for the reducing plasma step is hydrogen based. For example, the plasma may be generated in $H_2$ gas or a mixture of $H_2$ and a noble gas, such as Ar. In some embodiments the plasma is nitrogen based, or comprises nitrogen species. For example, the plasma may be generated in $N_2$ gas, or a mixture of $N_2$ and a noble gas, such as Ar. In some embodiments the plasma is oxygen gas-free. That is, the plasma is generated in a gas or gas mixture that does not comprise oxygen. However, in some embodiments the plasma may be generated in a gas comprising oxygen, or may otherwise comprise excited oxygen species. Plasma gases with more reducing power are preferable in some embodiments. In some embodiments noble gas alone can be used for generating the plasma. Thus, in some embodiments the plasma is generated in a noble gas, such as Ar gas without any other components.

In some embodiments plasma, for example hydrogen containing plasma may be generated by applying RF power of from about 5 W to about 5000 W, 10 W to about 2000 W, from about 50 W to about 1000 W, from about 30 W to 100 W or from about 200 W to about 800 W. In some embodiments the RF power density may be from about 0.02 W/cm$^2$ to about 2.0 W/cm$^2$, or from about 0.05 W/cm$^2$ to about 1.5 W/cm$^2$. The RF power may be applied to second reactant that flows during the plasma contacting time, that flows continuously through the reaction chamber, and/or that flows through a remote plasma generator. Thus in some embodiments the plasma is generated in situ, while in other embodiments the plasma is generated remotely. In some embodiments a showerhead reactor is utilized and plasma is generated between a susceptor (on top of which the substrate is located) and a showerhead plate.

In some embodiments metal oxide films are selectively deposited on a first surface relative to a second surface. In some embodiments SiOC is selectively deposited. In some embodiments the oxides include oxophilic elements. In some embodiments oxides comprising metal and silicon are selectively deposited, such as metal silicates. Oxides that can be deposited by the methods disclosed herein include, for example, SiOCN, SiOSC, $TiO_2$, $Al_2O_3$, $Nb_2O_5$, $Ta_2O_5$ and $SiO_2$. Again, in some embodiments the precursor utilized contains both oxygen and a second element desired in the oxides, such as metal or silicon.

Unless otherwise indicated, if a surface is referred to as a metal surface herein, it may be a metal surface or a metallic surface. In some embodiments the metal or metallic surface may comprise metal, metal oxides, and/or mixtures thereof. In some embodiments the metal or metallic surface may comprise surface oxidation. In some embodiments the metal or metallic material of the metal or metallic surface is electrically conductive with or without surface oxidation. In some embodiments metal or a metallic surface comprises one or more transition metals. In some embodiments the metal or metallic surface comprises one or more of Al, Cu, Co, Ni, W, Nb, Fe. In some embodiments the metal or metallic surface comprises Cu. In some embodiments the metal or metallic surface comprises one or more noble metals, such as Ru. In some embodiments the metal or metallic surface comprises a conductive metal oxide, nitride, carbide, boride, or combination thereof. For example, the metal or metallic surface may comprise one or more of $RuO_x$, $NbC_x$, $NbB_x$, $NiO_x$, $CoO_x$, $NbO_x$, $WNC_x$. In some embodiments the substrate may comprise a metal nitride, including, but not limited to TiN and/or TaN. In some embodiments the metal surface may comprise a metal carbide, including, but not limited to TiC and/or TaC. In some embodiments the metal surface may comprise a metal chalcogenide, including, but not limited to $MoS_2$, $Sb_2Te_3$, and/or GeTe. In some embodiments the metal surface is a TiN surface. In some embodiments the metal surface is a W surface.

In some embodiments the metal surface may comprise Zn, Fe, Mn, or Mo.

In some embodiments the metal surface comprises Co, Ru, Ni, Ta, TiN, W or Cu.

In some embodiments the dielectric surface may be, for example, a silicon oxide surface, such as a $SiO_2$ surface. In some embodiments the dielectric surface may be a low-k surface.

In some embodiments a passivation layer, such as an organic layer, may be present on the substrate prior to deposition, such as on the metal surface. In some embodiments a passivation layer is present on the metal surface but not on the dielectric surface.

In some embodiments a passivation layer may be deposited on the metal surface prior to selective deposition of the oxide on the dielectric surface. For example, in some embodiments, a passivation layer may be selectively deposited on a metal layer. Selective deposition of a passivation layer may be carried out, for example, as described below, and as described in U.S. patent application Ser. No. 15/170,769 or U.S. patent application Ser. No. 15/486,124, each of which is incorporated by reference herein.

In some embodiments a passivation layer may be present on both the metal surface and the dielectric surface prior to deposition. In some embodiments the passivation layer is thicker over the metal surface than over the dielectric surface.

The plasma reactant used in the deposition process, or in the plasma treatment prior to the deposition process, may etch the passivation layer, such that the passivation layer is etched fully away from the dielectric surface on which deposition is desired, while some passivation layer remains on the metal surface. The selectivity of the deposition process on the dielectric surface relative to the metal surface (comprising the passivation layer) can thus be achieved or enhanced. In some embodiments etching of the passivation layer occurs during the selective deposition of the oxide, such as through the activity of the plasma reactant.

In some embodiments the passivation layer over the metal surface may be replenished during the deposition process in order to achieve better selectivity when thicker films are deposited.

If no passivation layer is present, or a passivation layer is completely removed, the plasma may serve as described above to keep the metal as metallic, and remove OH-groups and/or metal oxide, such that the oxide is selectively deposited on the dielectric surface, such as an $SiO_2$ or low-k surface, relative to the metal or metallic surface.

As mentioned above, in some embodiments the substrate may comprise an organic passivation layer. In some embodiments where the substrate comprises an organic material the reaction temperature of a PEALD process may be less than about 200° C. In some such embodiments the reaction temperature may be less than about 150° C., less than about 100° C., less than about 75° C., or less than about 50° C.

In some embodiments, if necessary, the exposed surfaces of the workpiece can be pretreated to provide reactive sites to react with the first phase of the PEALD process. In some embodiments a separate pretreatment step is not required. In some embodiments the substrate is pretreated to provide a desired surface termination. In some embodiments the substrate is pretreated with plasma.

Selectivity

Selectivity can be given as a percentage calculated by [(deposition on first surface)–(deposition on second surface)]/(deposition on the first surface). Deposition can be measured in any of a variety of ways. In some embodiments deposition may be given as the measured thickness of the deposited material. In some embodiments deposition may be given as the measured amount of material deposited.

In some embodiments selectivity is greater than about 10%, greater than about 50%, greater than about 75%, greater than about 85%, greater than about 90%, greater than about 93%, greater than about 95%, greater than about 98%, greater than about 99% or even greater than about 99.5%. In embodiments described herein, the selectivity can change over the duration or thickness of a deposition.

In some embodiments deposition of the oxide only occurs on the first dielectric surface and does not occur on the second metal surface. In some embodiments deposition on the first surface of the substrate relative to the second surface of the substrate is at least about 80% selective, which may be selective enough for some particular applications. In some embodiments the deposition on the first surface of the substrate relative to the second surface of the substrate is at least about 50% selective, which may be selective enough for some particular applications. In some embodiments the deposition on the first surface of the substrate relative to the second surface of the substrate is at least about 10% selective, which may be selective enough for some particular applications.

Selective Deposition of a Passivation Layer

In some embodiments, a passivation layer is selectively deposited on a first metal or metallic surface of a substrate relative to a second dielectric surface in order to facilitate or enhance subsequent selective deposition of an oxide on the dielectric surface relative to the metal surface, as described herein. In the selective deposition of the passivation layer, in some embodiments a first organic reactant is vaporized to form a first reactant vapor. The reactant being vaporized may be liquid or solid under standard temperature and pressure conditions (room temperature and atmospheric pressure). In some embodiments, the reactant being vaporized comprises an organic precursor, such as an amine, for example a diamine, such as 1,6-diamnohexane (DAH), or another organic precursor, such as a dianhydride, for example pyromellitic dianhydride (PMDA). The substrate is then exposed to the first reactant vapor and an organic film is selectively deposited. The method can include additional steps, and may be repeated. For example, as described below in some embodiments two reactants are utilized to selectively deposit a passivation layer on a metal surface relative to a dielectric surface.

In some embodiments, the organic film comprises a polymer. In some embodiments, the polymer deposited is a polyimide. In some embodiments, the polymer deposited is a polyamide. Other examples of deposited polymers include dimers, trimers, polyurethanes, polythioureas, polyesters, polyimines, other polymeric forms or mixtures of the above materials.

In some embodiments, a substrate comprising a first conductive surface, for example a metal or metallic surface, and a second dielectric surface is provided and alternately and sequentially exposed to a first vapor phase reactant and a second vapor phase reactant in a deposition cycle.

In some embodiments the first precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments where batch reactors may be used, exposure periods of greater than 60 seconds may be employed.

In some embodiments the second precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments where batch reactors may be used, exposure periods of greater than 60 seconds may be employed.

In some embodiments a deposition cycle may repeated until an organic film of a desired thickness is selectively deposited on the metal surface.

Various reactants can be used for the above described processes. For example, in some embodiments, the first precursor or reactant is an organic reactant such as a diamine, e.g., 1,6-diamnohexane (DAH), or any other monomer with two reactive groups.

In some embodiments, the second reactant or precursor is also an organic reactant capable of reacting with adsorbed species of the first reactant under the deposition conditions. For example, the second reactant can be an anhydride, such as furan-2,5-dione (maleic acid anhydride), or more particularly a dianhydride, e.g., pyromellitic dianhydride (PMDA), or any other monomer with two reactive groups which will react with the first reactant.

In some embodiments the substrate is contacted with the first precursor prior to being contacted with the second precursor. Thus, in some embodiments the substrate is contacted with an amine, such as a diamine, for example 1,6-diamnohexane (DAH) prior to being contacted with another precursor. However, in some embodiments the substrate may be contacted with the second precursor prior to being contacted with the first precursor. Thus, in some embodiments the substrate is contacted with an anhydride, such as furan-2,5-dione (maleic acid anhydride), or more particularly a dianhydride, e.g., pyromellitic dianhydride (PMDA) prior to being contacted with another precursor.

Although the above described processes begin with contacting the substrate with the first vapor phase precursor, in other embodiments a process may begin with contacting the substrate with the second vapor phase precursor. It will be understood by the skilled artisan that contacted the substrate with the first precursor and second precursor are interchangeable in the processes described herein.

In some embodiments, different reactants can be used to tune the film properties. For example, a polyimide film could be deposited using 4,4'-oxydianiline or 1,4-diaminobenzene instead of 1,6-diamnohexane to get a more rigid structure with more aromaticity and increased dry etch resistance.

In some embodiments the reactants do not contain metal atoms. In some embodiments the reactants do not contain semimetal atoms. In some embodiments one of the reactants comprises metal or semimetal atoms. In some embodiments the reactants contain carbon and hydrogen and one or more of the following elements: N, O, S, P or a halide, such as Cl or F. In some embodiments the first reactant may comprise, for example, adipoyl chloride (AC).

Deposition conditions for the passivation layer can differ depending upon the selected reactants and can be optimized upon selection. In some embodiments the reaction temperature can be selected from the range of about 80° C. to about 250° C. In some embodiments, for example where the selectively deposited organic film comprises polyimide, the reaction temperature can be selected from the range of about 170° C. to about 210° C. In some embodiments, for example where the selectively deposited organic film comprises polyamide, the reaction temperature can be selected from a range of about 80° C. to about 150° C. In some embodiments where the selectively deposited organic film comprises polyimide the reaction temperature may be greater than about 160° C., 180° C., 190° C., 200° C., or 210° C. In some embodiments where the selectively deposited organic film comprises polyamide the reaction temperature may be greater than about 80° C., 90° C., 100° C., 110° C., 120° C., 130° C., 140° C., or 150° C.

In some embodiments the selectively deposited or formed organic film does not contain metal atoms. In some embodiments the selectively deposited or formed organic film does not contain semimetal atoms. In some embodiments the selectively deposited or formed organic film contains metal or semimetal atoms. In some embodiments the selectively deposited or formed organic film contains carbon and hydrogen and one or more of the following elements: N, O, S, or P.

In some embodiments reactants for use in the selective deposition for forming an organic passivation layer may have the general formula:

$$R^1(NH_2)_2 \qquad (1)$$

Wherein $R^1$ may be an aliphatic carbon chain comprising 1-5 carbon atoms, 2-5 carbon atoms, 2-4 carbon atoms, 5 or fewer carbon atoms, 4 or fewer carbon atoms, 3 or fewer carbon atoms, or 2 carbon atoms. In some embodiments the bonds between carbon atoms in the reactant or precursor may be single bonds, double bonds, triple bonds, or some combination thereof. Thus, in some embodiments a reactant may comprise two amino groups. In some embodiments the amino groups of a reactant may occupy one or both terminal positions on an aliphatic carbon chain. However, in some embodiments the amino groups of a reactant may not occupy either terminal position on an aliphatic carbon chain. In some embodiments a reactant may comprise a diamine. In some embodiments a reactant may comprise an organic precursor selected from the group of 1,2-diaminoethane (1), 1,3-diaminopropane (1), 1,4-diaminobutane(l), 1,5-diaminopentane (1), 1,2-diaminopropane (1), 2,3-butanediamine, 2,2-dimethyl-1,3-propanediamine (1).

In some embodiments reactants for use in the selective deposition processes for forming an organic passivation layer may have the general formula:

$$R^2(COCl)_2 \qquad (2)$$

Wherein $R^2$ may be an aliphatic carbon chain comprising 1-3 carbon atoms, 2-3 carbon atoms, or 3 or fewer carbon atoms. In some embodiments the bonds between carbon atoms in the reactant or precursor may be single bonds, double bonds, triple bonds, or some combination thereof. In some embodiments a reactant may comprise a chloride. In some embodiments a reactant may comprise a diacyl chloride. In some embodiments a reactant may comprise an organic precursor selected from the group of oxalyl chloride (l), malonyl chloride, and fumaroyl chloride.

In some embodiments, a reactant comprises an organic precursor selected from the group of 1,4-diisocyanatobutane or 1,4-diisocyanatobenzene. In some embodiments a reactant comprises an organic precursor selected from the group of terephthaloyl dichloride, alkyldioyl dichlorides, such as hexanedioyl dichloride, octanedioyl dichloride, nonanedioyl dichloride, decanedioyl dichloride, or terephthaloyl dichloride. In some embodiments, a reactant comprises an organic precursor selected from the group of 1,4-diisothiocyanatobenzene or terephthalaldehyde. In some embodiments, a reactant being vaporized can be also a diamine, such as 1,4-diaminobenzene, decane-1,10-diamine, 4-nitrobenzene-1,3-diamine, 4,4'-oxydianiline, or ethylene diamine. In some embodiments, a reactant can be a terephthalic acid bis(2-hydroxyethyl) ester. In some embodiments a reactant can be a carboxylic acid, for example alkyl-, alkenyl-, alkadienyl-dicarboxylic or tricarboxylic acid, such as ethanedioic acid, propanedioic acid, butanedioic acid, pentanedioic acid or propane-1,2,3-tricarboxylic acid. In some embodiments, a reactant can be an aromatic carboxylic or dicarboxylic acid, such as benzoic acid, benzene-1,2-dicarboxylic acid, benzene-1,4-dicarboxylic acid or benzene-1,3-dicarboxylic acid. In some embodiments, a reactant may comprise one or more OH-groups bonded to a hydrocarbon. In some embodiments, a reactant can be selected from the group of diols, triols, aminophenols such as 4-aminophenol, benzene-1,4-diol or benzene-1,3,5-triol. In some embodiments, a reactant can be 8-quinolinol. In some embodiments, the reactant can comprise alkenylchlorosilanes, like alkenyltrichlorosilanes, such as 7-octenyltrichlorosilane.

Following selective deposition of an organic passivation layer on the metal surface, an oxide may be selectively deposited on the dielectric surface relative to the metal surface, as described herein.

EXAMPLES

Figure 4:
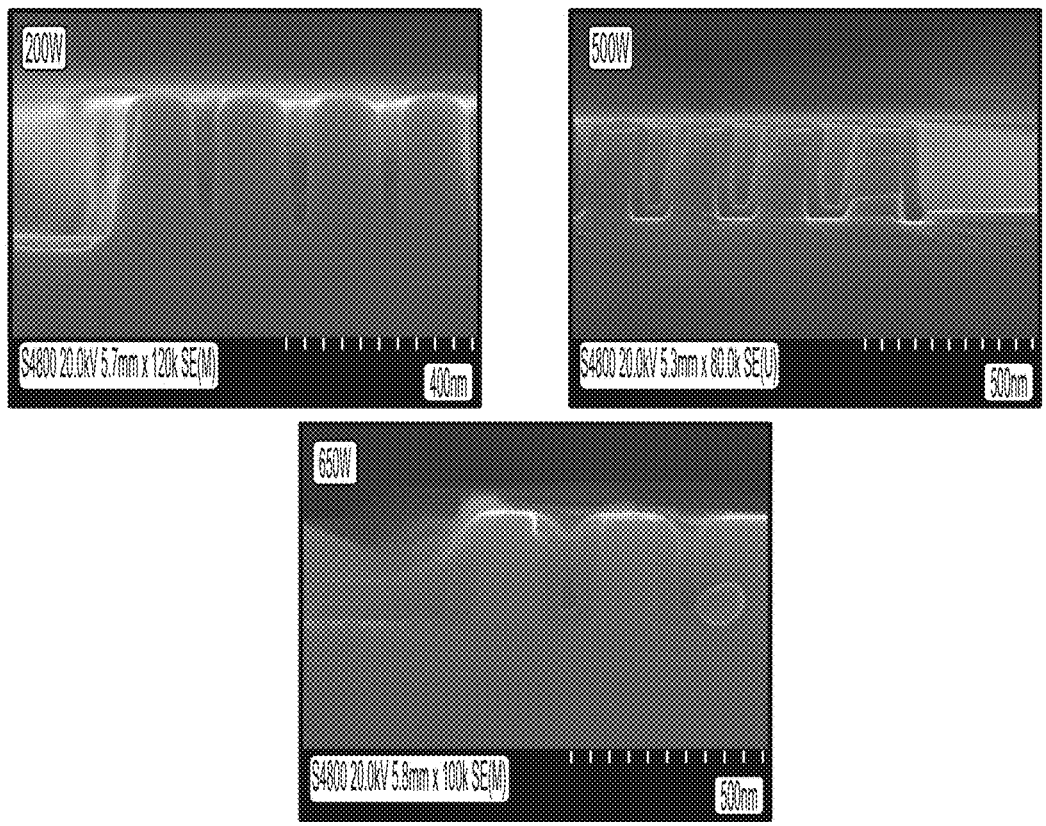
FIG. 4 is a series of scanning electron micrographs showing example SiOC films deposited by PEALD processes as described herein and according to some embodiments with plasma power varying from 200 W to 650 W.

A direct plasma PEALD reactor was used to deposit sample SiOC films according to the processes described herein. 3-Methoxypropyl(trimethoxysilane) (MPTMS) was used as the silicon precursor. Experiments were carried out at a deposition temperature of 200° C. A plasma was generated from a gas consisting of an $H_2$/Ar mixture with flow rates of 100/1200 sccm. The pressure used was 4 Torr and pulse/purge/Rf/purge lengths were 2/4/4/0.5 s. The growth per cycle (GPC) of a process with these parameters is typically about 0.2 Å/cycle. The plasma power was varied from 200 W to 650 W. FIG. 4 is a series of scanning electron micrographs showing the example SiOC films deposited on substrates comprising a trench pattern. The film deposited with a plasma power of 200 W included 1500 cycles, while the films deposited with plasma powers of 500 W and 650 W included 2000 cycles.

Figure 5:
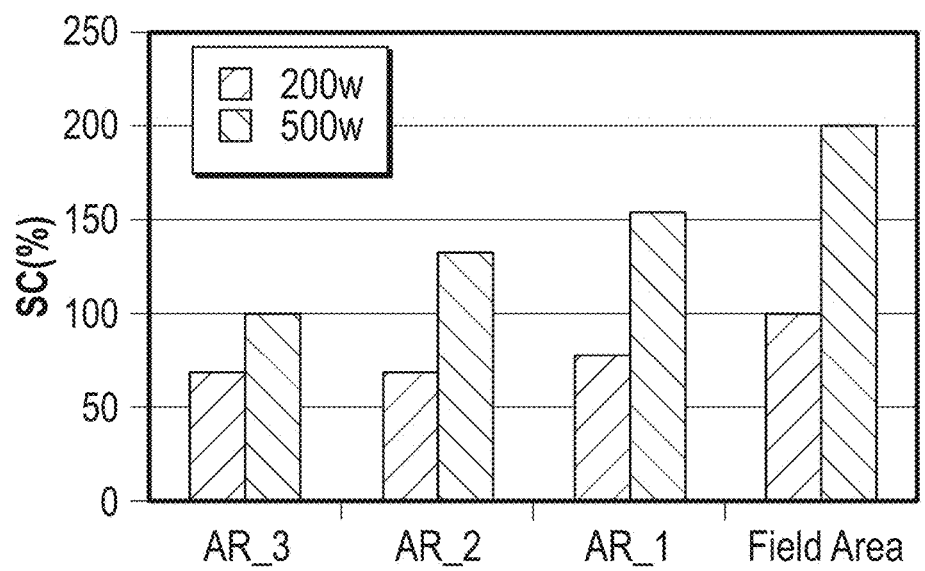
FIG. 5 is a bar graph showing the step coverage of example SiOC films deposited by PEALD processes on three dimensional structure with varying aspect ratios for plasma powers of 200 W and 500 W as described herein and according to some embodiments.

It can be seen that the plasma power has an influence on the step coverage and on the selectivity of vertical vs. horizontal surface GPC. By using the highest power setting of 650 W no film can be seen on the trench top areas and also nothing on the open space field areas. The GPC on the trench sidewalls on the other hand is substantial. Using lower powers of 500 and 200 W film in the top and field areas can also be seen. The step coverage also depends on the structure aspect ratio (AR). FIG. 5 shows how this changes when using two different power settings.

Figure 6A:
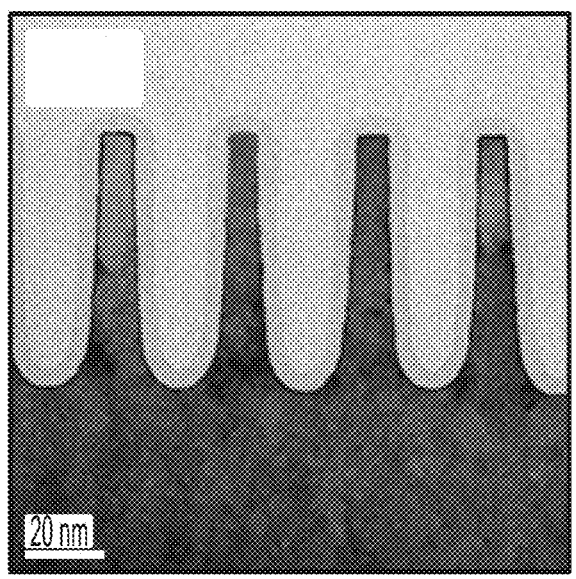
FIG. 6A is a tunneling electron micrograph of an example SiOC film deposited on a three dimensional feature with an aspect ratio of about 3 by a PEALD process with a plasma power of 200 W as described herein and according to some embodiments.
Figure 6B:
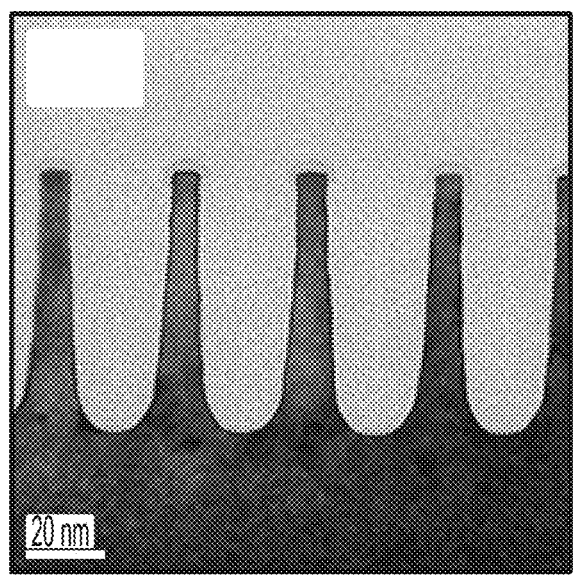
FIG. 6B is a tunneling electron micrograph of the example SiOC film of FIG. 6A after being subjected to a wet etch as described herein and according to some embodiments.

FIG. 6A is a tunneling electron micrograph of an example SiOC film deposited on a three dimensional feature with an aspect ratio of about 3 by a PEALD process with a plasma power of 200 W while FIG. 6B is a tunneling electron micrograph of the example SiOC film of FIG. 6A after being subjected to 2 minutes etching in a 0.5 wt % dilute HF solution. The deposited SiOC film on the sidewall and bottom of the structure was etched away, while in the top area film remained.

Figure 6C:
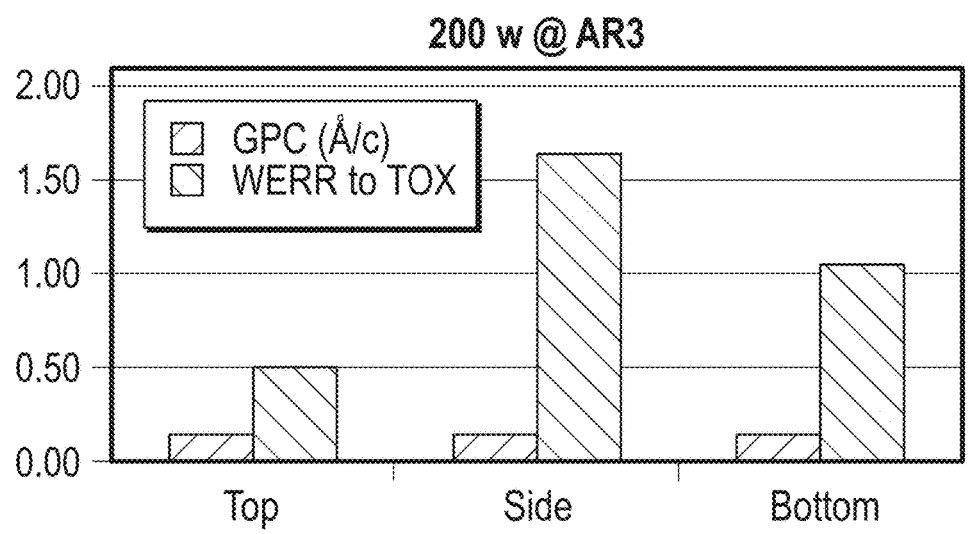
FIG. 6C is a bar graph showing the growth per cycle (GPC) and wet etch rate ratio (WERR) for different areas of an example SiOC films deposited on a three dimensional feature with an aspect ratio of about 3 by a PEALD process with a plasma power of 200 W as described herein and according to some embodiments.

As can be seen in FIG. 6C, and as in the case of lower aspect ratio, e.g. AR 1.4 shown in the FIG. 5, the SiOC film can also be deposited on both in the top and bottom areas of the structure. With an increase in the AR of the structure, the WER of the SiOC deposited on the bottom of the structure decreased. Thus, after etching the SiOC film deposited on both the top and bottom of the structure is left. The GPC and WER were found to be almost same in these two areas.

Figure 7A:
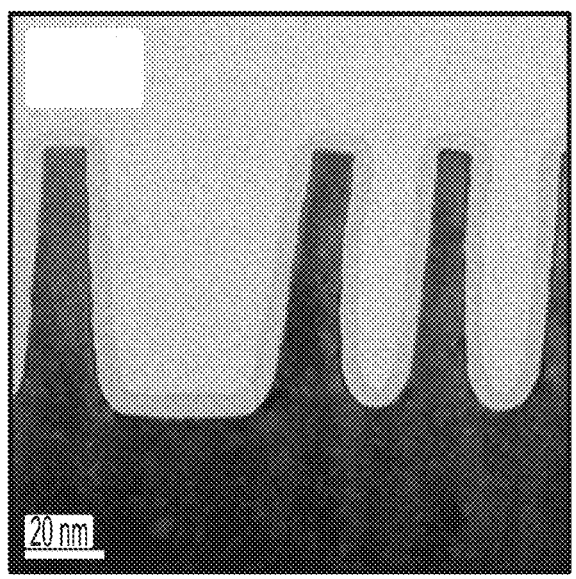
FIG. 7A is a tunneling electron micrograph of an example SiOC film deposited on a three dimensional feature with an aspect ratio of about 1.4 by a PEALD process with a plasma power of 200 W as described herein and according to some embodiments.
Figure 7B:
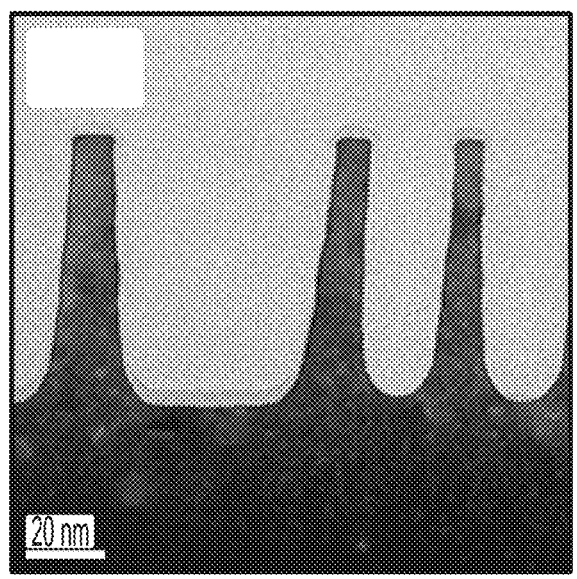
FIG. 7B is a tunneling electron micrograph of the example SiOC film of FIG. 7A after being subjected to a wet etch as described herein and according to some embodiments.

FIG. 7A is a tunneling electron micrograph of an example SiOC film deposited on a three dimensional feature with an aspect ratio of about 1.4 by a PEALD process with a plasma power of 200 W and including 400 deposition cycles while FIG. 7B is a tunneling electron micrograph of the example SiOC film of FIG. 7A after being subjected to 2 minutes of a wet etch in 0.5% dilute HF.

Figure 8A:
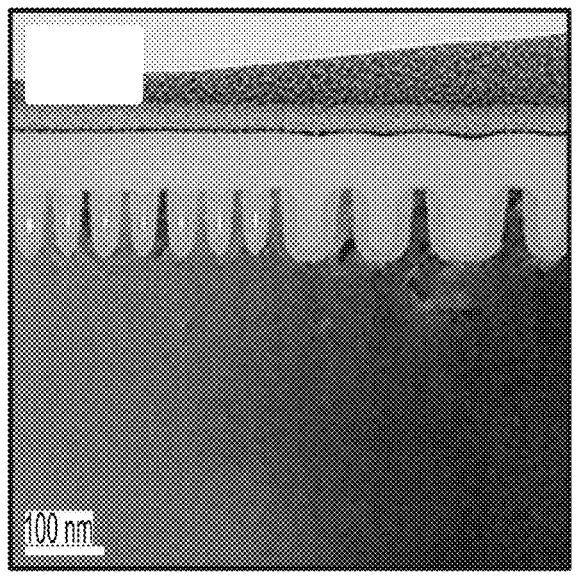
FIG. 8A is a tunneling electron micrograph of an example SiOC film deposited on three dimensional features with an aspect ratio of about 1 (right) and about 3 (left) by a PEALD process with a plasma power of 650 W as described herein and according to some embodiments.
Figure 8B:
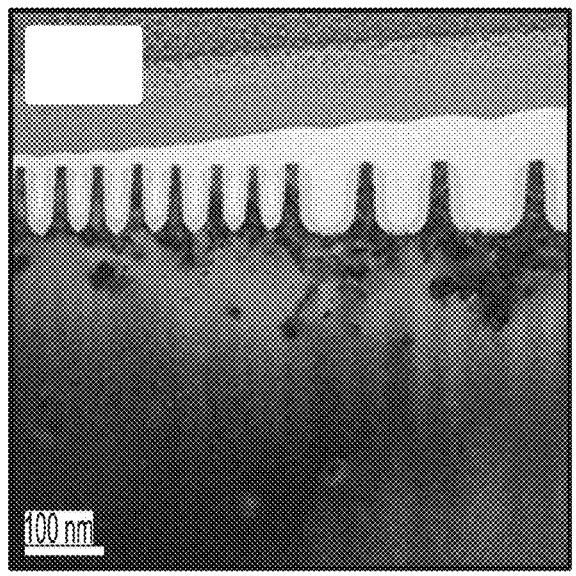
FIG. 8B is a tunneling electron micrograph of the SiOC film of FIG. 8A after being subjected to a wet etch as described herein and according to some embodiments.
Figure 8C:
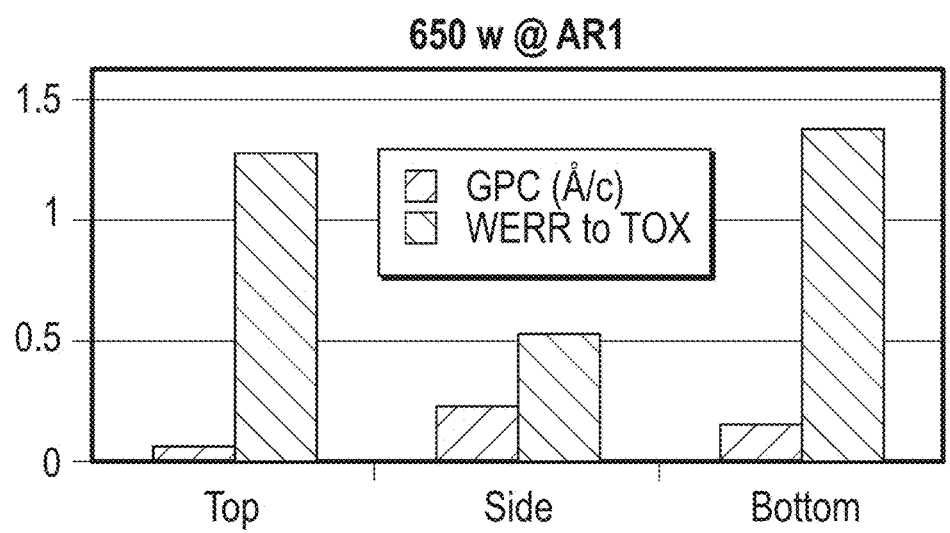
FIG. 8C is a bar graph showing the growth per cycle (GPC) and wet etch rate ratio (WERR) for different areas of an example SiOC films deposited on a three dimensional feature with an aspect ratio of about 1 by a PEALD process with a plasma power of 650 W as described herein and according to some embodiments.
Figure 8D:
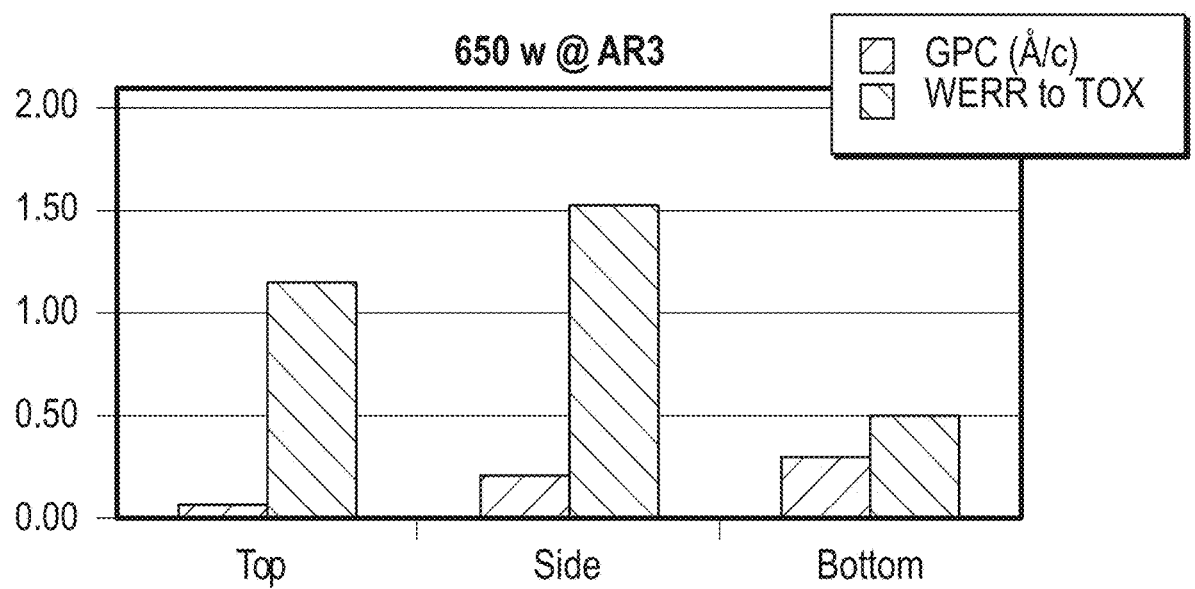
FIG. 8D is a bar graph showing the growth per cycle (GPC) and wet etch rate ratio (WERR) for different areas of an example SiOC films deposited on a three dimensional feature with an aspect ratio of about 3 by a PEALD process with a plasma power of 650 W as described herein and according to some embodiments.

FIGS. 8A and 8B shows two TEM images of trenches having aspect ratios of 1 (right) and 3 (left) with SiOC films deposited by a PEALD process as described herein with a plasma power of 650 W and including 700 deposition cycles. FIG. 8A shows the as deposited SiOC film while FIG. 8B shows the example SiOC film of FIG. 8A after being subjected to a 2 minute wet etch in 0.5 wt % dilute HF. FIG. 8C is a bar graph showing the growth per cycle (GPC) and wet etch rate ratio (WERR) for different areas (top, side, bottom) of the example SiOC films deposited on a three dimensional feature with an aspect ratio of about 1. The GPC on the sidewall and bottom is much higher than that on the top. FIG. 8D shows the difference of GPC and WER in those three areas for the example SSiOC film deposited on a three-dimensional feature with an aspect ratio of about 3. In the bottom area, film was deposited with highest GPC, and it also shows much lower WER than that on the top and sidewall. This result indicates that by introducing higher deposition power and HF etching treatment, it is possible to achieve film just on the bottom are. And as shown in FIG. 8B, the film in the top area can be easily etched away while film on the sidewall and bottom will remain. It was found that the ratio of the WER of the film to the WER of thermal silicon oxide is much less than that in top and bottom area. Thus it is possible to achieve film just on the sidewall by introducing high power and HF etching. But it is limited to a structure with relatively lower AR, for example below 3.

Sample SiOC film composition from samples deposited at 200° C. and 250° C. using a plasma power of 200 W was measured using XPS. The carbon content was substantially low, at about 1-3 at. %. The k-value of a 10 nm 200° C./200 W film was measured and found to be about 4.

Figure 9A:
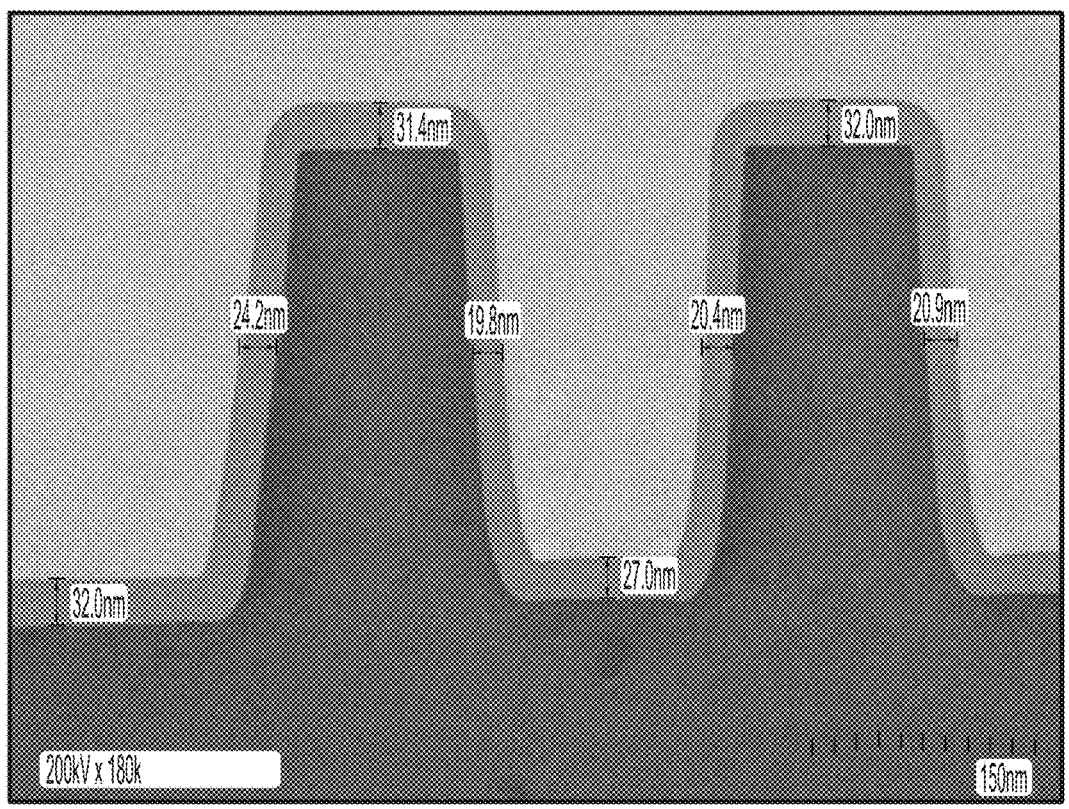
FIG. 9A is a scanning electron micrograph of an example SiOC film deposited on a three dimensional feature by a PEALD process as described herein and according to some embodiments.
Figure 9B:
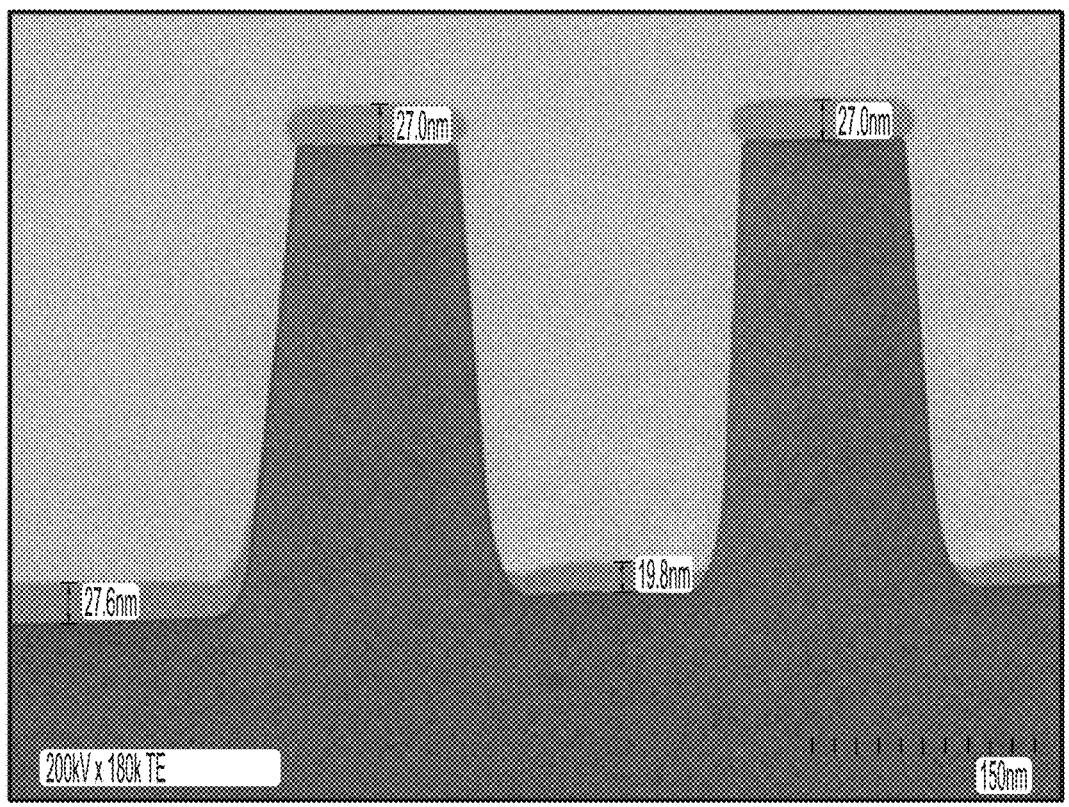
FIG. 9B is a scanning electron micrograph of the example SiOC film of FIG. 9A after being subjected to a wet etch as described herein and according to some embodiments.

FIG. 9A is a scanning electron micrograph of an example SiOC film deposited on a three dimensional feature by a PEALD process including MPTMS as a silicon precursor and a plasma generated from $H_2$ and Ar gas at a power of 67 W. The deposition temperature was 200° C. and the reaction chamber pressure was 4 Torr. The film was deposited by 1000 deposition cycles including MPTMS/purge/RF/purge times of 6/4/4/1 seconds. FIG. 9B is a scanning electron micrograph of the example SiOC film of FIG. 19A after being subjected to a 0.1 wt % dilute HF wet etch. It was observed that substantially no film remained on the sidewalls after the etch process.

Figure 10:
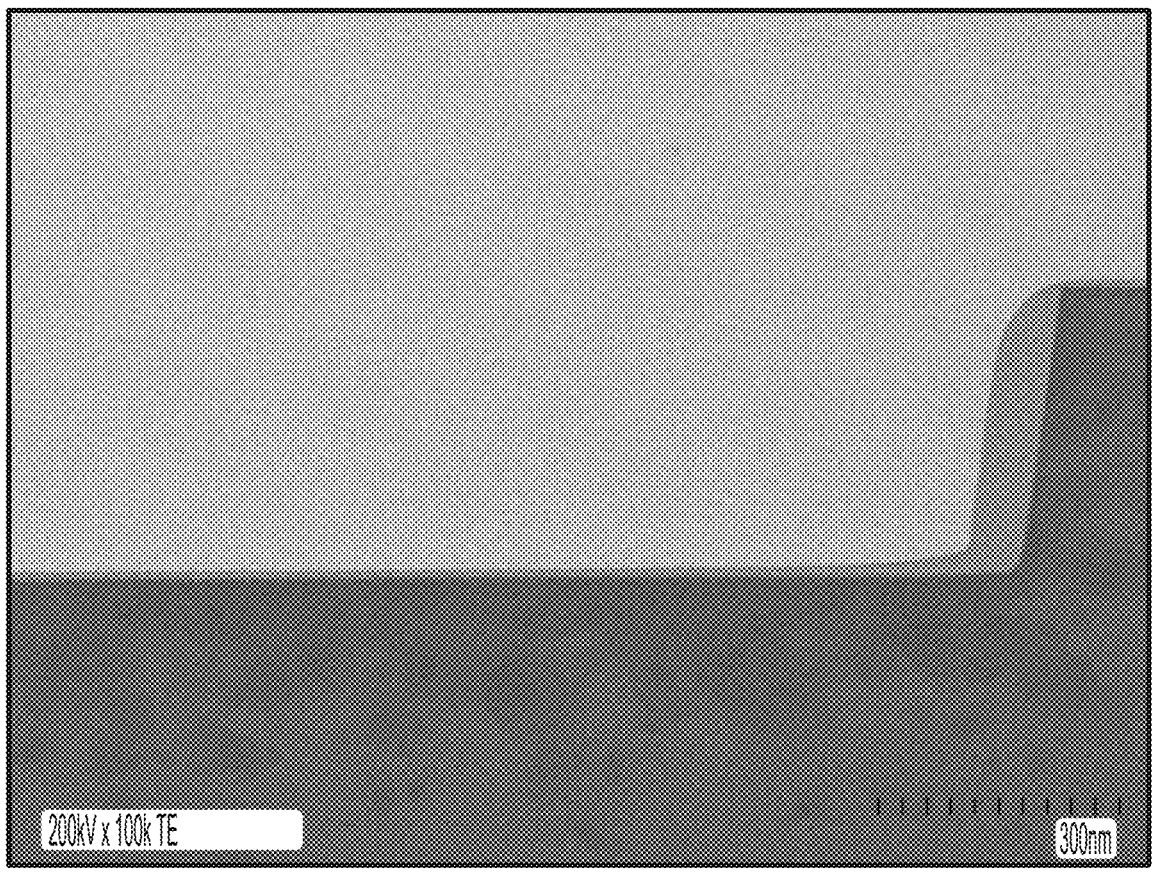
FIG. 10 is a scanning electron micrograph of the example SiOC film deposited by a PEALD process with as plasma power of 650 W as described herein and according to some embodiments.

FIG. 10 is a scanning electron micrograph of an example SiOC film deposited on a three dimensional feature by a PEALD process including MPTMS as a silicon precursor and a plasma generated from $H_2$ and Ar gas at a power of 650 W. The deposition temperature was 200° C. and the reaction chamber pressure was 4 Torr. The film was deposited by 2000 deposition cycles including MPTMS/purge/RF/purge times of 2/4/4/0.5 seconds. It was observed that the film thickness on the sidewall was 63 nm while the thickness on the top surface was substantially lower, at only 8 nm.

In other experiments a post deposition plasma treatment (PT) was carried out on deposited SiOC films. SiOC was deposited on a trench pattern from 3-methocypropyl (trimethoxysilane) (MPTMS) and hydrogen plasma at a deposition temperature of 200° C., essentially as described above. The SiOC film was subjected to a post deposition plasma treatment in which it was exposed to hydrogen plasma generated in Ar/$H_2$ gas at either 334 W or 835 W. As can be seen in Table 2 below, the thickness on the top of the trench decreased after the plasma treatment. However, it increased on the sidewall and bottom. The step coverage increased from 0.6 when no treatment was applied to 1 after the treatment with the plasma generated at 334 W and from 0.6 to 1.7 when the a power of 835 W was used. Without wishing to be held to any theory, it is believed that the SiOC film on the top of the structure was not etched away, but redeposited on the sidewall and the bottom of the trench.

TABLE 2

|  | No PT | PT_334W | PT_835W |
|---|---|---|---|
| Top | 32.0 | 28.1 | 20.9 |
| Side | 20.4 | 27.8 | 35.8 |
| Bottom | 27.0 | 29.8 | 40.2 |

In addition, plasma post treatment (PT) using nitrogen, hydrogen and oxygen plasma was carried out on SiOC films deposited on trench structures as described above. Plasma was generated in each of $H_2$, $O_2$ and $N_2$ gases mixed with Ar gas. A power of 300 W was applied and the plasma treatment was repeated for 50 cycles, with a pulse (exposure) time of 6 seconds and a purge of 1 second between cycles. Following plasma treatment with each of the three plasma reactants, the wet etch rate (WER) in dilute HF was measured. As shown in Table 3, below, the wet etch rate of the sidewall was improved by the oxygen plasma treatment and the nitrogen plasma treatment, but not by the hydrogen plasma treatment.

TABLE 3

| PT | Power (W) | Cycles | Pulse time (s) | Purge time (s) | WER on sidewall (nm/min) |
|---|---|---|---|---|---|
| PT_$H_2$&Ar | 300 | 50 | 6 | 1 | 4.92 |
| PT_$O_2$&Ar | 300 | 50 | 6 | 1 | 2.46 |
| PT_$N_2$&Ar | 300 | 50 | 6 | 1 | 1.8 |
| No PT | — | — | — | — | 4.1 |

Experiments were carried out using 3-methoxypropyltrimethoxysilane (MPTMS) and $H_2$/Ar plasma in a SiOC PEALD process at 200 and 125° C. Natox, W and Cu were used as surfaces to study selectivity. 25, 50 and 200 cycles were applied after which the XPS spectra were recorded. At both temperatures there was more Si on W than on Cu. At 200° C. after 100 cycles no Si was detected on Cu. This selectivity can be realized between natox and Cu as well.

SiOC was also deposited on a substrate comprising a polyimide passivation layer on a substrate comprising Cu and low k surfaces. SiOC was deposited from MPTMS and $H_2$ plasma and a SiOC film having a carbon concentration of less than 10 at. % was formed. Plasma was provided for 0.5 s at power of 67 or 300 Watts. A pressure of 4.7 Torr was utilized. SiOC growth was observed on the low k surfaces but not on the Cu surfaces, at both power settings, as shown in FIGS. 3 and 4.

In other experiments, SiOC was deposited by PEALD from MPTMS and $H_2$/Ar plasma at a deposition temperature of 200° C. to 300° C., with a $H_2$ flow of 0.1 to 0.4 slpm (over 2 slpm Ar co-flow) and a plasma power of 30 to 100 W. SiOC films were deposited on silicon substrates comprising chemical oxide, as well as TiN and W surfaces. On silicon oxide, the process conditions could be tuned to produce SiOC films having very low k values (<3.5) and very low wet etch rate (<1 nm/min in dHF 0.7%). Minimal k values and wet etch rates were observed at about 300° C. with 0.2 slpm $H_2$ flow and 70 W of power. Under such conditions, the deposited SiOC layer was found to have a k value of about 4 and a wet etch rate of 1 nm/min. The deposition of SiOC was also observed to be selective toward a number of materials, including W and TiN. The process produce a film of less than 1 nm on W but about 10.5 nm on $SiO_2$ after 500 cycles.

It was also observed that a lower temperature enhanced the growth of SiOC on TiN, as can be seen in Table 4 below. About 6.3 nm of SiOC was deposited on TiN at 200° C. with 500 cycles, while almost no growth was seen on TiN at 300° C. with 500 cycles. In contrast about 10 nm of SiOC was deposited on $SiO_2$ with 500 cycles at 200° C. and about 5.5 nm at 300° C.

TABLE 4

| Deposition temperature | TiN | Native Oxide |
|---|---|---|
| 300° C. | ~1 nm/500 cycles | ~5.5 nm/500 cycles |
| 200° C. | ~6.5 nm/500 cycles | ~10 nm/500 cycles |

Figure 11A:
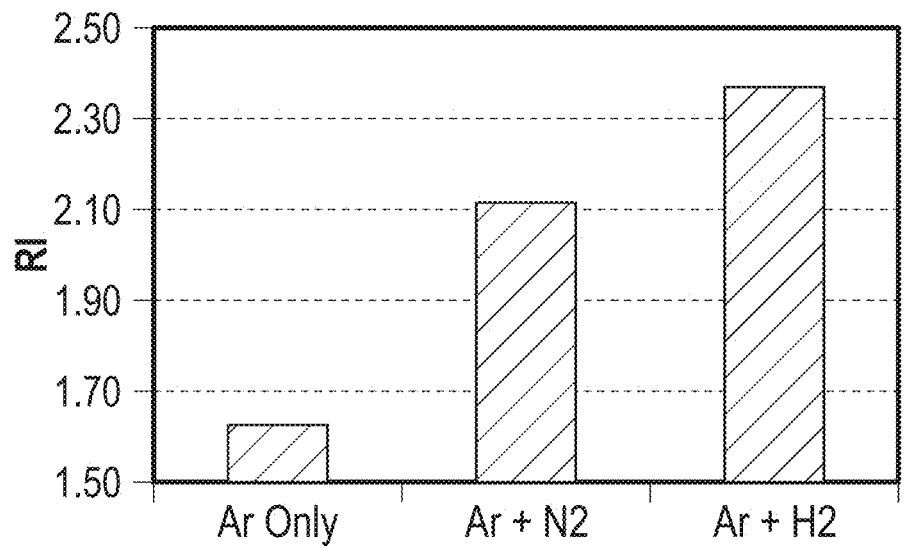
FIG. 11A is a graph showing the refractive index (R.I.) of TiO(CN) films deposited using titanium isopropoxide (IV) using different plasma reactants.
Figure 11B:
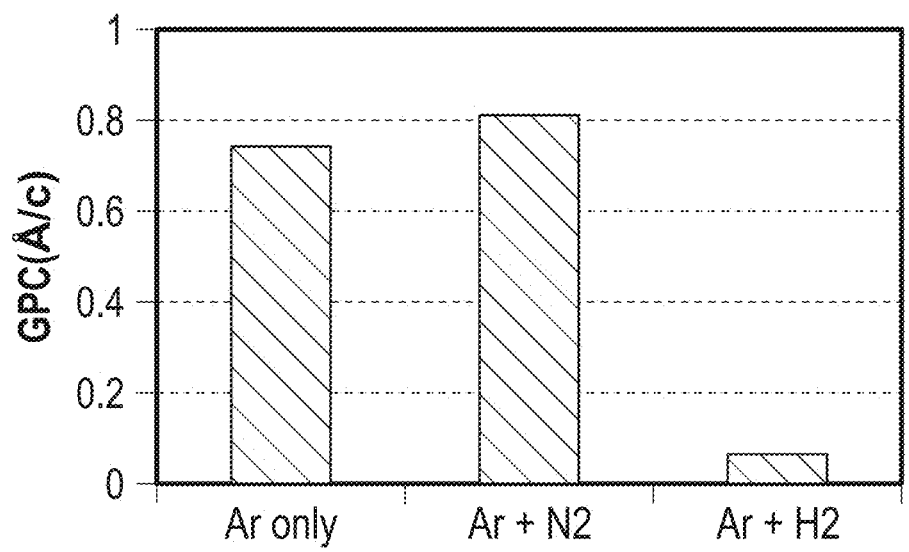
FIG. 11B is a graph showing the growth rate per cycle of TiO(CN) films deposited using titanium isopropoxide (IV) using different plasma reactants.

Titanium oxide thin films were deposited in a direct plasma PEALD reactor by an oxygen-free PEALD process using titanium isopropoxide (IV) (TTIP) as the titanium precursor. TTIP was provided from a source bottle heated at 70° C. The TTIP reacatant was provided alternately and sequentially with three different plasma reactants. A plasma was generated in Ar, Ar and $N_2$, and Ar and $H_2$. Experiments were carried out at a deposition temperature of 200° C. FIG. 11A shows the refractive index of the resulting films. In the case of $H_2$-containing plasma, the refractive index is very close to that of $TiO_2$. However, the $N_2$-containing plasma and pure Ar plasma showed different refractive indices, indicating variable film composition. FIG. 11B shows the growth rate of the titanium oxide films using the three different plasma reactants.

Table 5, below, shows composition data derived from RBS and XZPS. Both XPS and RBS indicate that $TiO_2$ films are deposited by $H_2$-containing plasma. No crystalline structure was seen by XRD measurement. Indicating that amorphous $TiO_2$ was deposited. The wet etch rate ratio (WERR) relative to thermal silicon oxide (TOX) in 0.5% dHF solution was about 0.5. This low WERR makes the films useful in some patterning applications. Four point probe resistivity measurements indicated extremely high resistivity of deposited $TiO_2$ films.

When pure Ar plasma was used as the plasma reactant, the resultant film was a carbon rich TiOC film. The carbon content may be modified by tuning plasma power. Additionally, $N_2$ containing plasma introduced nitrogen into the films, resulting in a TiOCN film.

TABLE 5

|  | Ti (%) | O (%) | C (%) | N (%) |
|---|---|---|---|---|
| TTIP + AR PLASMA | | | | |
| RBS | 5.6 | 12.5 | 81.9 | — |
| XPS | 4.3 | 14.0 | 81.7 | — |
| TTIP + AR&H PLASMA | | | | |
| RBS | 35 | 65 | — | — |
| XPS | 33.9 | 66.1 | — | — |
| TTIP + AR&N PLASMA | | | | |
| RBS | 9.6 | 21.5 | 34.2 | 34.7 |
| XPS | 9.2 | 20.8 | 28.9 | 36.1 |

As used herein, the term "about" may refer to a value that is within 15%, within 10%, within 5%, or within 1% of a given value.

The terms "film" and "thin film" are used herein for simplicity. "Film" and "thin film" are meant to mean any continuous or non-continuous structures and material deposited by the methods disclosed herein. For example, "film" and "thin film" could include 2D materials, nanorods, nanotubes or nanoparticles or even single partial or full molecular layers or partial or full atomic layers or clusters of atoms and/or molecules. "Film" and "thin film" may comprise material or layer with pinholes, but still be at least partially continuous.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A plasma enhanced atomic layer deposition (PEALD) process for selectively depositing a metal oxide on a first dielectric surface relative to a second metal or metal nitride surface of a substrate comprising:
    providing the substrate comprising the first dielectric surface and the second metal or metal nitride surface, wherein the first dielectric surface is a silicon oxide surface and the second metal or metal nitride surface is a Co, Ru, Ni, W, TiN, Cu or Ta surface; and
    conducting a plurality of deposition cycles comprising alternately and sequentially contacting the substrate with a first metal precursor comprising oxygen and a second reactant comprising plasma generated in a gas comprising hydrogen but not oxygen;
    wherein the second metal or metal nitride surface comprises an organic passivation layer thereover prior to conducting the plurality of deposition cycle,
    wherein the organic passivation layer does not comprise semimetal atoms,
    wherein species of the first metal precursor are adsorbed on the dielectric surface and the second plasma reactant reacts with the adsorbed species to selectively form the metal oxide on the first dielectric surface relative to the second metal or metal nitride surface,
    wherein the metal oxide is deposited on the first dielectric surface relative to the second metal or metal nitride surface with a selectivity of greater than 50%,
    wherein the selectivity is given as a percentage calculated by [(deposition on the first dielectric surface)−(deposition on second metal or metal nitride surface)]/(deposition on the first dielectric surface) where deposition is a measured thickness of the deposited material or a measured amount of material deposited, and
    wherein the metal of the metal oxide is one of Al, Nb, Ta, Ti, Zr, Hf or W.

2. The process of claim 1, wherein the second reactant also reacts with the second metal or metal nitride surface to reduce any of the metal oxide on the second metal or metal nitride surface.

3. The process of claim 1, wherein the second reactant also reacts with the second metal or metal nitride surface to remove oxygen from the second metal or metal nitride surface.

4. The process of claim 3, wherein removing oxygen from the second metal or metal nitride surface comprises removing OH-groups or oxygen bridges from the second metal or metal nitride surface.

5. The process of claim 1, wherein the second metal or metal nitride surface is TiN.

6. The process of claim 1, wherein the deposition cycle begins with contacting the substrate with the second reactant.

7. The process of claim 1, additionally comprising contacting the substrate with a plasma reactant prior to beginning the deposition cycle.

8. The process of claim 1, wherein the deposition cycle is repeated two or more times to form a film of the metal oxide of a desired thickness on the first dielectric surface.

9. The process of claim 1, wherein the organic passivation layer is at least partially etched by the second plasma reactant during the deposition cycle.

10. The process of claim 1, wherein the organic passivation layer is selectively deposited on the second metal or metal nitride surface relative to the first dielectric surface prior to conducting the plurality of deposition cycles.

11. A plasma enhanced atomic layer deposition (PEALD) process for forming an oxide thin film comprising metal and silicon on a dielectric surface of a substrate in a reaction space, wherein the dielectric surface is a silicon oxide surface relative to a second metal or metal nitride surface of the substrate, and wherein the PEALD process comprises:
    a plurality of first deposition cycles comprising:
        contacting the substrate with a first vapor phase precursor that comprises metal and oxygen;
        contacting the substrate with a second reactant comprising reactive species from a plasma generated in a gas that does not comprise oxygen;
        wherein species of the first vapor phase precursor are adsorbed over the dielectric surface and the second reactant reacts with the adsorbed species of the first vapor phase precursor; and
    a plurality of second deposition cycles comprising:
        contacting the substrate with a third vapor phase precursor that comprises silicon and oxygen;
        contacting the substrate with a fourth reactant comprising reactive species from a plasma generated in a gas that does not comprise oxygen;
        wherein species of the third vapor phase precursor are adsorbed over the dielectric surface and the fourth reactant reacts with the adsorbed species of the third vapor phase precursor;
    wherein a combination of the first and second deposition cycles form the oxide thin film, wherein the metal of the oxide thin film is one of Al, Nb, Ta, Ti, Zr, Hf or W, wherein the second metal or metal nitride surface is a Co, Ru, Ni, W, TiN, Cu or Ta surface and comprises an organic passivation layer thereover prior to conducting the PEALD process, and wherein the organic passivation layer does not comprise semimetal atoms.

12. The process of claim 11, wherein the first deposition cycle and the second deposition cycle are repeated at a selected interval to produce the oxide thin film.

13. The process of claim 11, wherein the second reactant and the fourth reactant are the same.

14. A plasma enhanced atomic layer deposition (PEALD) process for selectively depositing an oxide comprising silicon and metal on a first dielectric surface of a substrate relative to a second metal or metal nitride surface of the substrate comprising:
  providing the substrate comprising the first dielectric surface and the second metal or metal nitride surface, wherein the first dielectric surface is a silicon oxide surface and the second metal or metal nitride surface is a Co, Ru, Ni, W, TiN, Cu or Ta surface;
  selectively forming an organic passivation layer over the second metal or metal nitride surface, wherein the organic passivation layer does not comprise semimetal atoms; and
  conducting a plurality of deposition cycles comprising separately contacting the substrate with a first metal precursor comprising oxygen, a second silicon precursor comprising oxygen, and a third reactant comprising plasma generated in a gas comprising hydrogen but not oxygen;
  wherein species of the first metal precursor and species of the second silicon precursor are adsorbed over the first dielectric surface and the third reactant reacts with the adsorbed species to selectively form the oxide on the first dielectric surface relative to the second metal or metal nitride surface;
  wherein the oxide comprising silicon and metal is deposited on the first dielectric surface relative to the second metal or metal nitride surface with a selectivity of greater than 50%,
  wherein the selectivity is given as a percentage calculated by [(deposition on the first dielectric surface)−(deposition on second metal or metal nitride surface)]/(deposition on the first dielectric surface) and deposition is a measured thickness of the deposited material or measured amount of material deposited; and
  wherein the metal of the oxide is one of Al, Nb, Ta, Ti, Zr, Hf or W.

15. The process of claim 14, wherein the first dielectric surface comprises $SiO_2$.

* * * * *